(12) United States Patent
Kim et al.

(10) Patent No.: US 9,871,103 B2
(45) Date of Patent: Jan. 16, 2018

(54) SEMICONDUCTOR DEVICE

(71) Applicant: Samsung Electronics Co., Ltd., Suwon-si, Gyeonggi-do (KR)

(72) Inventors: Ho Jun Kim, Suwon-si (KR); Sung Dae Suk, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/086,775

(22) Filed: Mar. 31, 2016

(65) Prior Publication Data
US 2017/0033102 A1 Feb. 2, 2017

(30) Foreign Application Priority Data

Jul. 30, 2015 (KR) ........................ 10-2015-0107695

(51) Int. Cl.
| | |
|---|---|
| H01L 29/06 | (2006.01) |
| H01L 27/02 | (2006.01) |
| H01L 27/118 | (2006.01) |
| H01L 27/092 | (2006.01) |
| H01L 23/528 | (2006.01) |
| H01L 27/11 | (2006.01) |
| H01L 27/088 | (2006.01) |

(52) U.S. Cl.
CPC ...... *H01L 29/0673* (2013.01); *H01L 23/5286* (2013.01); *H01L 27/0207* (2013.01); *H01L 27/092* (2013.01); *H01L 27/11807* (2013.01); H01L 27/088 (2013.01); H01L 27/0924 (2013.01); H01L 27/1104 (2013.01); H01L 2027/11874 (2013.01)

(58) Field of Classification Search
CPC .................. H01L 27/0886; H01L 23/5226
See application file for complete search history.

(56) References Cited

U.S. PATENT DOCUMENTS

| | | |
|---|---|---|
| 6,388,332 B1 | 5/2002 | Aggarwal et al. |
| 6,583,045 B1 | 6/2003 | Liu et al. |
| 7,732,798 B2 | 6/2010 | Elmegreen et al. |
| 8,631,383 B2 | 1/2014 | Wagner |
| 9,026,977 B2 | 5/2015 | Tarabbia et al. |
| 2008/0073673 A1 | 3/2008 | Shiga |
| 2011/0304052 A1 | 12/2011 | Turner et al. |
| 2012/0280287 A1 | 11/2012 | Hou et al. |
| 2013/0154128 A1 | 6/2013 | Wang et al. |

(Continued)

FOREIGN PATENT DOCUMENTS

| | | |
|---|---|---|
| JP | 2008078508 | 4/2008 |
| JP | 2011258952 | 12/2011 |

(Continued)

*Primary Examiner* — Marc Armand
(74) *Attorney, Agent, or Firm* — Myers Bigel, P.A.

(57) ABSTRACT

A semiconductor device includes a plurality of active regions including channel regions extending in a first direction on a semiconductor substrate and source/drain regions connected to the channel regions, a plurality of gate electrodes extending in a second direction different from the first direction to intersect the channel regions, a plurality of conductive lines electrically connected to at least one of the source/drain regions and the plurality of gate electrodes through a plurality of vias, and a power line disposed between the semiconductor substrate and the plurality of conductive lines and configured to supply a power supply voltage.

19 Claims, 51 Drawing Sheets

(56) References Cited

U.S. PATENT DOCUMENTS

2014/0183638 A1    7/2014   Rashed et al.
2014/0264924 A1    9/2014   Yu et al.
2015/0357282 A1*  12/2015   Lau ..................... H01L 23/5226
                                                           257/401
2015/0370951 A1*  12/2015   Kawa .................. G06F 17/5072
                                                           716/119

FOREIGN PATENT DOCUMENTS

KR          101352413       12/2001
KR          10-0676980       1/2007

* cited by examiner

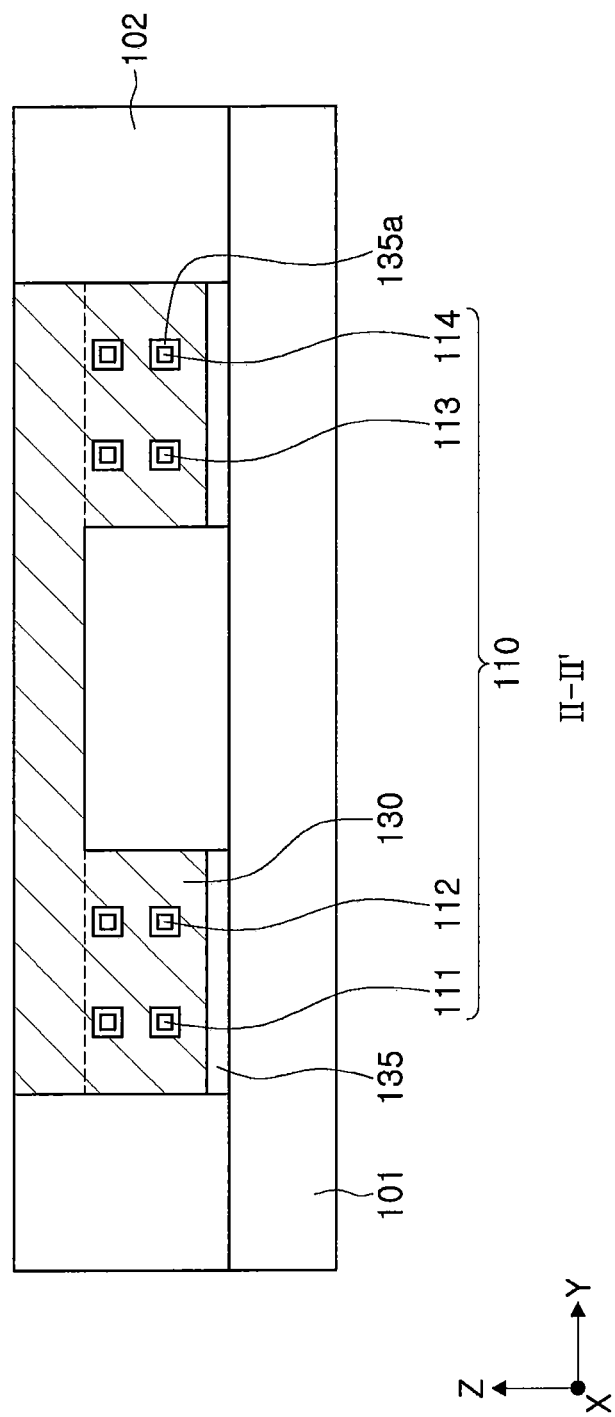

SEMICONDUCTOR DEVICE

CROSS-REFERENCE TO RELATED APPLICATION

This application claims priority from and the benefit of Korean Patent Application No. 10-2015-0107695, filed on Jul. 30, 2015, with the Korean Intellectual Property Office, the disclosure of which is incorporated herein by reference.

BACKGROUND

The present inventive concepts relate to semiconductor devices.

Semiconductor devices may be used in data storage devices, data processors and the like. There has been ongoing research into methods of improving a degree of integration of semiconductor elements as well as reducing power consumption in semiconductor devices. In addition, research into techniques of forming channel regions having three-dimensional structures in order to reduce some shortcomings (e.g., single or short channel effects and the like) that may be caused by reduction in the sizes of semiconductor elements included in semiconductor devices has been conducted.

SUMMARY

Some embodiments of the present inventive concepts may provide a semiconductor device allowing for improvements in a degree of integration of semiconductor elements by reducing a unit cell area.

According to some embodiments of the present inventive concepts, an integrated circuit device comprises a first layer including active regions and gate electrodes intersecting therein, a second layer stacked on the first layer, and a third layer stacked on the second layer. The active regions include source/drain regions therein and channel regions extending therebetween. The second layer includes source/drain contacts therein on the source/drain regions and gate contacts therein on the gate electrodes. The third layer includes a plurality of conductive lines. The first layer or the second layer further includes at least one power line extending therein in a direction parallel to the active regions. The at least one power line electrically connects a respective one of the source/drain regions of the first layer to a respective one of the conductive lines of the third layer and is configured to provide a power supply voltage thereto.

In some embodiments, the third layer comprising the conductive lines may be free of active regions and may be free of power lines that are configured to provide the power supply voltage to the conductive lines thereof.

In some embodiments, the at least one power line may include first and second power lines having respective surfaces that are coplanar. The first and second power lines may define opposing boundaries of a unit cell of the integrated circuit device, and may electrically connect respective ones of the source/drain regions of the first layer to respective ones of the conductive lines of the third layer by respective vias. The respective vias may include a same material as the conductive lines.

In some embodiments, the second layer may include the first and second power lines extending therein. The respective surfaces of the first and second power lines may be coplanar with respective surfaces of the source/drain contacts, and the first and second power lines may be electrically separated from the gate contacts.

In some embodiments, the first layer may include the first and second power lines extending therein. The respective surfaces of the first and second power lines may be coplanar with respective surfaces of the source/drain regions.

According to some embodiments of the present inventive concepts, a semiconductor device may include a plurality of active regions including channel regions extending in a first direction on a semiconductor substrate and source/drain regions connected to the channel regions, a plurality of gate electrodes extending in a second direction different from the first direction to intersect the channel regions, a plurality of contact regions connected to at least one of the plurality of active regions and the plurality of gate electrodes, a plurality of conductive lines disposed on the plurality of contact regions and electrically connected to at least a portion of the plurality of contact regions through a plurality of vias, and a power line disposed between the semiconductor substrate and the plurality of conductive lines and supplying a power supply voltage.

According to some embodiments of the present inventive concepts, a semiconductor device may include a plurality of active regions provided on a semiconductor substrate and extending in a first direction, a first layer including a plurality of gate electrodes intersecting at least a portion of the plurality of active regions, a second layer disposed on the first layer and including a plurality of contact regions connected to the plurality of active regions and the plurality of gate electrodes, and a plurality of contact regions connected to the plurality of gate electrodes, a third layer disposed on the second layer and including a plurality of conductive lines. One of the first and second layers is provided with a power line disposed therein, and the power line is provided for supplying a power voltage.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
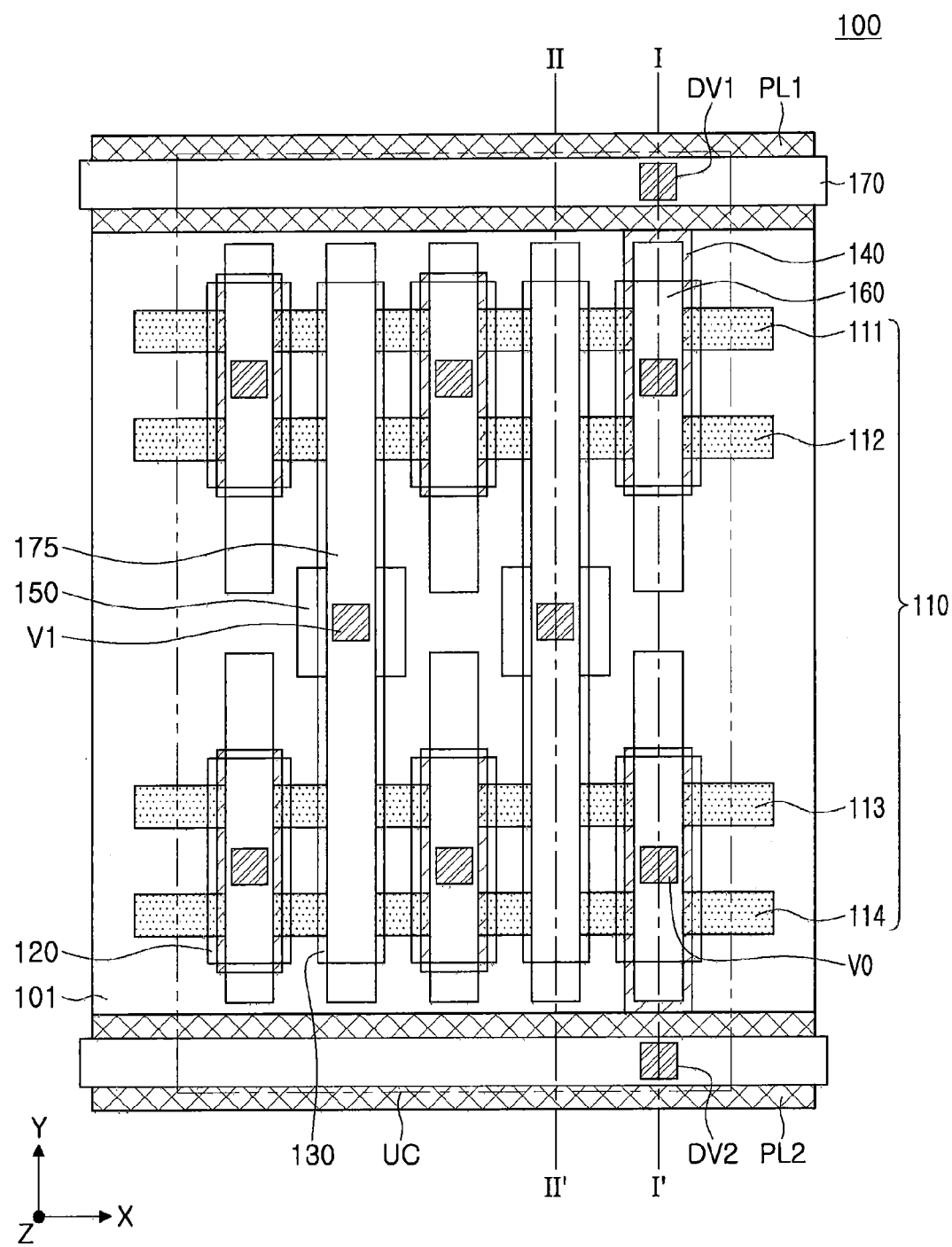
FIG. 1 is a plan view of a semiconductor device according to some embodiments of the present inventive concepts.

Hereinafter, embodiments of the present inventive concepts will be described as follows with reference to the attached drawings.

The present inventive concepts may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another member, component, region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing particular embodiments only and is not intended to be limiting of the present inventive concepts. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present inventive concepts will be described with reference to schematic views illustrating embodiments of the present inventive concepts. In the drawings, for example, due to manufacturing techniques and/or tolerances, modifications of the shape shown may be estimated. Thus, embodiments of the present inventive concepts should not be construed as being limited to the particular shapes of regions shown herein, and may include, for example, changes in shape resulting from manufacturing. The following embodiments may also be defined by one or combinations thereof.

The contents of the present inventive concepts described below may have a variety of configurations herein, but are not limited thereto.

FIG. 1 is a plan view of a semiconductor device according to some embodiments of the present inventive concepts.

Referring to FIG. 1, a semiconductor device 100 according to some embodiments of the present inventive concepts may include a semiconductor substrate 101, and a plurality of active regions 110 and a plurality of gate electrodes 130 formed on the semiconductor substrate 101. The plurality of active regions 110 may includes a plurality of nanowires 111 to 114. The plurality of active regions 110 and the plurality of gate electrodes 130 may form at least one semiconductor element, e.g., a field effect transistor (FET).

The plurality of active regions 110 and the plurality of gate electrodes 130 may be included in a unit cell region (UC) defined on the semiconductor substrate 101. According to some embodiments of the present inventive concepts, the unit cell region (UC) may refer to a standard cell. The standard cell may include an element, such as a logical sum (OR) gate or a logical product (AND) gate used iteratively. The semiconductor device 100 according to some embodiments of the present inventive concepts may be implemented by determining arrangements of a plurality of contacts 140 and 150 and a plurality of conductive lines disposed on the standard cell in designing a layout.

According to some embodiments of the present inventive concepts illustrated in FIG. 1, the plurality of active regions 110 may extend in a first direction (x-axis direction of FIG. 1) and may provide channel regions and source/drain regions 120 in a semiconductor element. The plurality of gate electrodes 130 may extend in a second direction (y-axis direction of FIG. 1) different from the first direction to intersect at least one active region 110. Portions of the at least one active region 110 overlapping the plurality of gate electrodes 130 may be provided as channel regions of the semiconductor elements.

The plurality of active regions 110 may be implemented in the form of a nanowire or a nanosheet. According to the embodiment of the present inventive concepts illustrated in FIG. 1, the plurality of active regions 110 are illustrated as including a total of four active regions, but are not limited thereto. Meanwhile, to equalize or reduce differences in a gap between nanowires 111 and 112 included in a P-MOS-FET with a gap between nanowires 113 and 114 included in an N-MOSFET, dummy nanowires may be further formed between the nanowires 111 and 112 included in the P-MOS-FET and the nanowires 113 and 114 included in the N-MOSFET in a process of manufacturing the semiconductor device 100. The dummy nanowire(s) may be removed during the process of manufacturing the semiconductor device 100.

Meanwhile, according to the embodiment of the present inventive concepts illustrated in FIG. 1, at least two of the nanowires 111 to 114 may be disposed in a direction (z-axis direction of FIG. 1) in which a plurality of layers included in the semiconductor device 100 are stacked. For example, when the nanowires 111 to 114 are disposed in two layers along the z axis, a gate electrode 130 may intersect a total of eight nanowires 111, 112, 113, and 114 in a unit cell region (UC). Each of the nanowires 111 to 114 is surrounded by the gate electrode 130 to provide channel regions having adequate lengths, preventing or minimizing a single channel effect.

The semiconductor device 100 may include power lines PL1 and PL2. According to the embodiment illustrated in FIG. 1, a first power line PL1 may be a conductive line for supplying a driving voltage VDD, and a second power line PL2 may be a conductive line for supplying a ground or a reference voltage VSS. The power lines PL1 and PL2 are illustrated as extending in the first direction parallel to the plurality of active regions 110, but are not limited thereto.

The respective power lines PL1 and PL2 may be electrically connected to at least one of the source/drain regions 120 to supply the driving voltage VDD or the ground voltage VSS to the semiconductor element included in the semiconductor device 100. When the power lines PL1 and PL2 are disposed in the same layer as the plurality of conductive lines arranged above the plurality of active regions 110, the gate electrode 130, and the plurality of contacts 140 and 150, interference between the plurality of conductive lines and the power lines PL1 and PL2 may reduce a degree of freedom in a design layout, and an increase in a height (y-axis length) of the unit cell region (UC) may reduce a degree of integration of semiconductor elements.

According to the embodiment of the present inventive concepts, the power lines PL1 and PL2 may be disposed between the semiconductor substrate 101 and the plurality of conductive lines to reduce the height of the unit cell region (UC), improve the degree of integration of the semiconductor elements, and increase a degree of design freedom of conductive lines. Hereinafter, the power lines PL1 and PL2 will be described with reference to FIGS. 2 through 4.

Figure 2:
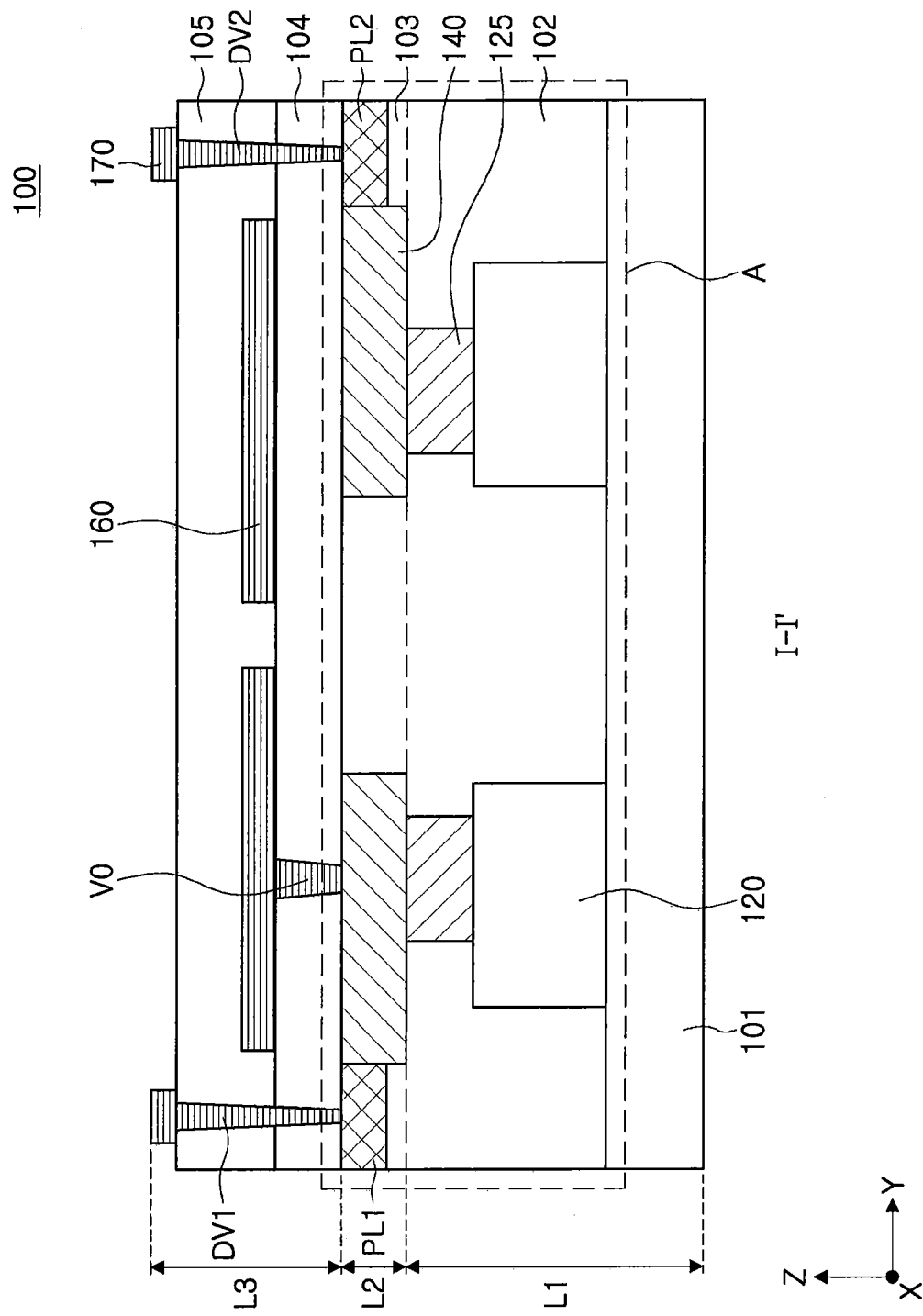
FIG. 2 is a cross-sectional view taken along line I-I' of the semiconductor device of FIG. 1.

FIG. 2 is a cross-sectional view taken along line I-I' of the semiconductor device of FIG. 1.

Referring to FIG. 2, the semiconductor device 100 according to some embodiments of the present inventive concepts may include first to third layers L1, L2, and L3 sequentially stacked in a stacking direction (z-axis direction). The first layer L1 may include the semiconductor substrate 101, and the source/drain regions 120 formed on the semiconductor substrate 101, and may selectively include conductive layers 125 formed on the source/drain regions 120. The conductive layers 125 may be disposed on the source/drain regions 120 having a height lower than that of the gate electrode 130, and a top surface of the conductive layer 125 may be formed substantially at the same height as a top surface of the gate electrode 130. The conductive layer 125 may contain a metal silicide, e.g., a tungsten silicide.

The first layer L1 may have a first insulating layer 102 provided in a region in which the semiconductor substrate 101, the source/drain regions 120, and the conductive layer 125 are not formed. The first insulating layer 102 may contain an oxide or a nitride.

The second layer L2 disposed on the first layer L1 may include first contacts 140 (also referred to herein as source/drain contacts) and the power lines PL1 and PL2 electrically connected to the source/drain regions 120. The second layer L2 may have a second insulating layer 103 disposed in a space between the first contacts 140 and the power lines PL1 and PL2, and second contacts 150 (also referred to herein as gate contacts) that are electrically isolated from the power lines PL1 and PL2 by the second insulating layer 103. Similar to the first insulating layer 102, the second insulating layer 103 may contain an oxide or a nitride.

The power lines PL1 and PL2 may include a first power line PL1 and a second power line PL2 extending in a first direction (x-axis direction), and a power voltage having a predetermined level may be supplied through the first and second power lines PL1 and PL2. The power voltage having a predetermined level may include the driving voltage VDD having a high level and the ground voltage VSS having a level close to that of the ground.

A third layer L3 may be disposed on the second layer L2. The third layer L3 may include a third insulating layer 104 and a fourth insulating layer 105, and a first conductive line 160 and a second conductive line 170 formed on the third and fourth insulating layers 104 and 105, respectively. In addition, the third layer L3 may include a plurality of vias V0, DV1, and DV2 connecting the first and second conductive lines 160 and 170 to the power lines PL1 and PL2 or the first contacts 140. The vias DV1 and DV2, among the vias V0, DV1, and DV2, connecting the power lines PL1 and PL2 to a portion of the conductive line 170 may be provided as deep vias passing through all of the third and fourth insulating layers 104 and 105, and may contain copper (Cu).

Figure 3:
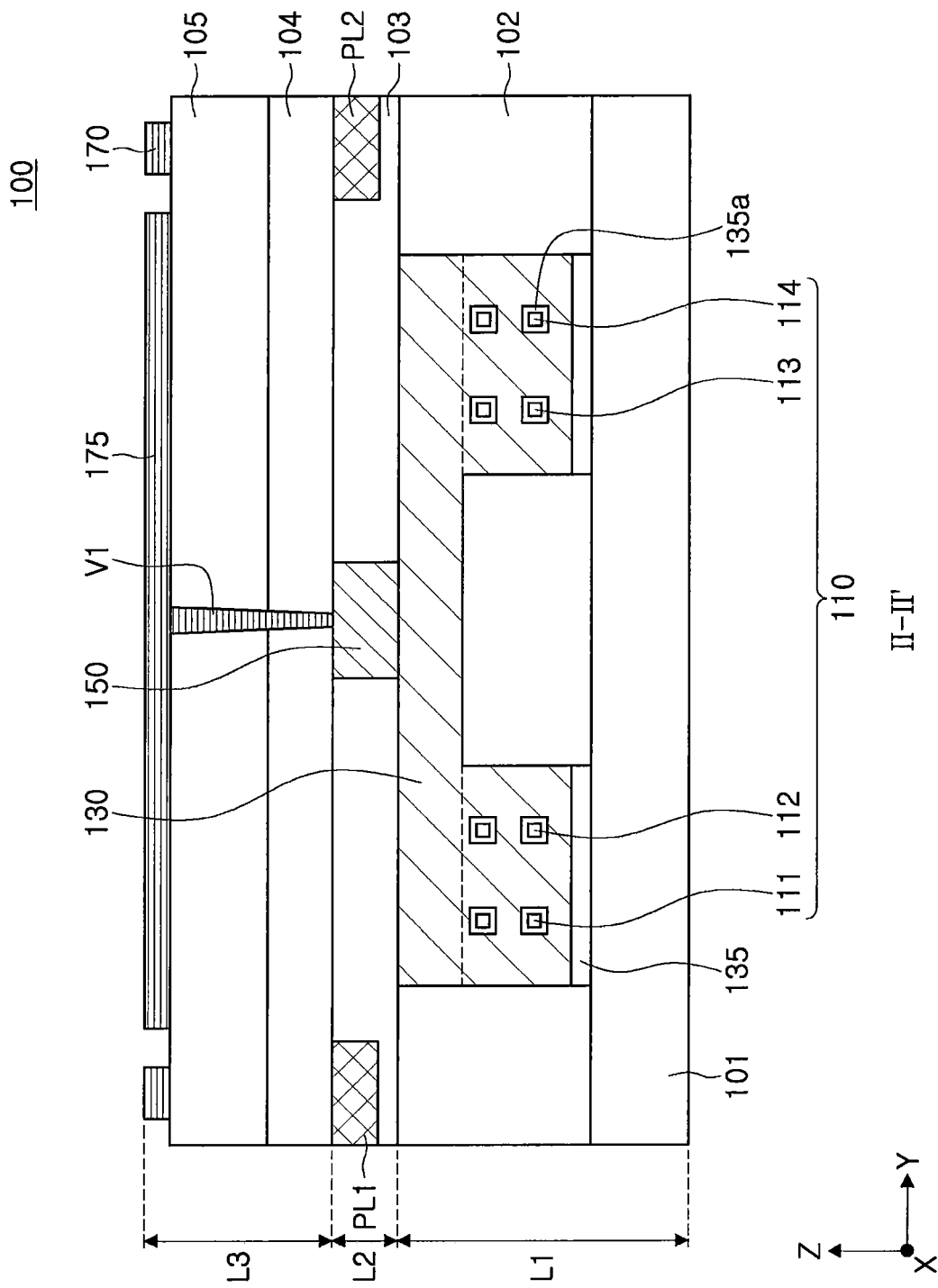
FIG. 3 is a cross-sectional view taken along line II-II' of the semiconductor device of FIG. 1.

FIG. 3 is a cross-sectional view taken along line II-II' of the semiconductor device of FIG. 1.

Referring to FIG. 3, the semiconductor device 100 may have a structure in which the first to third layers L1, L2, and L3 are sequentially stacked. The first layer L1 may include the semiconductor substrate 101, the first insulating layer 102 and the gate electrode 130 formed on the semiconductor substrate 101, the plurality of nanowires 111 to 114 extending in the first direction (x-axis direction) to intersect the gate electrode 130, thereby being provided as the channel regions, and gate insulating layers 135.

The gate electrode 130 may be formed on a PMOSFET region and an NMOSFET region on the semiconductor substrate 101, respectively, to extend in a second direction (y-axis direction) intersecting the plurality of nanowires 111 to 114. The gate electrode 130 may contain a metal, a conductive metal oxide, or a polysilicon. The gate insulating layers 135 and 135a may be disposed in spaces between the gate electrode 130 and the semiconductor substrate 101 and between the gate electrode 130 and the plurality of nanowires 111 to 114, respectively. The gate insulating layer 135 may contain a high dielectric constant material having a high dielectric constant, e.g., a material having a higher dielectric constant than that of a silicon oxide film. A portion of the gate insulating layers 135a may have or conform to a shape of surrounding the plurality of nanowires 111 to 114.

The second insulating layer 103, the power lines PL1 and PL2, the second contact 150, or the like may be included in the second layer L2 disposed on the first layer L1. The second contact 150 may be disposed on the gate electrode 130 to be electrically connected to the gate electrode 130, and may be electrically separated from the power lines PL1 and PL2 by the second insulating layer 103. As described above with reference to FIGS. 1 and 2, the power lines PL1 and PL2 may extend in the first direction (x-axis direction).

The third layer L3 disposed on the second layer L2 may include the third and fourth insulating layers 104 and 105, the conductive lines 170, and a conductive line 175. At least a portion of the plurality of conductive lines 170 and 175 may be electrically connected to the second contact 150 disposed on the gate electrode 130 by a via VI.

Figure 4:
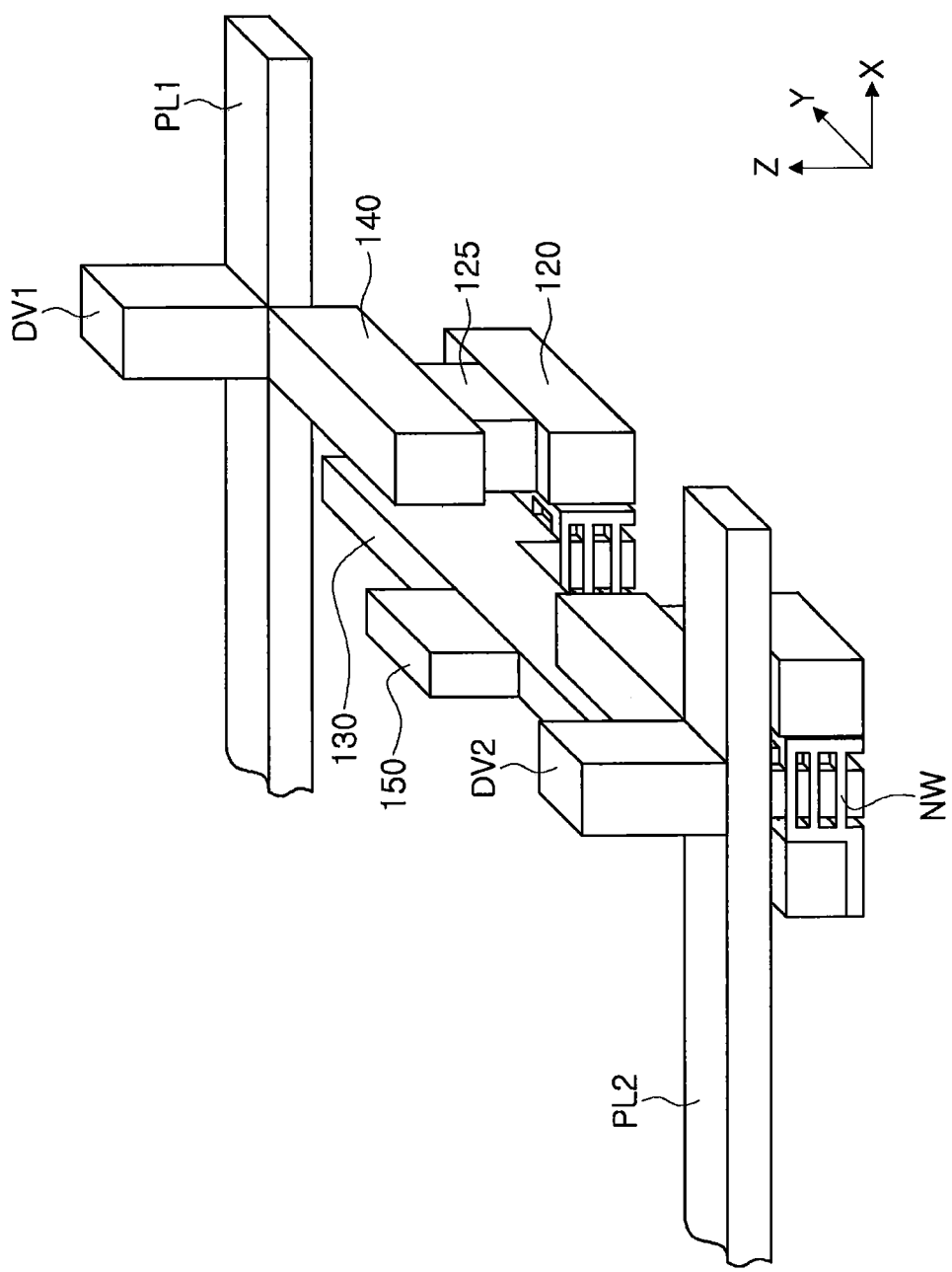
FIG. 4 is a perspective view of region A of the semiconductor device of FIG. 2.

FIG. 4 is a perspective view of region A of the semiconductor device of FIG. 1. As illustrated in FIG. 4, a portion of components included in region A of the semiconductor device 100, e.g., the semiconductor substrate 101, the conductive lines 160 and 170, and the insulating layers 102, 103, 104, and 105 are not shown for convenience.

Referring to FIG. 4, the semiconductor device 100 may include the plurality of nanowires 111 to 114 extending in a first direction (x-axis direction) and the gate electrode 130 extending in a second direction (y-axis direction) to intersect the plurality of nanowires 111 to 114. The plurality of nanowires 111 to 114 may extend in the first direction between the source/drain regions 120, and may intersect the gate electrode 130 to be provided as the plurality of active regions.

The conductive layers 125 may be disposed on the source/drain regions 120. The conductive layers 125 may contain a metal silicide material, and the top surface of the conductive layers 125 may be formed at the same height as the top surface of the gate electrode 130. The plurality of nanowires 111 to 114, the source/drain regions 120, the gate electrode 130, the conductive layers 125, or the like may be included in the first layer L1 of the semiconductor device 100.

The first contacts 140 (to the source/drain regions 120) may be provided on the conductive layers 125, and the second contact 150 (to the gate electrode 130) may be similarly disposed on the gate electrode 130. The first and second contacts 140 and 150 may be included in the second layer L2 formed on the first layer L1 of the semiconductor device 100. Further, the second layer L2 may include the power lines PL1 and PL2 in addition to the first and second contacts 140 and 150.

The power lines PL1 and PL2 may extend in the first direction (x-axis direction) parallel to the plurality of nanowires 111 to 114 as illustrated in FIG. 4, and may be connected to the first contact 140 electrically connected to the source/drain regions 120 through the conductive layers 125. Thus, the driving voltage VDD and the ground voltage VSS supplied through the power lines PL1 and PL2 may be delivered to the source/drain regions 120 through the first contact 140 and the conductive layers 125.

The power lines PL1 and PL2 may be connected to a portion of the plurality of conductive lines 160, 170, and 175 by the vias DV1 and DV2 penetrating through at least a portion of the third and fourth insulating layers 104 and 105 included in the third layer L3 disposed on the second layer L2. For example, the power lines PL1 and PL2 may be electrically connected to the conductive line 170 disposed on an upper portion of the third layer L3 through the vias DV1 and DV2.

According to some embodiments of the present inventive concepts illustrated in FIGS. 1 through 4, the power lines PL1 and PL2 may be disposed between the semiconductor substrate 101 and the plurality of conductive lines 160, 170, and 175, i.e., within the second layer L2. Thus, the power lines PL1 and PL2 may be disposed in different layer from the plurality of conductive lines 160, 170, and 175, and a probability of interference occurring between the power lines PL1 and PL2 and the plurality of conductive lines 160, 170, and 175 may be reduced. Therefore, the plurality of conductive lines 160, 170, and 175 may be more freely designed. Since the power lines PL1 and PL2 are also placed below the plurality of conductive lines 160, 170, and 175 relative to the substrate 101, the number of vias V0 for connecting the conductive line 160 to the contacts 140 and 150, in which the conductive line 160 and the contacts 140 and 150 may extend in the first direction (x-axis direction), may be increased, and a degree of integration of the semiconductor elements may be improved by reducing a size of the unit cell region (UC).

Figure 5:
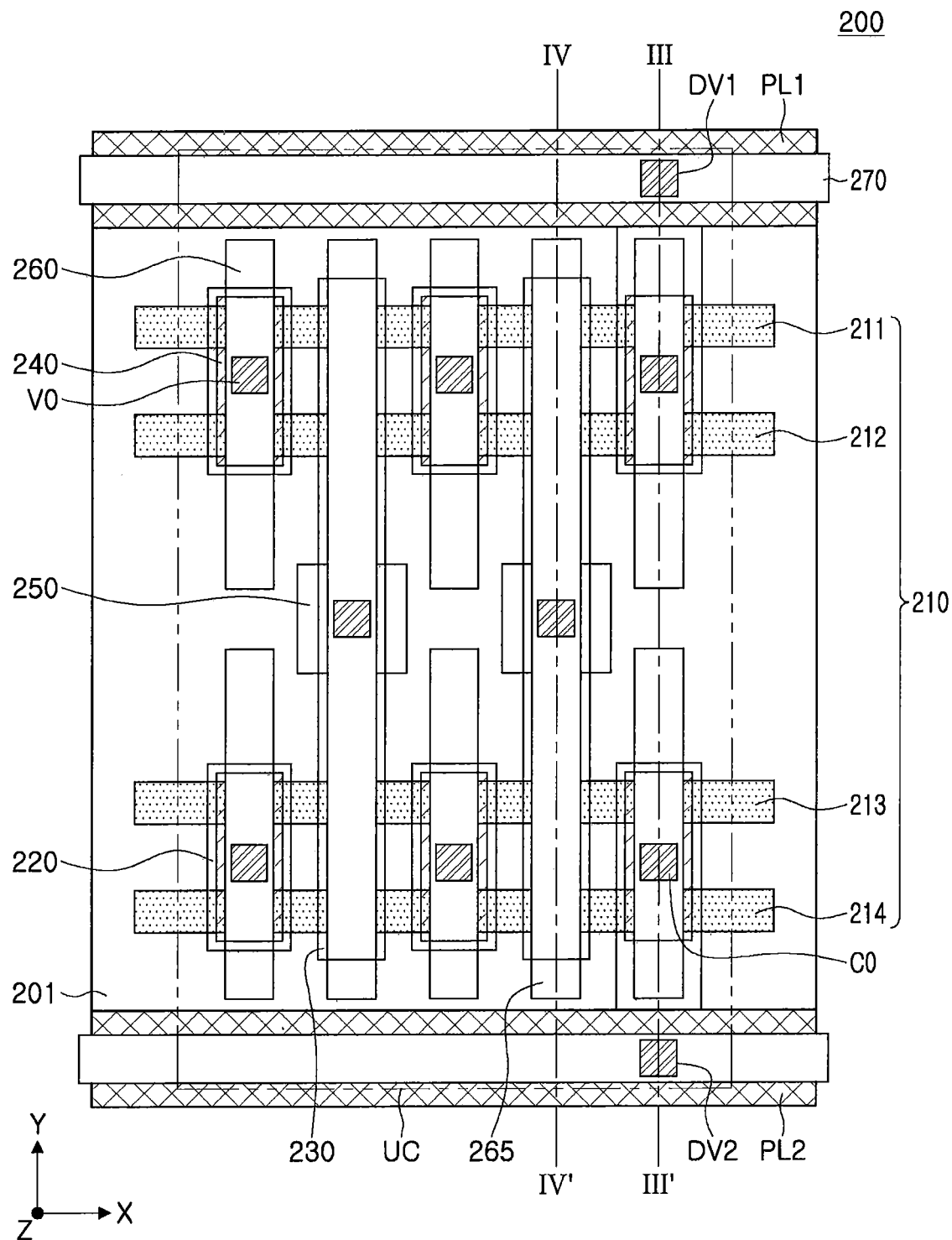
FIG. 5 is a plan view of a semiconductor device according to some embodiments of the present inventive concepts.

FIG. 5 is a plan view of a semiconductor device according to some embodiments of the present inventive concepts.

Referring to FIG. 5, a semiconductor device 200 according to some embodiments of the present inventive concepts may include a semiconductor substrate 201, and an active region 210 and a plurality of gate electrodes 230 formed on the semiconductor substrate 201. The active region 210 may include the plurality of nanowires 211 to 214, and at least portions of the plurality of nanowires 211 to 214 may be connected to each other to be provided as source/drain regions 220. The source/drain regions 220 and the gate electrodes 230 may provide a semiconductor device and, e.g., a field effect transistor (FET).

The plurality of nanowires 211 to 214 may extend in a first direction (x-axis direction), and the gate electrodes 230 may extend in a second direction (y-axis direction) different from the first direction to intersect the plurality of nanowires 211 to 214. First and second nanowires 211 and 212 may be connected to each other in a region on the semiconductor substrate 201 to be provided as the source/drain regions 220 of a PMOSFET, and third and fourth nanowires 213 and 214 may also be connected to each other in a region on the semiconductor substrate 201 to be provided as the source/drain regions 220 of an NMOSFET.

First and second contacts 240 and 250 may be disposed on the source/drain regions 220 and the gate electrodes 230, respectively. Selectively, a conductive layer may be further disposed between the source/drain regions 220 and the first contacts 240. The first and second contacts 240 and 250 may have the same thickness or different thicknesses, and top surfaces of the first and second contacts 240 and 250 may be formed at the same height from a top surface of the semiconductor substrate 201. The first and second contacts 240 and 250 may have a plurality of conductive lines provided thereon to apply an electrical signal to the source/drain regions 220 and the gate electrodes 230.

In addition, a unit cell region (UC) may further include power lines PL1 and PL2. The power lines PL1 and PL2 may include a first power line PL1 for supplying the driving voltage VDD and a second power line PL2 for supplying the ground voltage VSS. The power lines PL1 and PL2 may extend in the first direction (x-axis direction) as in the plurality of nanowires 211 to 214, and may be disposed adjacent to a boundary of the unit cell region (UC) in the second direction (y-axis direction).

According to the embodiment of the present inventive concepts illustrated in FIG. 5, the power lines PL1 and PL2 may be formed in the same layer as the source/drain regions 220. The semiconductor device 200 according to the embodiment of the present inventive concepts illustrated in FIG. 5 may include a first layer L1 including the source/drain regions 220, the gate electrodes 230, or the like formed on the semiconductor substrate 201, a second layer L2 disposed on the first layer L1 and including the first and second contacts 240 and 250, and a third layer L3 disposed on the second layer L2 and including a plurality of conductive lines. The power lines PL1 and PL2 may be included in the first layer L1 to be directly connected to the source/drain regions 220.

Since the power lines PL1 and PL2 are included in the first layer L1 corresponding to a bottom layer in a stacking direction (z-axis direction) of the first to third layers L to L3, vias DV1 and DV2 connected to the power lines PL1 and PL2 may have a depth passing through at least one of the second and third layers L2 and L3 and through a portion of the first layer L1. Thus, the vias DV1 and DV2 connected to the power lines PL1 and PL2 may be a deep via, and may be formed by using copper (Cu). According to thicknesses of each of the layers L1, L2, and L3, the vias DV1 and DV2 may have a tapered shape of which a cross section becomes narrower in a longitudinal direction (z-axis direction).

Figure 6:
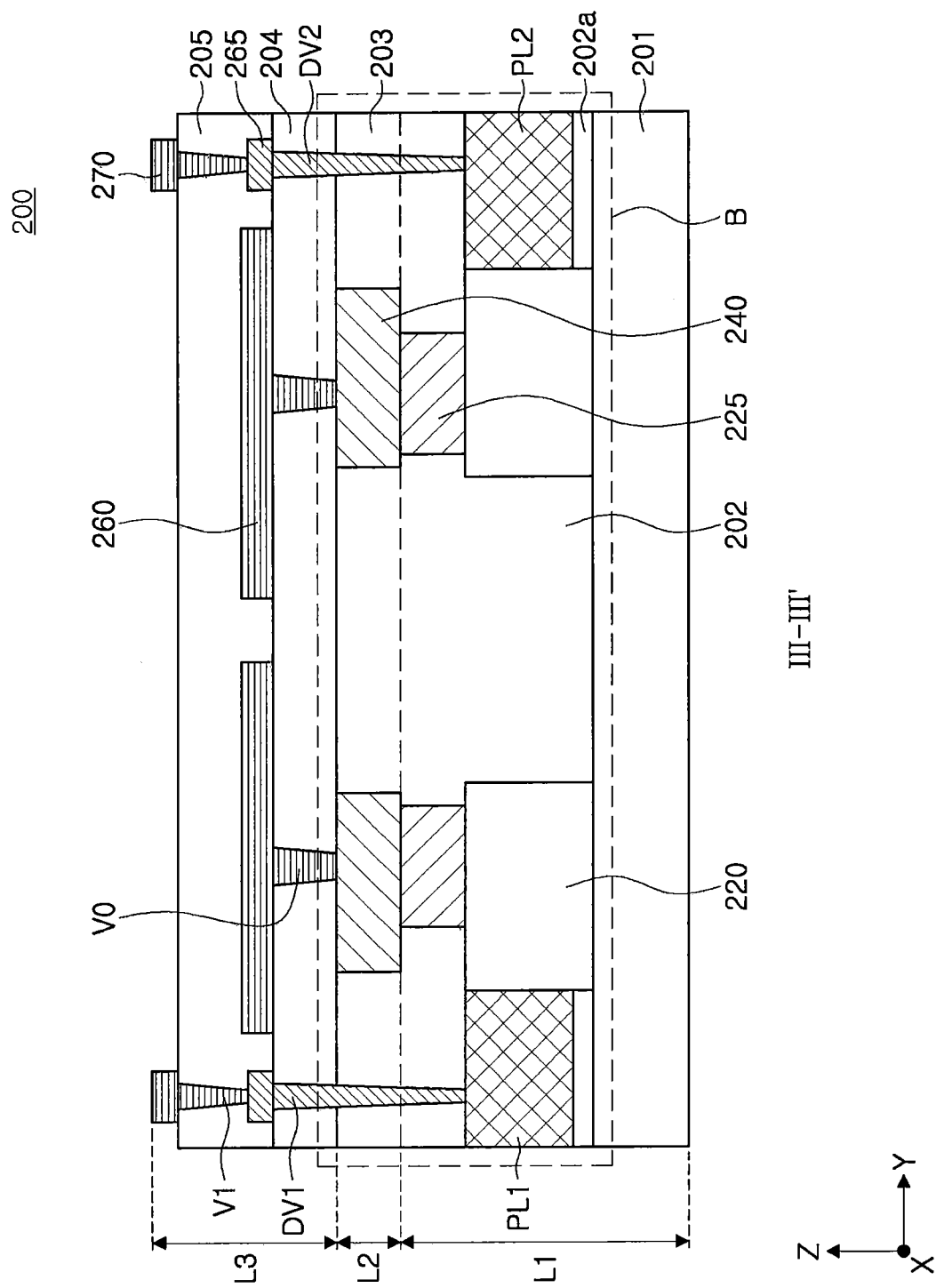
FIG. 6 is a cross-sectional view taken along line III-III' of the semiconductor device of FIG. 5.

FIG. 6 is a cross-sectional view taken along line III-III' of the semiconductor device of FIG. 5.

Referring to FIG. 6, the semiconductor device 200 may include the semiconductor substrate 201, the source/drain regions 220 formed on the semiconductor substrate 201, the first contacts 240 formed on the source/drain regions 220, and the plurality of conductive lines 260 and 270. The semiconductor device 200 may have a structure in which the first to third layers L1, L2, and L3 are stacked, and the power lines PL1 and PL2 may be included in the first layer L1.

The first layer L1 may be defined as a region including the semiconductor substrate 201, the source/drain regions 220, the power lines PL1 and PL2, conductive layers 225, and a first insulating layer 202. The source/drain regions 220 may connect portions of the plurality of nanowires 211 to 214 to each other and contain an N- or P-type impurity. The power lines PL1 and PL2 may extend in the first direction (x-axis direction), and may be disposed on a portion of a first insulating layer 202a to connect to the source/drain regions 220.

The second layer L2 may be disposed on the first layer L1 and may include the first contacts 240 and a second insulating layer 203. The first contacts 240 may be disposed on the conductive layers 225 to be electrically connected to the source/drain regions 220. The third layer L3 disposed on the second layer L2 may include the plurality of conductive lines 260, 265, and 270, and at least portions of the plurality of conductive lines 260, 265, and 270 may be connected to the power lines PL1 and PL2 or the first contacts 240 through the vias DV1, DV2, and a via V0.

According to the embodiment of the present inventive concepts illustrated in FIG. 6, the power lines PL1 and PL2 may be disposed in the first layer L, not the third layer L3 in which the plurality of conductive lines 260 and 270 are disposed. Thus, interference between the plurality of conductive lines 260, 265, and 270 and the power lines PL1 and PL2 may be reduced or eliminated to increase a degree of freedom of design of the plurality of conductive lines 260, 265, and 270. In addition, the number of vias V0 for connecting the conductive line 260 to the first contacts 240, in which the conductive line 260 and the first contacts 240 may extend in the first direction (x-axis direction), may be increased, and reduction in a size of the unit cell region (UC) may increase a degree of integration of the semiconductor elements.

Figure 7:
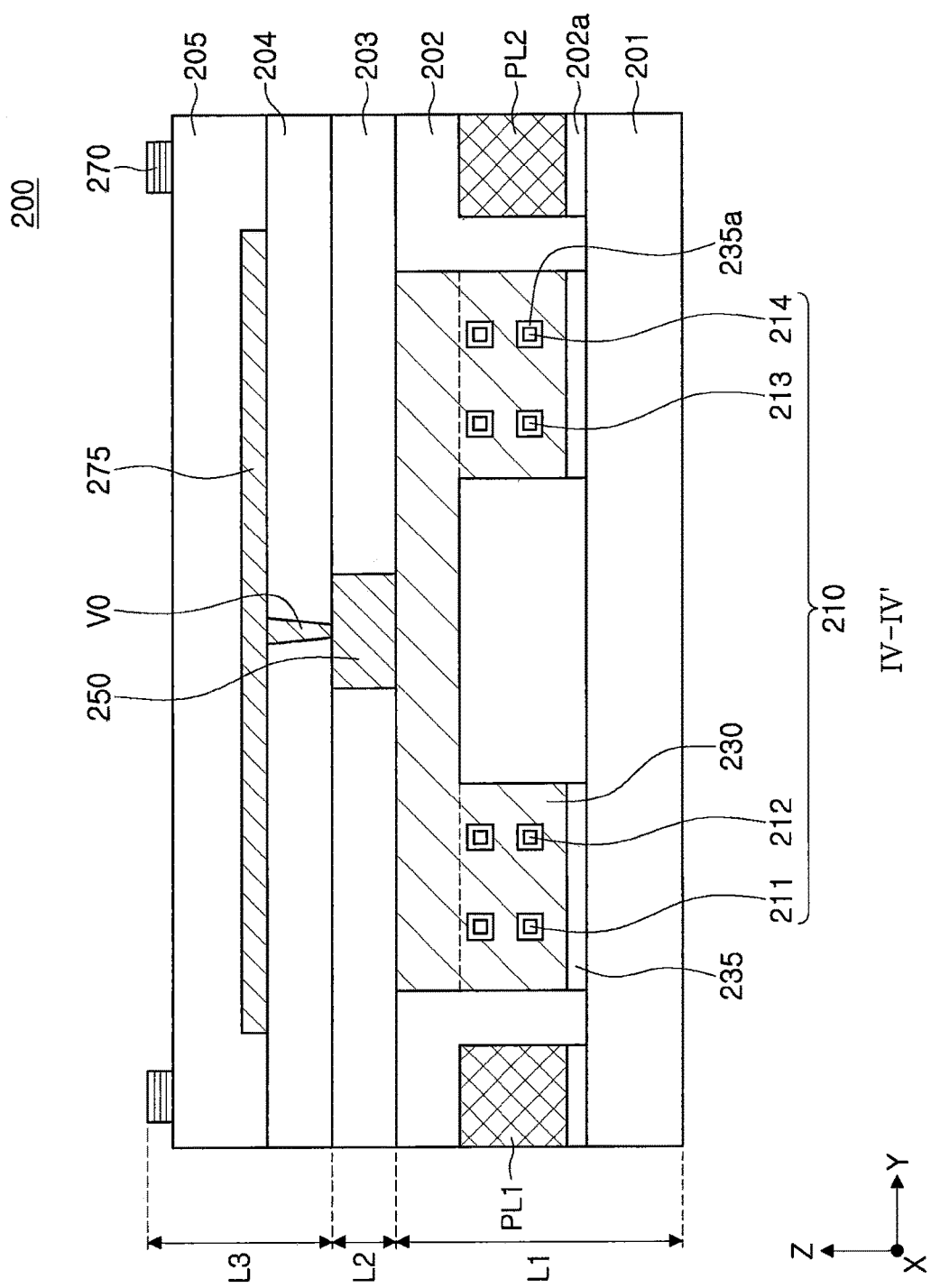
FIG. 7 is a cross-sectional view taken along line IV-IV' of the semiconductor device of FIG. 5.

FIG. 7 is a cross-sectional view taken along line IV-IV' of the semiconductor device of FIG. 5.

Referring to FIG. 7, the semiconductor device 200 may include the first to third layers L1 to L3. The first layer L1 may include the semiconductor substrate 201, the gate electrode 230 formed on the semiconductor substrate 201, the plurality of nanowires 211 to 214, the power lines PL1 and PL2, the first insulating layer 202 or the like. As described above with reference to FIGS. 5 and 6, the power lines PL1 and PL2 may extend in the first direction (x-axis direction) along with the plurality of nanowires 211 to 214, and may be disposed on a portion of the first insulating layer 202a to connect to the source/drain regions 220.

The plurality of nanowires 211 to 214 may extend in the first direction and intersect the gate electrode 230 extending in the second direction (y-axis direction). A gate insulating 235 layer may be disposed between the plurality of nanowires 211 to 214 and the gate electrode 230, and the gate insulating layer 235 may contain a high dielectric constant material. Here, portions of gate insulating layers 235a may be disposed between the plurality of nanowires 211 to 214 and the gate electrode 230 in the form of surrounding side surfaces of the plurality of nanowires 211, 212, 213, and 214. According to the embodiment of the present inventive concepts, the plurality of nanowires 211 to 214 having a rectangular shape may be surrounded by the gate electrode 230 to shorten a channel length, addressing an issue, such as single or short channel effects or the like.

The second contact 250 may be disposed on the gate electrode 230. A top surface of the second contact 250 may be formed at the same height from a top surface of the semiconductor substrate 201 to a top surface of the first contacts 240. The second contact 250 may be included in the second layer L2, and the second insulating layer 203 may be formed in a peripheral region of the second contact 250.

The plurality of conductive lines 270 and 275 may be disposed in the third layer L3. At least a portion of the conductive line 275 may be connected to the second contact 250 by a via V0. An electrical signal applied to the conductive line 275 connected to the second contact 250 through the via V0 may be delivered to the gate electrode 230, and a charge transfer path may be generated in the plurality of nanowires 211 to 214 by the electrical signal.

Figure 8:
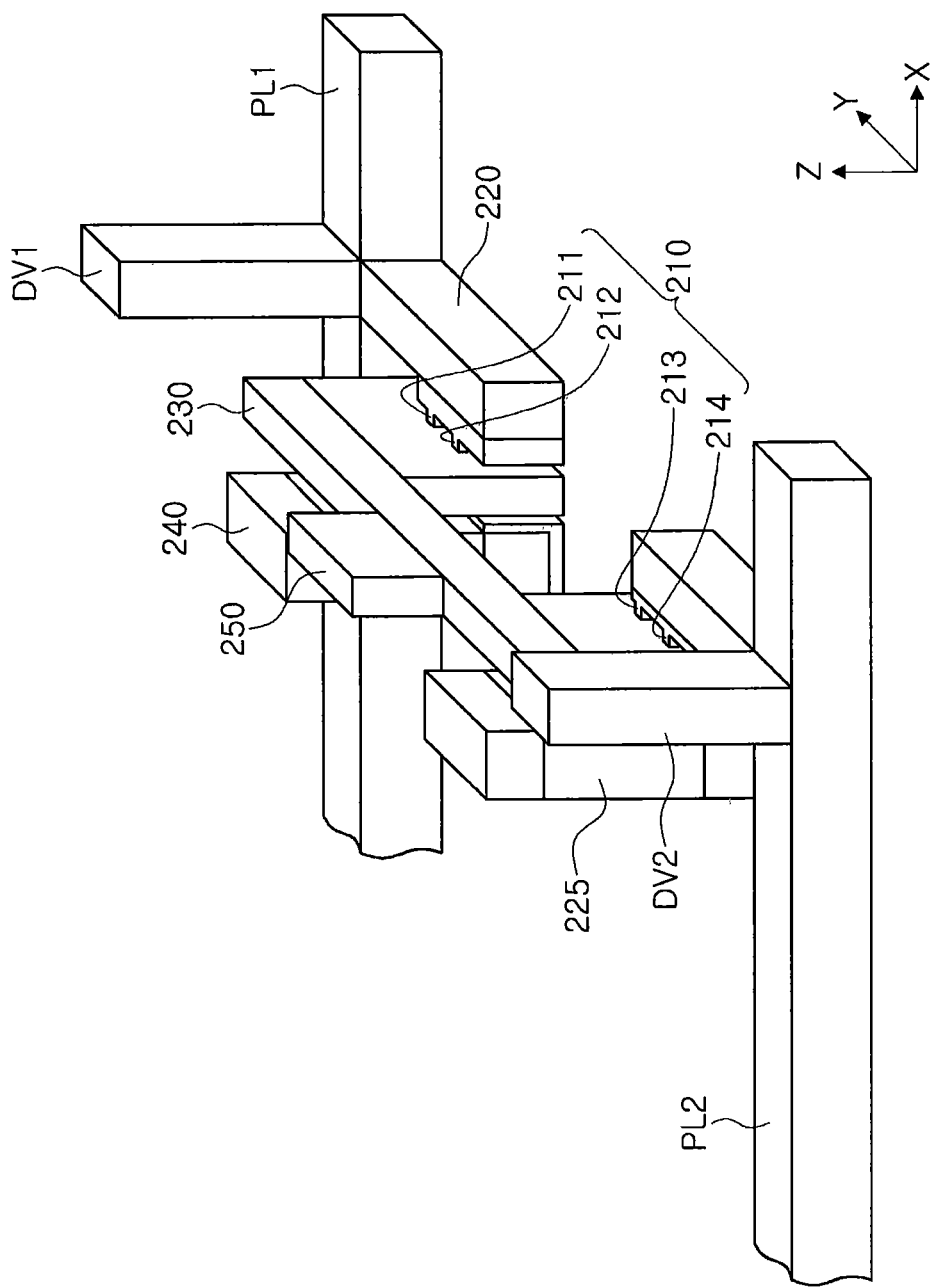
FIG. 8 is a perspective view of region B of the semiconductor device of FIG. 6.

FIG. 8 is a perspective view of region B of the semiconductor device of FIG. 6. As illustrated in FIG. 8, portions of components included in region B of the semiconductor device 200, for example, the semiconductor substrate 201 and the insulating layers 202, 203, 204, and 205 are not shown for convenience.

Referring to FIG. 8, portions of the plurality of nanowires 211 to 214 may be connected to each other to be provided as the source/drain regions 220, and portions of the source/drain regions 220 may be connected to the power lines PL1 and PL2. Portions of the first insulating layer 202a may be disposed between the power lines PL1 and PL2 and the semiconductor substrate 201, therefore the power lines PL1 and PL2 may not be connected directly to the semiconductor substrate 201. Referring to FIG. 8, the conductive layers 225 and the first contacts 240 may be disposed on the source/drain regions 220, and the second contact 250 may be disposed on the gate electrode 230.

The power lines PL1 and PL2 may supply, to the source/drain regions 220, a driving voltage VDD and a ground voltage VSS supplied from the outside or otherwise from an external power source through the vias DV1 and DV2. The vias DV1 and DV2 connected to the power lines PL1 and PL2 may be a deep via penetrating through at least one of the second and third layers L2 and L3 and a portion of the first layer L1. Thus, the vias DV1 and DV2 may have a tapered shape of which a cross section becomes narrower toward the power lines PL1 and PL2 in a depth direction (z-axis direction).

When the vias DV1 and DV2 penetrate through all of the second and third layers L2 and L3 and the portion of the first layer L1 to connect to the power lines PL1 and PL2, consideration of a degree of resistance between the vias DV1 and DV2 and the power lines PL1 and PL2 and the tapered shape of the vias DV1 and DV2 may require the vias DV1 and DV2 to have top surfaces having a relatively large area. Thus, as illustrated in FIG. 6, the vias DV1 and DV2 contacting the power lines PL1 and PL2 may extend only to a top surface of the third insulating layer 204, and the conductive line 265 may be formed on the vias DV1 and DV2. Forming an another via VI penetrating through the fourth insulating layer 205 on the conductive line 265 may reduce or prevent an increase in an area of the top surface of the vias DV1 and DV2, which may occur by disposing the power lines PL1 and PL2 in the first layer L1.

According to some embodiments illustrated in FIGS. 5 through 8, the power lines PL1 and PL2 may be disposed between the semiconductor substrate 201 and the plurality of conductive lines 260, 265, 270, and 275, i.e., within the first layer L1. Thus, since the power lines PL1 and PL2 and the plurality of conductive lines 260, 265, 270, and 275 are disposed in different layers, a probability of interference occurring between the power lines PL1 and PL2 and the plurality of conductive lines 260, 265, 270, and 275 may be reduced or eliminated to allow for design freedom in designing the plurality of conductive lines 260, 265, 270, and 275. In addition, reduction in the size of the unit cell region (UC) may improve a degree of integration of the semiconductor elements.

Figure 9:
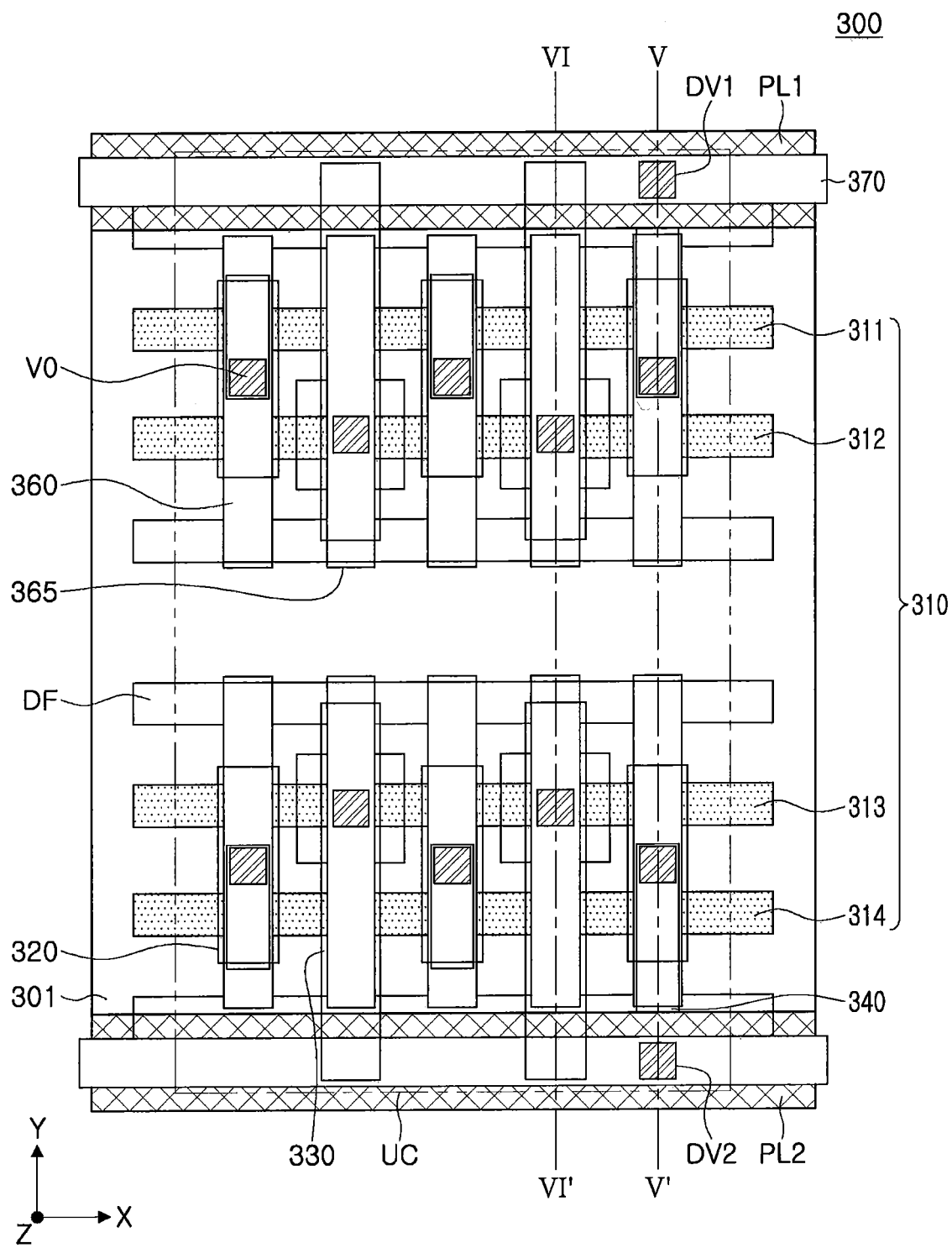
FIG. 9 is a plan view of a semiconductor device according to some embodiments of the present inventive concepts.

FIG. 9 is a plan view of a semiconductor device according to some embodiments of the present inventive concepts.

Referring to FIG. 9, a semiconductor device 300 according to some embodiments of the present inventive concepts may include a semiconductor substrate 301, an active region 310 formed on the semiconductor substrate 301, and a plurality of gate electrodes 330. The active region 310 may include a plurality of fin structures 311 to 314, and at least portions of the fin structures 311 to 314 may be connected to each other to be provided as source/drain regions 320. The source/drain regions 320 and the gate electrodes 330 may provide a semiconductor element and, e.g., a field effect transistor (FET). In a manufacturing process of the semiconductor device 300, at least one dummy fin (DF) may be disposed between the fin structures 311 to 314. The at least one dummy fin (DF) may be removed during the manufacturing process.

The fin structures 311 to 314 may extend in a first direction (x-axis direction), and the gate electrodes 330 may extend in a second direction (y-axis direction) different from the first direction to intersect the fin structures 311 to 314. Portions of the fin structures 311 and 312 may be connected to each other to be provided as the source/drain regions 320 of a PMOSFET, and the remaining fin structures 313 and 314 may be connected to each other to be provided as the source/drain regions 320 of an NMOSFET. Whether the fin structures 311 to 314 are provided as the source/drain regions 320 of one of the PMOSFET and NMOSFET may be changed according to layouts of the semiconductor device 300.

The source/drain regions 320 and the gate electrodes 330 may have first and second contacts 340 and 350 disposed thereon, respectively. The first and second contacts 340 and 350 may be connected to a plurality of conductive lines through vias to receive an electrical signal from the outside or otherwise from an external power source. For example, when the semiconductor device 300 according to some embodiments of the present inventive concepts illustrated in FIG. 9 includes an SRAM circuit, the first contacts 340 disposed in the source/drain regions 320 may be connected to a word line and the second contacts 350 disposed on the gate electrodes 330 may be connected to a bit line.

The layouts of the semiconductor device 300 may have power lines PL1 and PL2 provided adjacent to upper and lower boundaries of a unit cell region (UC). The power lines PL1 and PL2 may be connected to the conductive lines through the vias DV1 and DV2, and may supply the power supply voltage VDD or the ground power supply voltage VSS to the source/drain regions 320. According to the embodiment of the present inventive concepts, the power lines PL1 and PL2 may be disposed between the semiconductor substrate 301, and the conductive lines supplying the power supply voltage VDD or the ground power supply voltage VSS. For example, the power lines PL1 and PL2 may be disposed in the same layer as the first contacts 340 connected to the source/drain regions 320, being connected to the first contacts 340.

Figure 10:
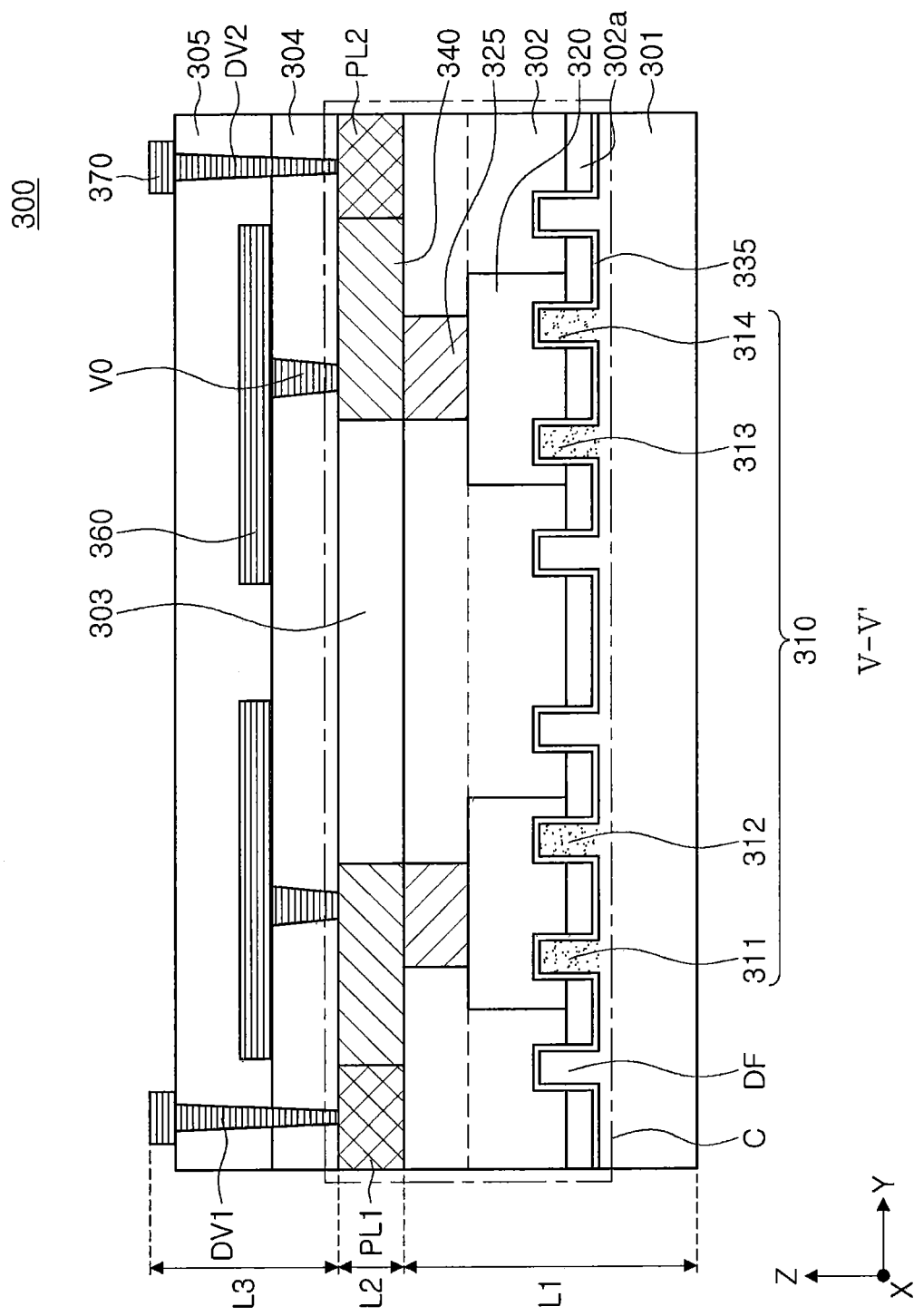
FIG. 10 is a cross-sectional view taken along line V-V' of the semiconductor device of FIG. 9.

FIG. 10 is a cross-sectional view taken along line V-V' of the semiconductor device of FIG. 9.

Referring to FIG. 10, the semiconductor device 300 according to some embodiments of the present inventive concepts may include first to third layers L1, L2, and L3 sequentially stacked. The first layer L1 may include the semiconductor substrate 301, the fin structures 311 to 314 formed on the semiconductor substrate 301, the source/drain regions 320 connecting at least portions of the fin structures 311 to 314 to each other, and the conductive layer 325.

The fin structures 311 to 314 may be formed by selectively removing a region of the semiconductor substrate 301 from a top surface of the semiconductor substrate 301. In this case, at least one dummy fin (DF) may be provided adjacent to the plurality of fin structures 311, 312, 313, and 314 to maintain constant or substantially uniform gaps between the fin structures 311 to 314. Unlike the plurality of fin structures 311, 312, 313, and 314, the DF may be removed during the manufacturing process of the semiconductor device 300.

Portions of the fin structures 311 to 314 may be connected to each other to form the source/drain regions 320. According to the embodiment of the present inventive concepts illustrated in FIG. 10, each of the source/drain regions 320 is illustrated as including two of the fin structures 311 to 314. On the other hand, at least three of the fin structures 311 to 314 may provide a source/drain region 320. A gate insulating layer 335 containing a high dielectric constant material may be disposed on the plurality of fin structures 311 to 314, and a first insulating layer 302 may be provided in a space between the plurality of fin structures 311 to 314 and the source/drain regions 320. The first insulating layer 302 may contain an oxide or a nitride.

The second layer L2 may include a second insulating layer 303, the first contacts 340, and the power lines PL1 and PL2. The first contacts 340 may be disposed on the conductive layer 325 to be electrically connected to the source/drain regions 320. The power lines PL1 and PL2 may be disposed adjacent to a boundary of the unit cell region (UC) in the second direction (y-axis direction) in the second layer L2 to connect to the first contacts 340.

In addition, the third layer L3 may include third and fourth insulating layers 304 and 305 and a plurality of conductive lines 360 and 370. The plurality of conductive lines 360 and 370 may be electrically connected to the first contacts 340 or the power lines PL1 and PL2 through vias V0 and DV1, DV2. In this case, the vias DV1 and DV2 connecting portions of the conductive lines 370 to the power lines PL1 and PL2 may penetrate through the entire third layer L3, may be implemented with a deep via, and may have a tapered shape of which a cross section becomes narrower toward the power lines PL1 and PL2.

According to the embodiment of the present inventive concepts illustrated in FIG. 10, the power lines PL1 and PL2 may be disposed between the semiconductor substrate 301 and the plurality of conductive lines 360 and 370. Thus, interference between the power lines PL1 and PL2 and the conductive lines 360 and 370 may be reduced or eliminated, and a degree of freedom of arrangements of the plurality of conductive lines 360 and 370 may be increased to reduce a length of the unit cell region (UC) in the second direction (y-axis direction), thus improving a degree of integration of the semiconductor elements.

Figure 11:
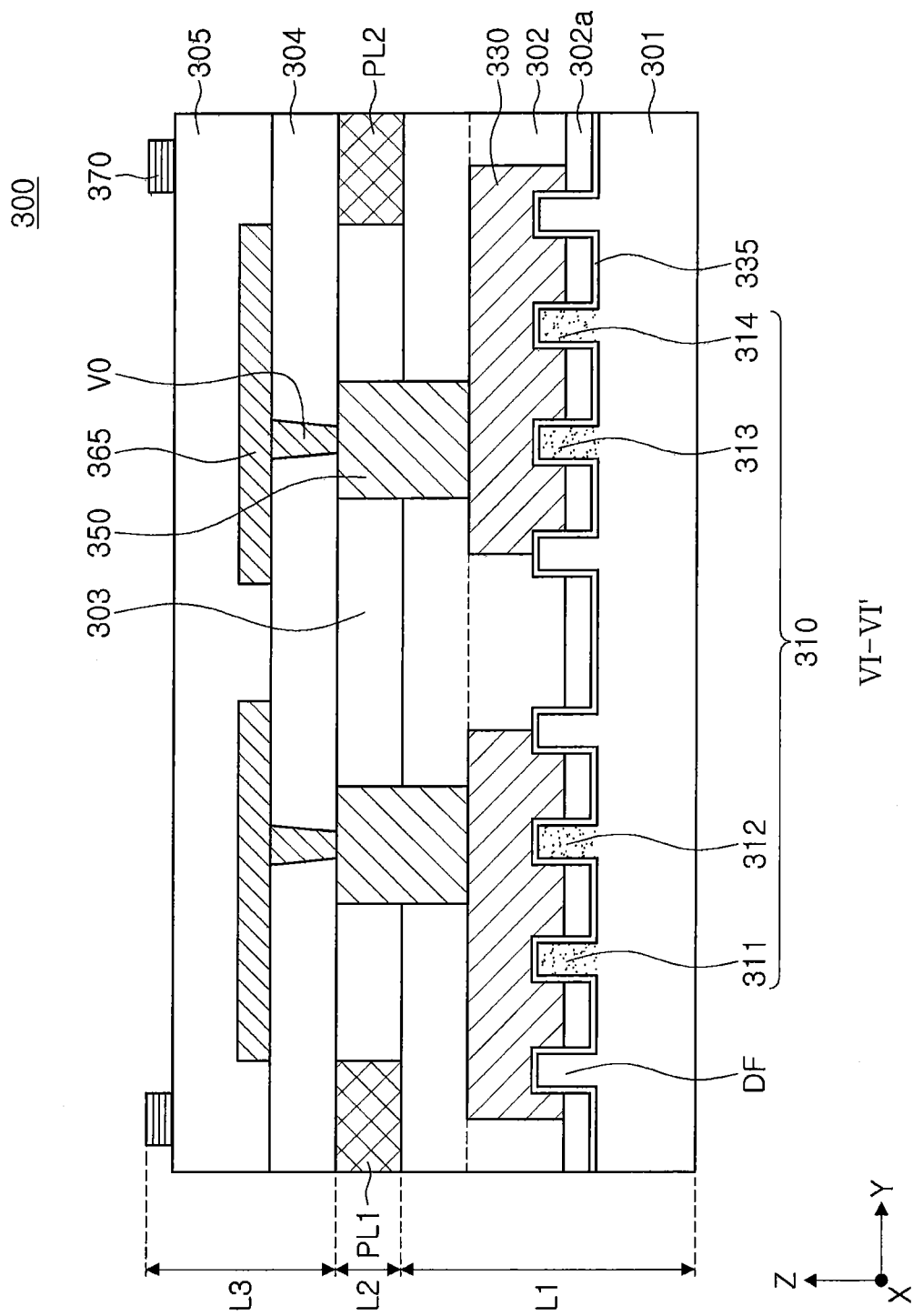
FIG. 11 is a cross-sectional view taken along line VI-VI' of the semiconductor device of FIG. 9.

FIG. 11 is a cross-sectional view taken along line VI-VI' of the semiconductor device of FIG. 9.

Referring to FIG. 11, the semiconductor device 300 according to some embodiments of the present inventive concepts may include first to third layers L1, L2, and L3. As described with reference to FIG. 10, the first layer L1 may include the plurality of fin structures 311 to 314, the source/drain regions 320, and the conductive layer 325, and may further include the gate electrodes 330. The gate electrodes 330 may contain a metal, a conductive metal oxide, or a polysilicon, and the gate insulating layer 325 may be provided between the gate electrodes 330 and the plurality of fin structures 311 to 314. The gate electrodes 330 may be separately arranged from each other in a region for forming a PMOSFET and a region for forming an NMOSFET.

The second layer L2 may include the second contacts 350 connected to the gate electrodes 330, and the second insulating layer 303. The second contacts 350 may be provided in the PMOSFET and NMOSFET regions, respectively, to correspond to locations of the gate electrodes 330.

The third layer L3 may be disposed on the second layer L2 and include the third and fourth insulating layers 304 and 305 and a plurality of conductive lines 370. The plurality of conductive lines 370 may be connected to the second contacts 350 by a via V0 and may be provided as word lines applying an electrical signal to the gate electrodes 330.

Figure 12:
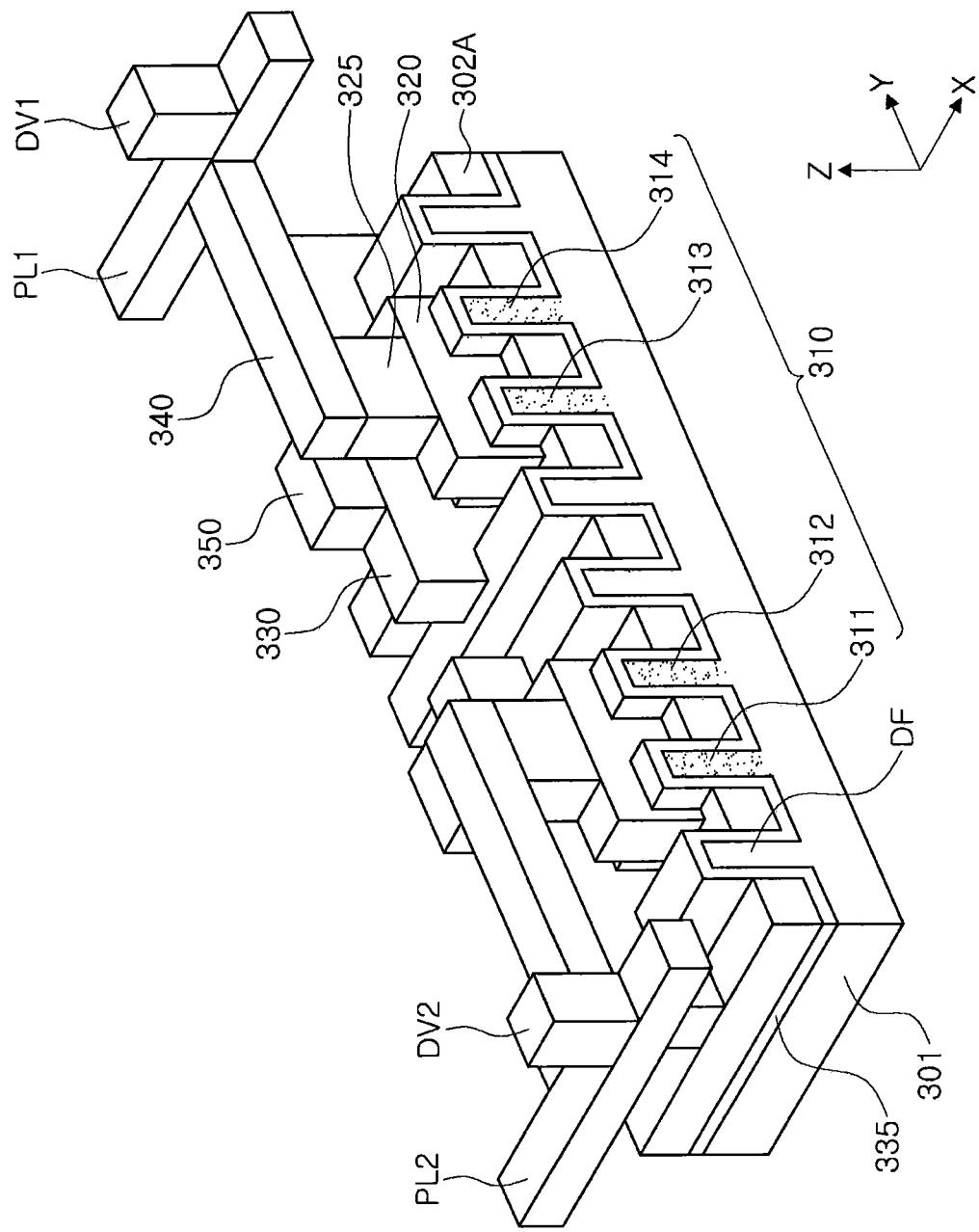
FIG. 12 is a perspective view of region C of the semiconductor device of FIG. 10.

FIG. 12 is a perspective view of region C of the semiconductor device of FIG. 10.

Referring to FIG. 12, the fin structures 311 to 314 may be provided on the semiconductor substrate 301. At least one dummy fin (DF) may be provided adjacent to the plurality of fin structures 311 to 314; however, the DF may be removed during the manufacturing process, and therefore, the DF may not exist in the final structure of the semiconductor device 300. The gate insulating layer 335 may be provided by using a high dielectric constant material on the plurality of fin structures 311 to 314.

The plurality of fin structures 311 to 314 may extend in the first direction (x-axis direction) and intersect the gate electrodes 330 extending in the second direction (y-axis direction). The gate electrodes 330 may be arranged separately from each other in the region for formation of a PMOSFET and the region for forming an NMOSFET.

The source/drain regions 320, the conductive layer 325 and the first contacts 340 may be sequentially stacked on the plurality of fin structures 311 to 314. The first contacts 340 may extend by a predetermined length in the second direction to connect to the power lines PL1 and PL2. The power lines PL1 and PL2 may extend in the first direction and may be connected to the plurality of conductive lines 370 through the vias DV1 and DV2.

According to some embodiments of the present inventive concepts illustrated in FIGS. 9 through 12, the power lines PL1 and PL2 may be disposed between the semiconductor substrate 301 and the plurality of conductive lines 360 and 370, i.e., within the first layer L1. Thus, since the power lines PL1 and PL2 and the plurality of conductive lines 360 and 370 may be disposed on different layers, a probability of interference occurring between the power lines PL1 and PL2 and the plurality of conductive lines 360 and 370 may be reduced to improve a degree of freedom of design of the plurality of conductive lines 360 and 370. In addition, reduction in the length of the unit cell region (UC) in the first direction (x-axis direction) may increase a degree of integration of the semiconductor elements.

FIGS. 13 through 18 are views illustrating methods of manufacturing a semiconductor device according to embodiments of the present inventive concepts. The method of manufacturing a semiconductor device described with reference to FIGS. 13 through 18 may be a manufacturing method applied to the semiconductor device 100 illustrated in FIGS. 1 through 4.

Figure 13A:
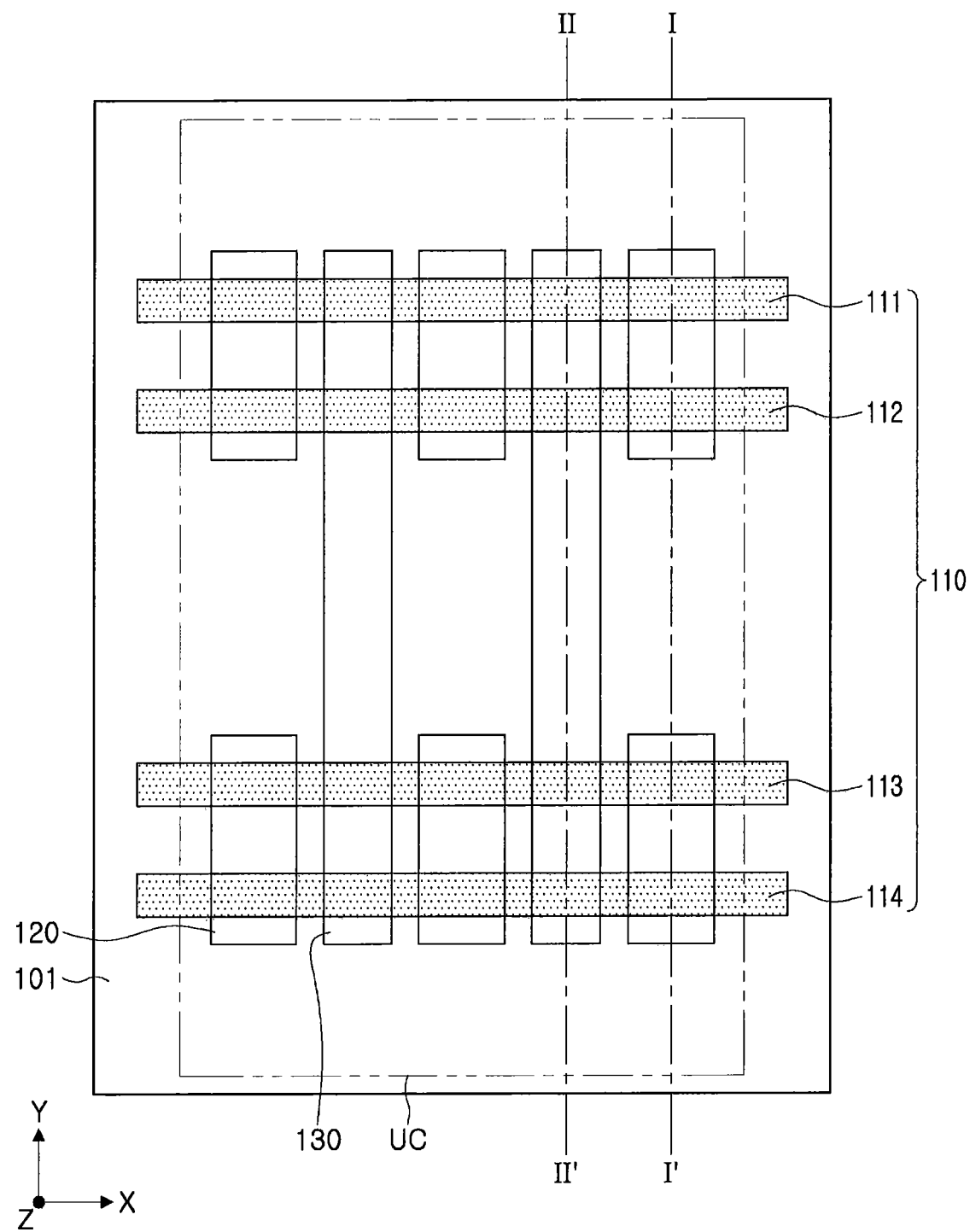
FIGS. 13A through 18C are views illustrating methods of manufacturing a semiconductor device according to some embodiments of the present inventive concepts.

Referring initially to FIG. 13A, the semiconductor substrate 101 may have the active region 110, for example, the plurality of nanowires 111, 112, 113, and 114, the source/drain regions 120, and the gate electrodes 130. The plurality of nanowires 111, 112, 113, and 114 may extend in the first direction (x-axis direction), and portions of the plurality of nanowires 111, 112, 113, and 114 may be connected to each other as a region in the source/drain regions 120. The gate electrodes 130 may extend in the second direction (y-axis direction) intersecting the first direction. In addition, the semiconductor substrate 101 may have the unit cell region (UC) defined thereon, and the UC may be variously modified according to circuits to be implemented in the semiconductor device 100.

Figure 13B:
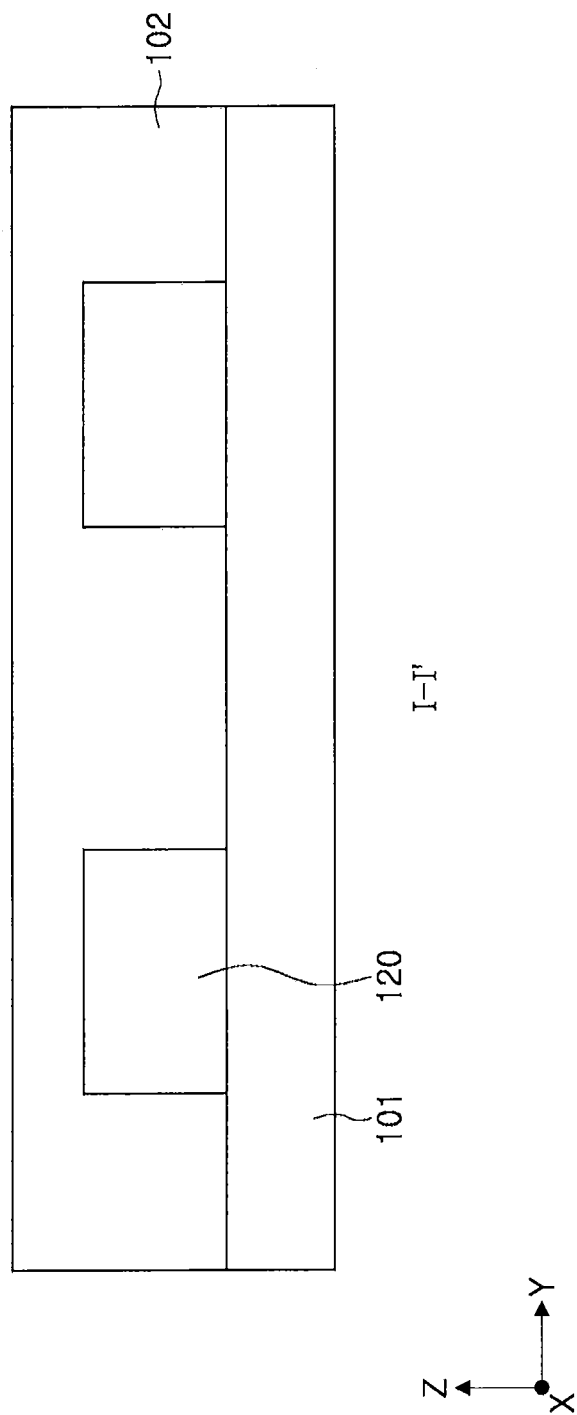

FIGS. 13B and 13C may be cross-sectional views taken along lines I-I' and II-II' of FIG. 13A, respectively. Referring initially to FIG. 13B, the source/drain regions 120 may be formed on the semiconductor substrate 101, and peripheries of the source/drain regions 120 may be surrounded by the first insulating layer 102. Referring now to FIG. 13C, the gate electrode 130 may intersect the plurality of nanowires 111, 112, 113, and 114, and the gate insulating layers 135a and 135 may be provided between the plurality of nanowires 111, 112, 113, and 114 and the gate electrode 130 and between the gate electrode 130 and the semiconductor substrate 101, respectively. The gate insulating layers 135a and 135 may contain a high dielectric constant material, e.g., a material having a higher dielectric constant than that of a silicon oxide film.

The gate electrodes 130 respectively provided in the PMOSFET and NMOSFET regions on the semiconductor substrate 101 may be connected as illustrated in FIG. 13C depending on a circuit to be implemented in the semiconductor device 100. For example, since the gate electrodes 130 of the PMOSFET and the NMOSFET need to be connected to each other when it is desired to implement an inverter circuit, the gate electrodes 130 may be formed as illustrated in FIG. 13C.

Figure 14A:
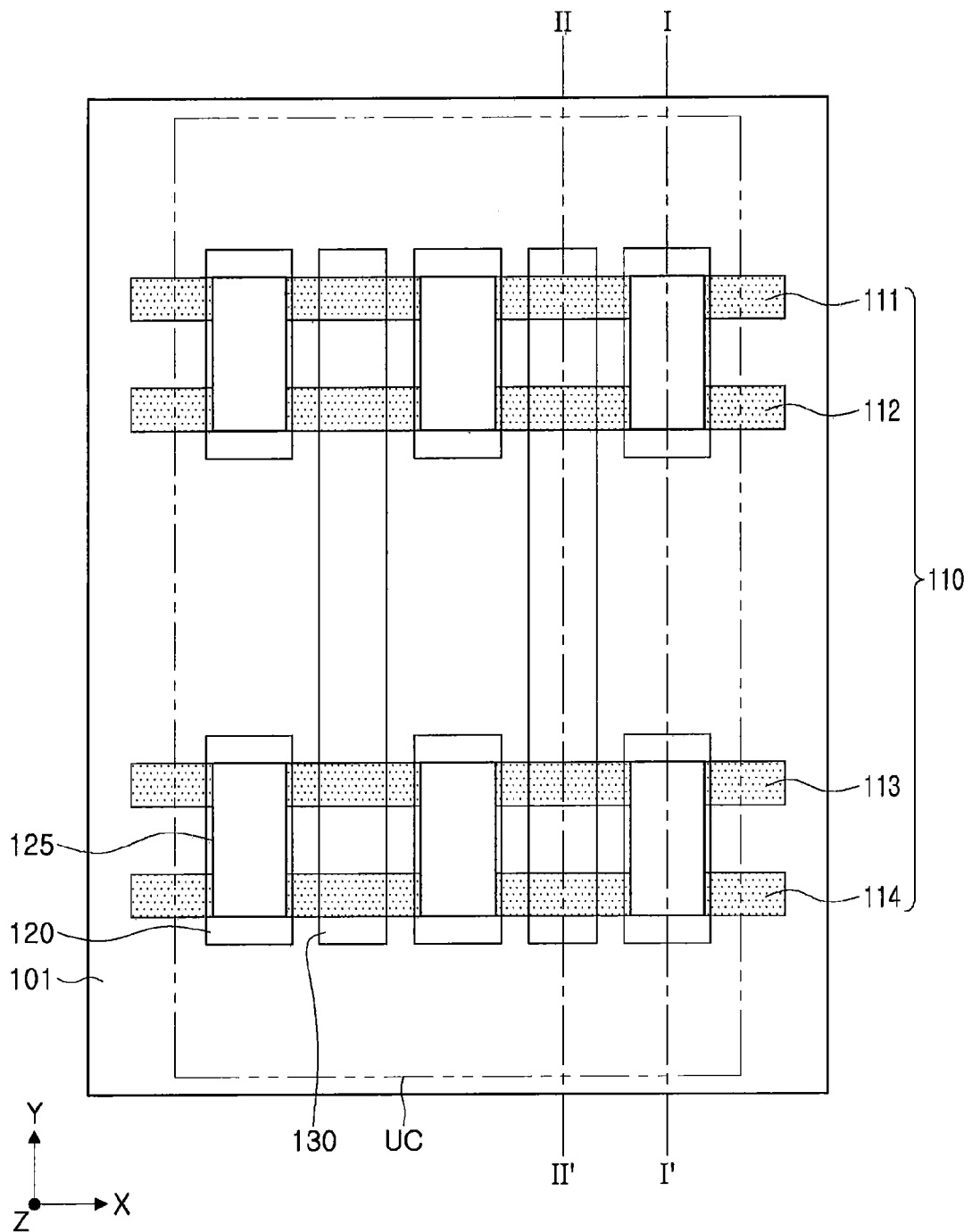
Figure 14B:
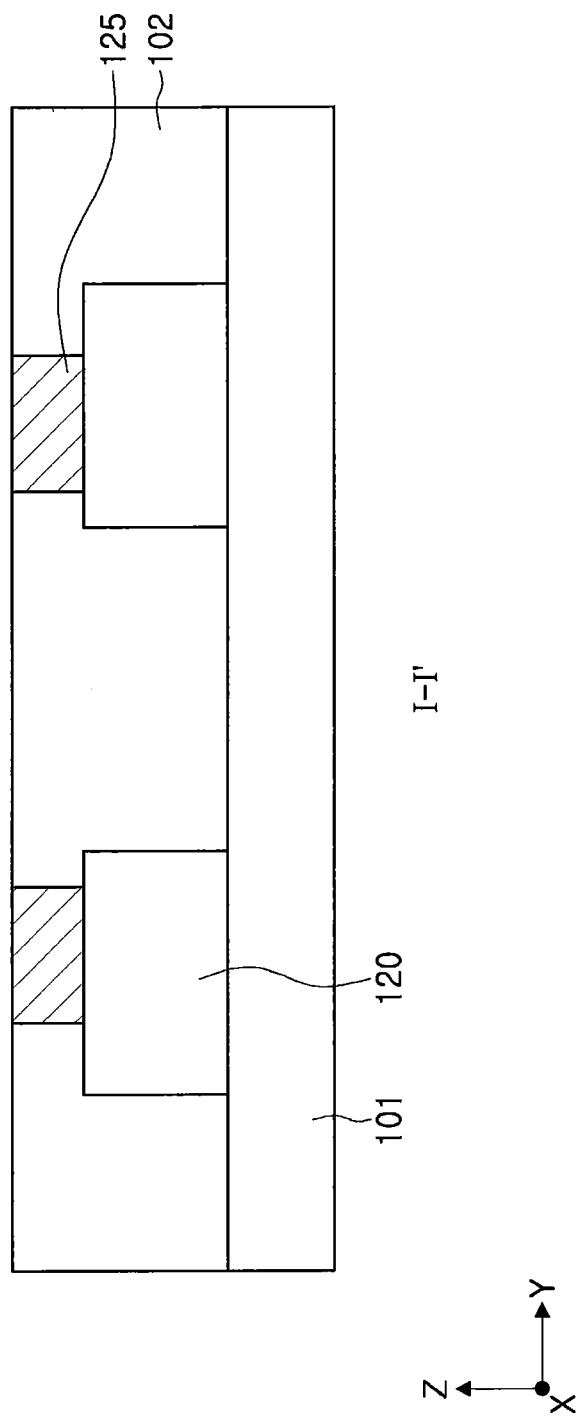
Figure 14C:
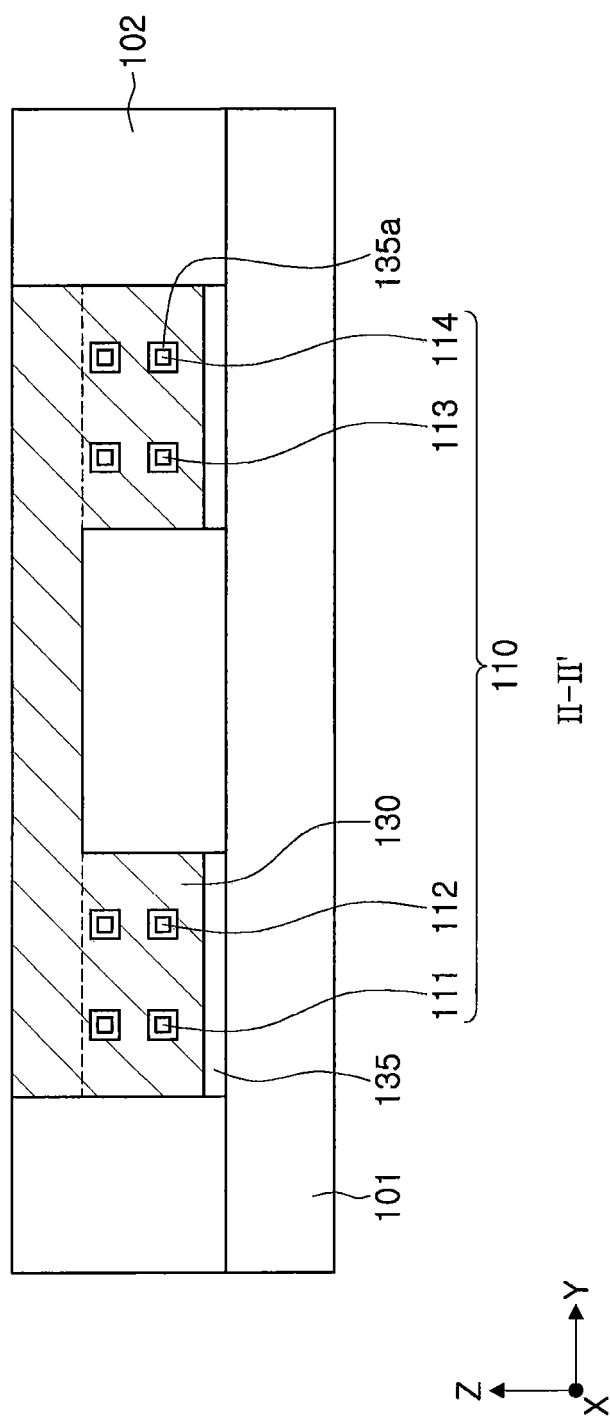

Referring now to FIGS. 14A through 14C, the conductive layer 125 may be formed on the source/drain regions 120. A height of the top surface of the conductive layer 125 may be the same as a height from the top surface of the semiconductor substrate 101 to the top surface of the gate electrodes 130. For example, the top surface of the conductive layer 125 may form a surface coplanar with the top surface of the gate electrodes 130, and the conductive layer 125 may eliminate a step between the top surface of the gate electrodes 130 and the top surface of the source/drain regions 120. A peripheral region of the conductive layer 125 may be filled with the first insulating layer 102.

Figure 15A:
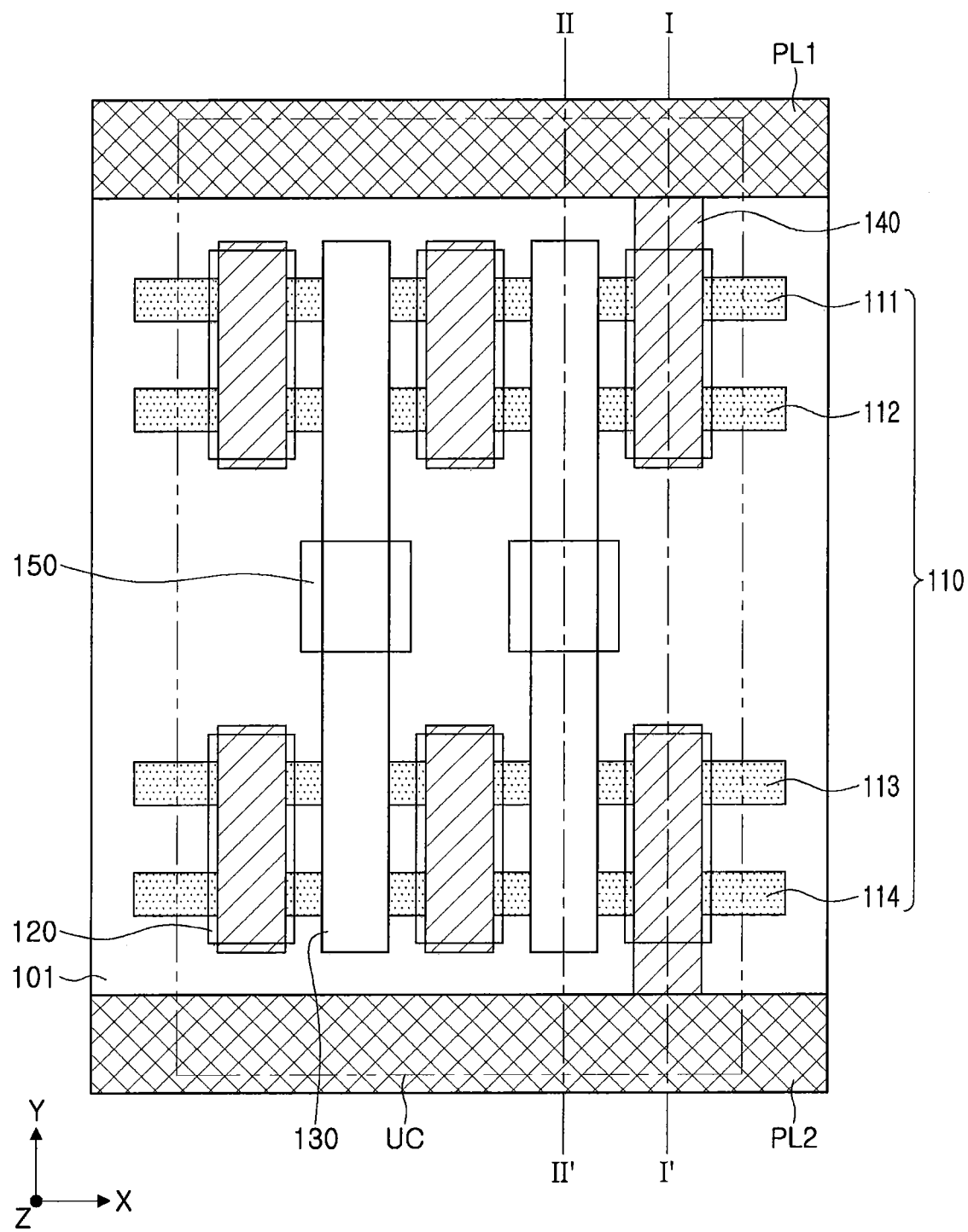
Figure 15B:
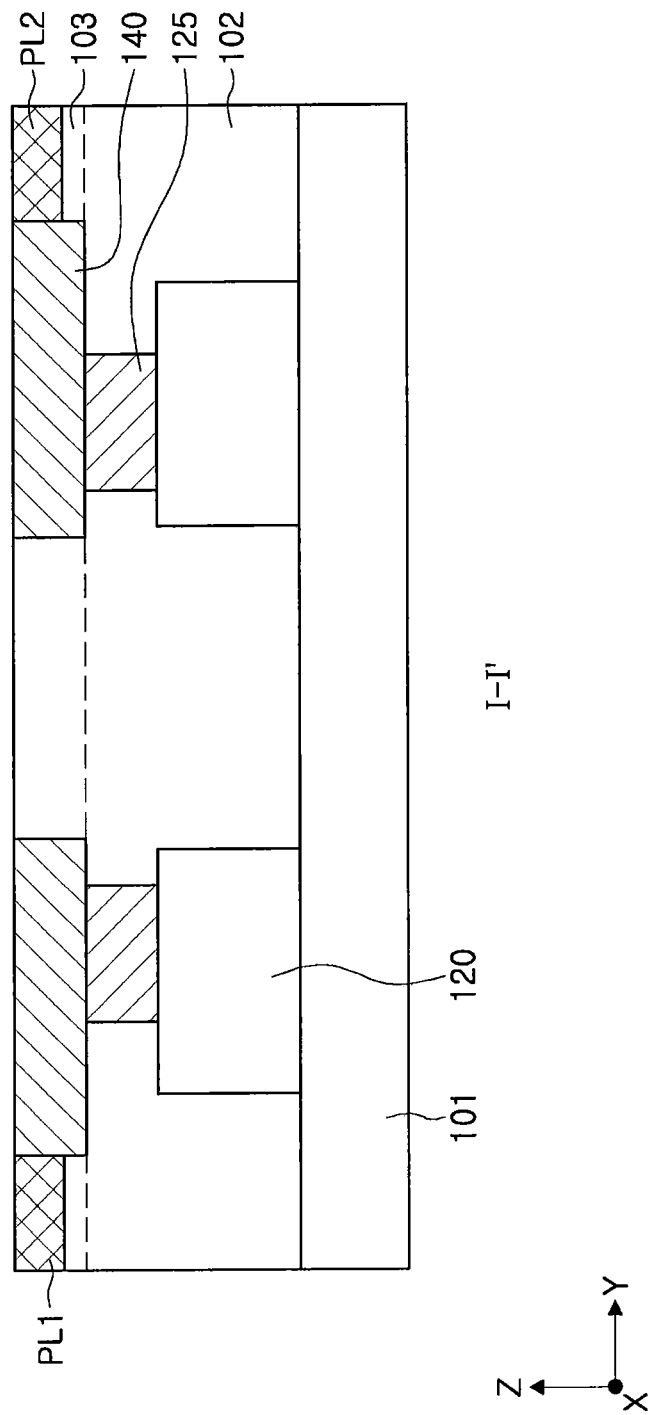
Figure 15C:
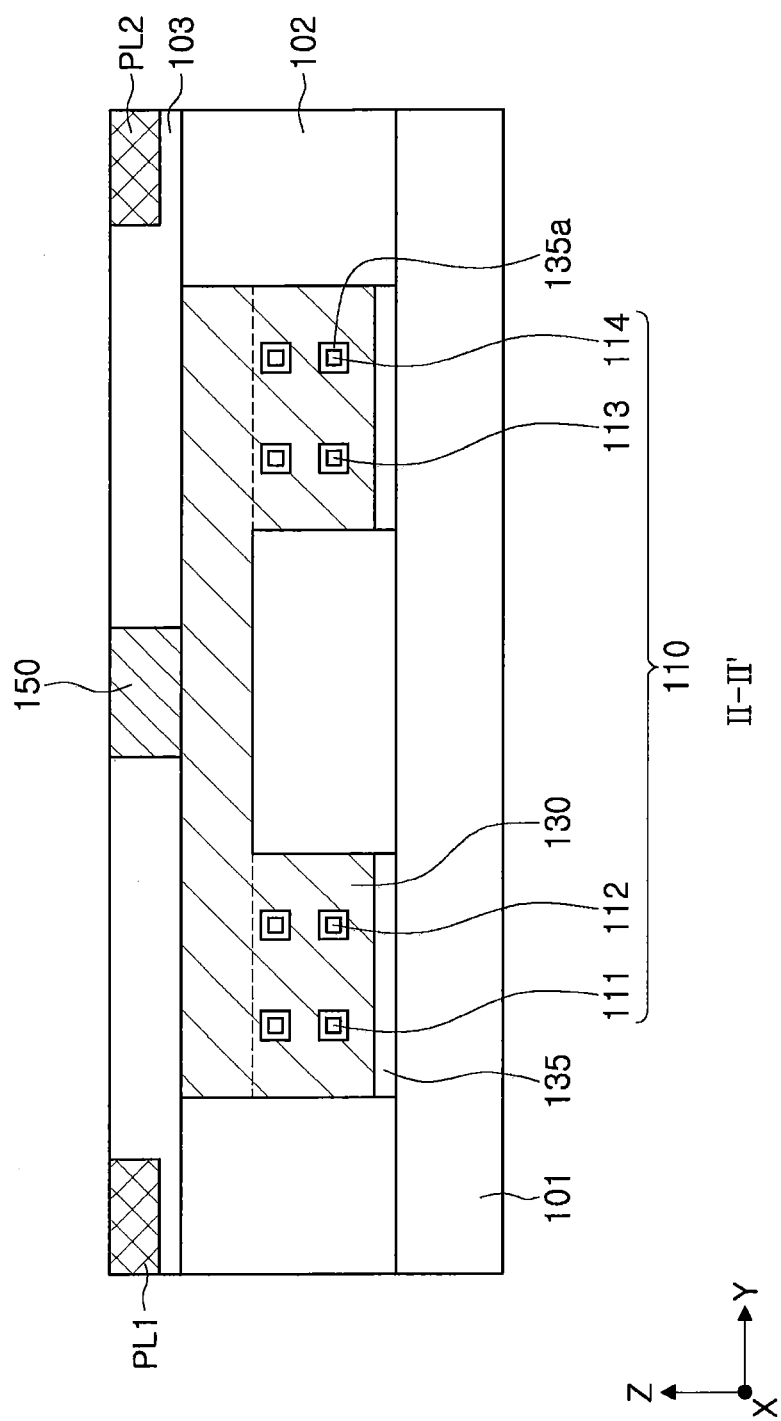

Referring to FIG. 15A, the source/drain regions 120 and the gate electrodes 130 may have the first and second contacts 140 and 150 disposed thereon, respectively. According to some embodiments of the present inventive concepts, the first contacts 140 may be formed on the top surface of the conductive layer 125 on the source/drain regions 120. As illustrated in FIGS. 15B and 15C, the first and second contacts 140 and 150 may be defined as being included in the second layer L2. The second layer L2 may further include the power lines PL1 and PL2 in addition to the first and second contacts 140 and 150.

As illustrated in FIGS. 15A and 15B, the power lines PL1 and PL2 may extend in the first direction (x-axis direction), and may be connected to sidewall portions of the first contacts 140 which extend relatively longer than other first contacts 140 in the second direction (y-axis direction). Referring to FIG. 15C, the power lines PL1 and PL2 may be electrically separated from the second contacts 150 by the second insulating layer 103 included in the second layer L2.

Figure 16A:
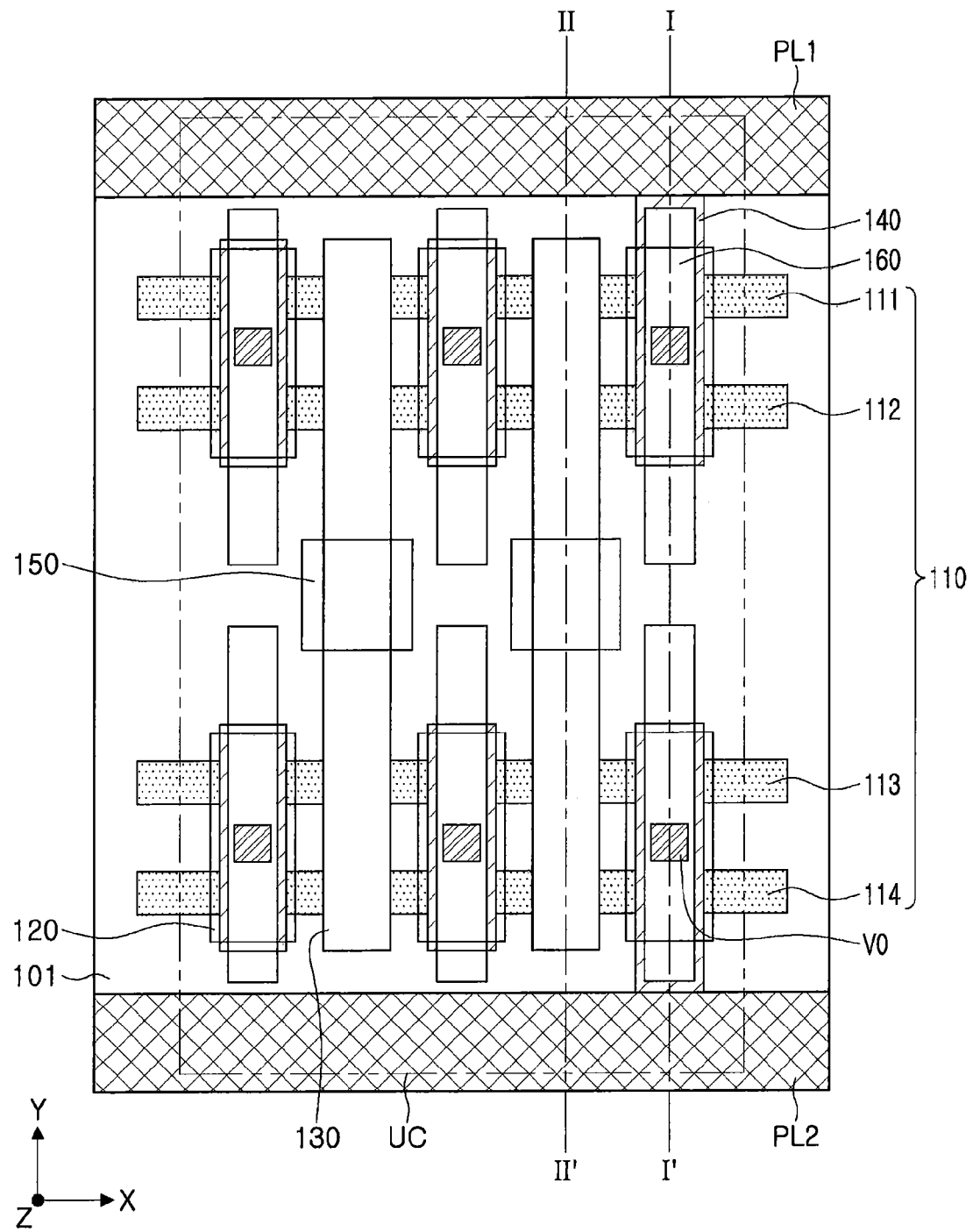
Figure 16B:
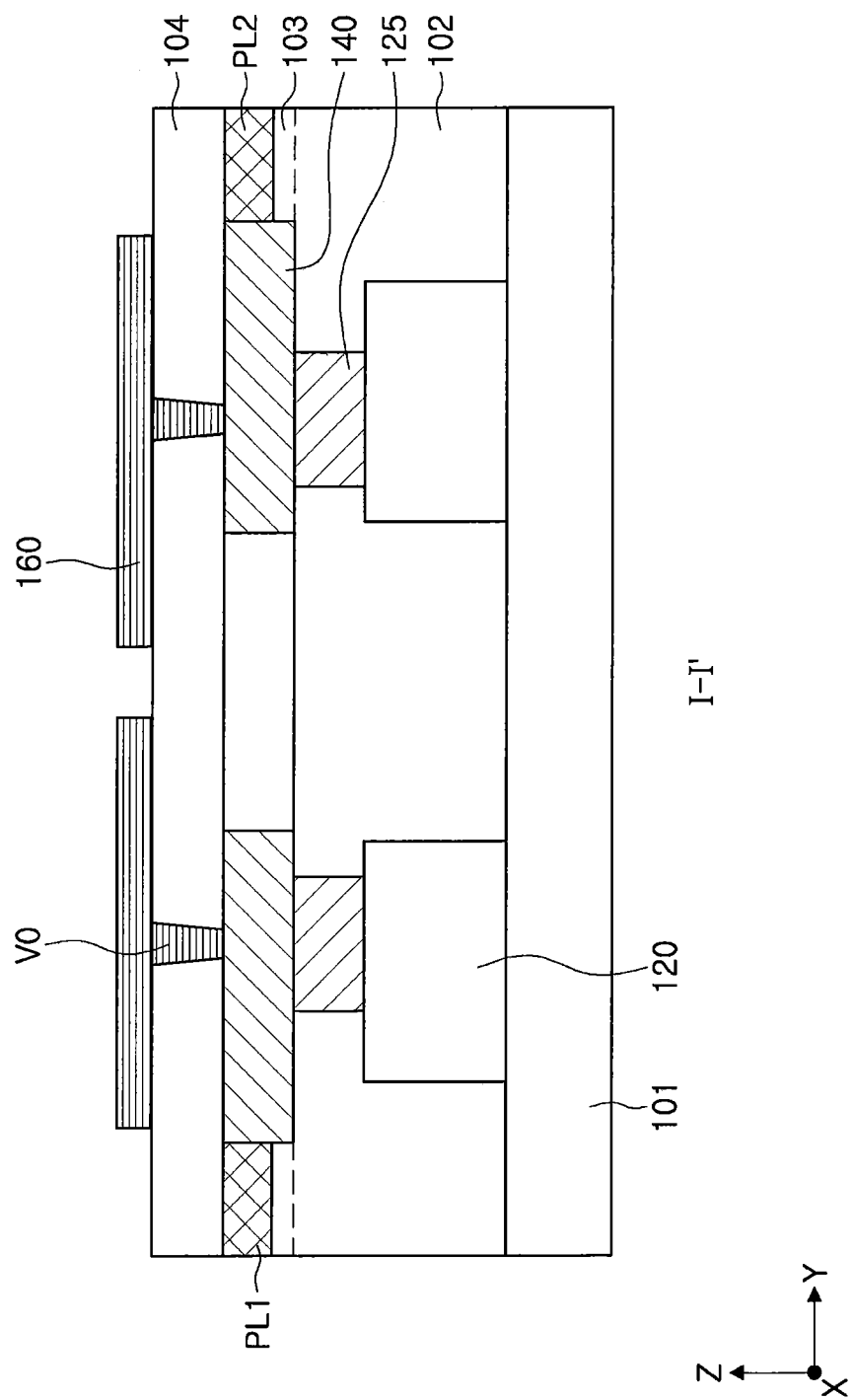
Figure 16C:
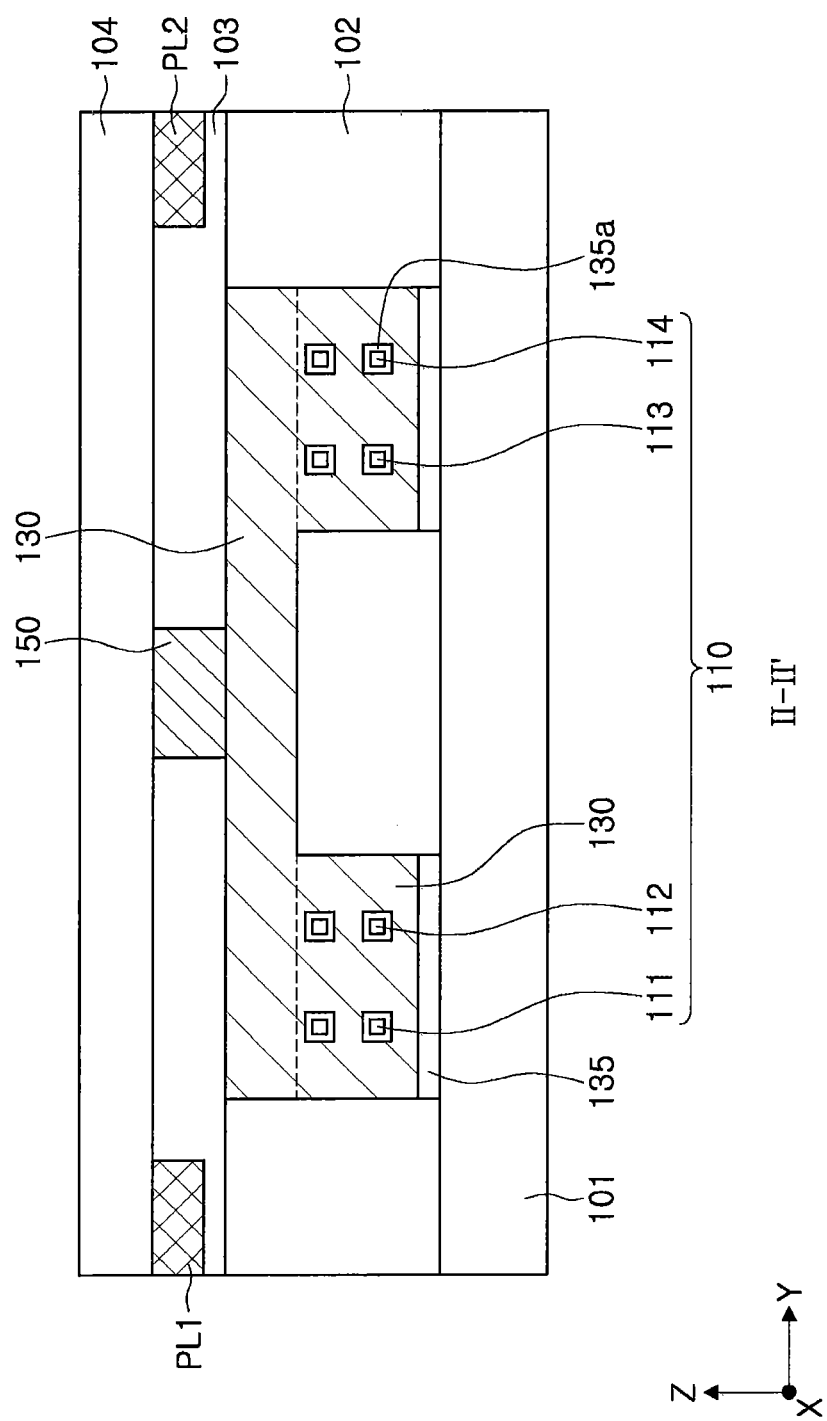

Referring now to FIG. 16A, the plurality of first conductive lines 160 may be formed. Referring to FIGS. 16B and 16C illustrating cross-sectional views taken along lines I-I' and II-II' of FIG. 16A, the plurality of first conductive lines 160 may be disposed on the second layer L2 and include a metal, a metal silicide, or the like. The plurality of first conductive lines 160 may be disposed on the first contacts 140 with the third insulating layer 104 interposed therebetween, and may be electrically connected to the first contacts 140 by the first via V0. The plurality of first conductive lines 160 may extend in the second direction (y-axis direction) as in the first contacts 140 and the source/drain regions, but may extend in another direction, such as the first direction (x-axis direction).

Figure 17A:
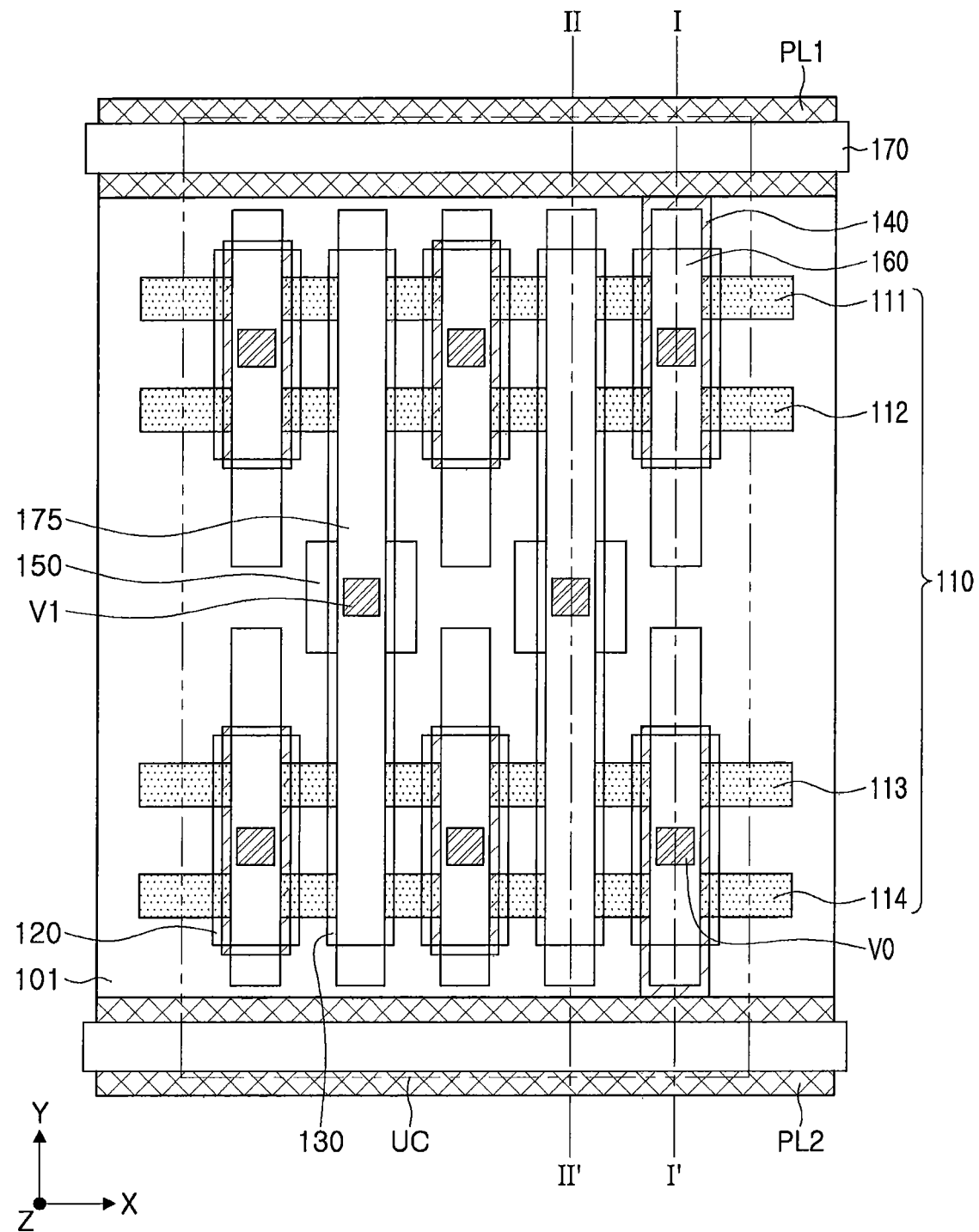
Figure 17B:
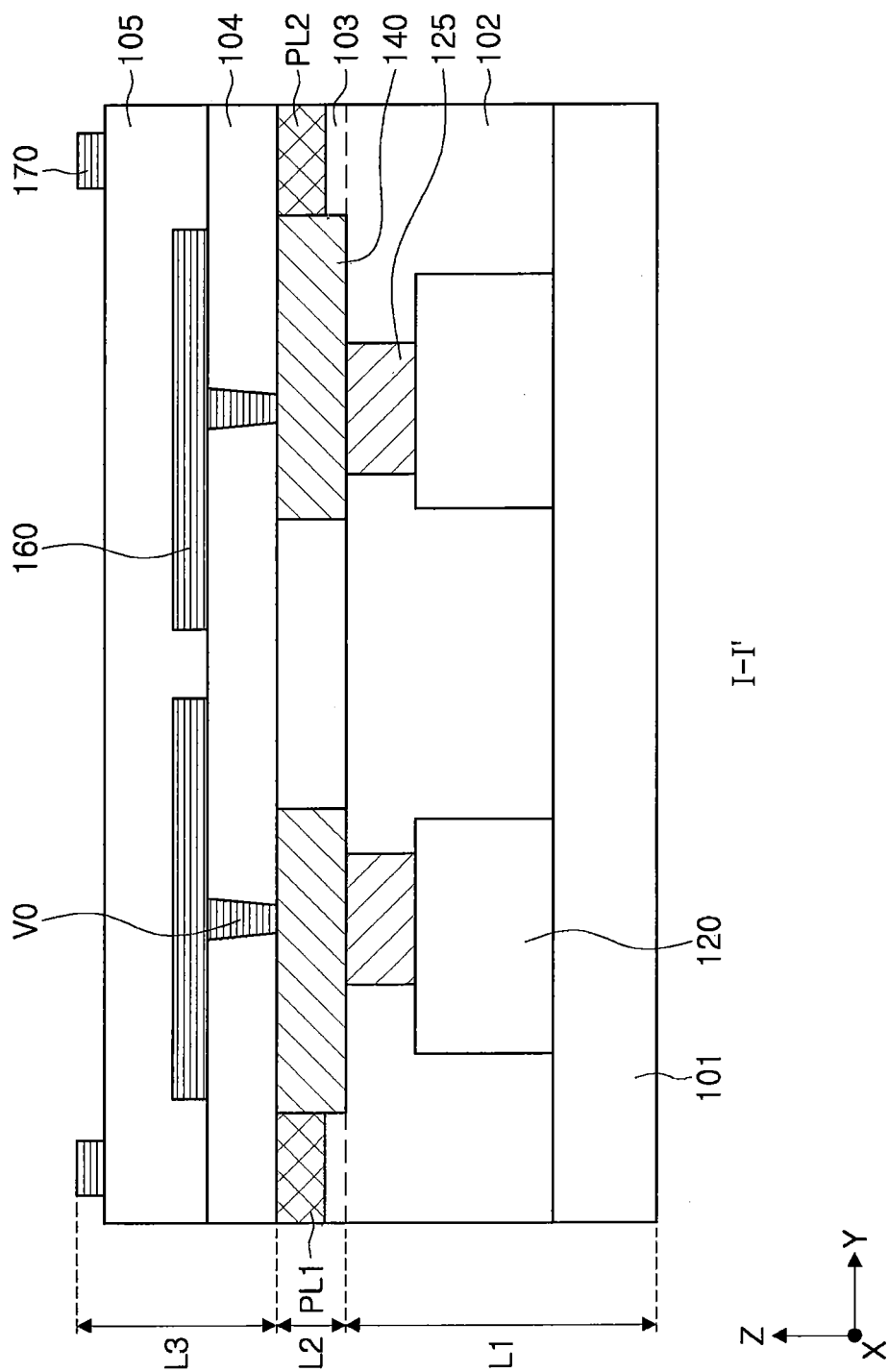
Figure 17C:
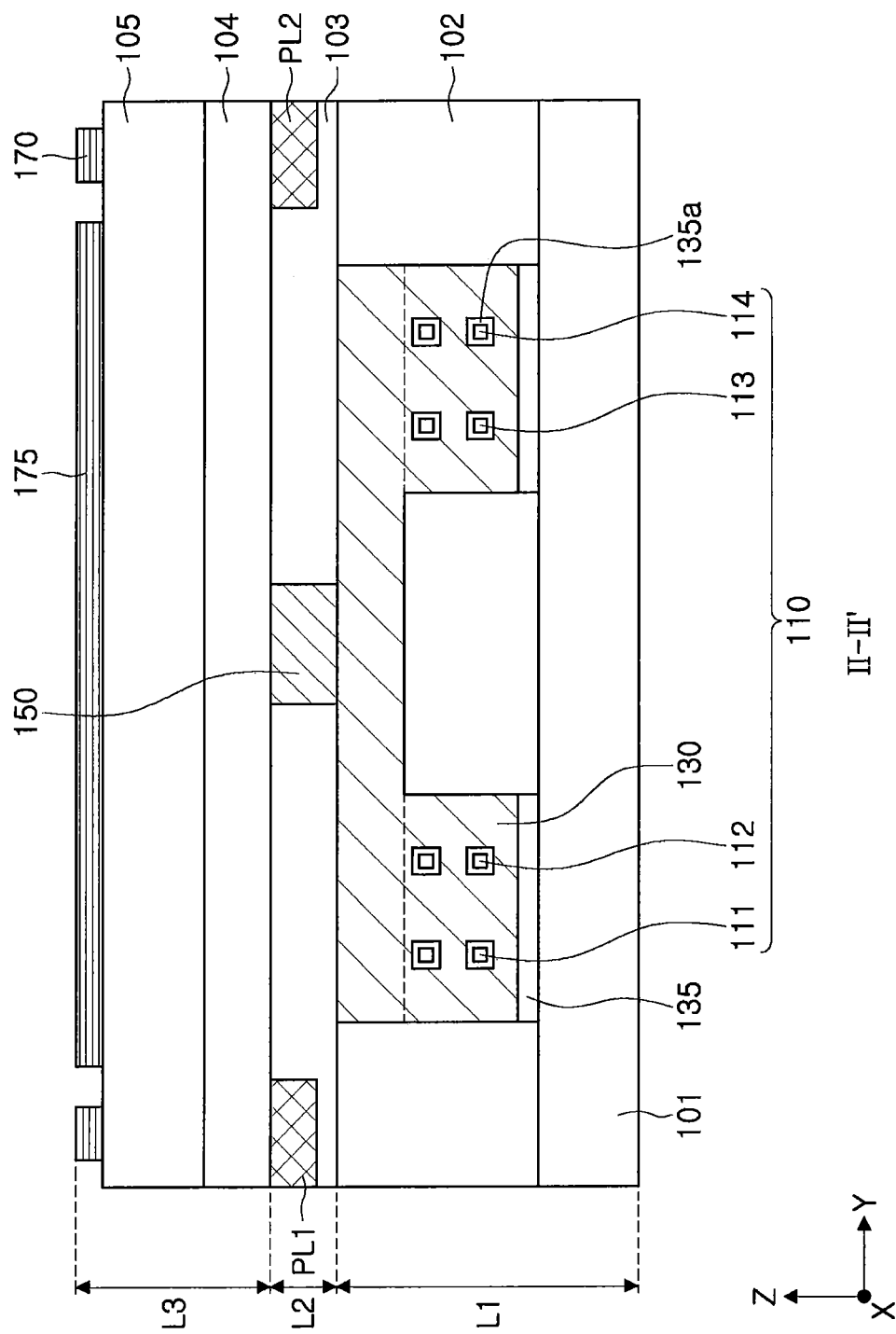

Referring to FIGS. 17A through 17C, the plurality of second conductive lines 170, 175 may be formed on the plurality of first conductive lines 160. The plurality of second conductive lines 170 may be electrically separated from the plurality of first conductive lines 160 by the fourth insulating layer 105, and may be disposed on the power lines PL1 and PL2 or on the gate electrodes 130. The second conductive lines 175 disposed on the plurality of gate electrodes 130 may be electrically connected to the second contacts 150 through the second via V1 (see FIG. 18C). Thus, an electrical signal may be input to the gate electrodes 130 through the second conductive lines 175.

Figure 18A:
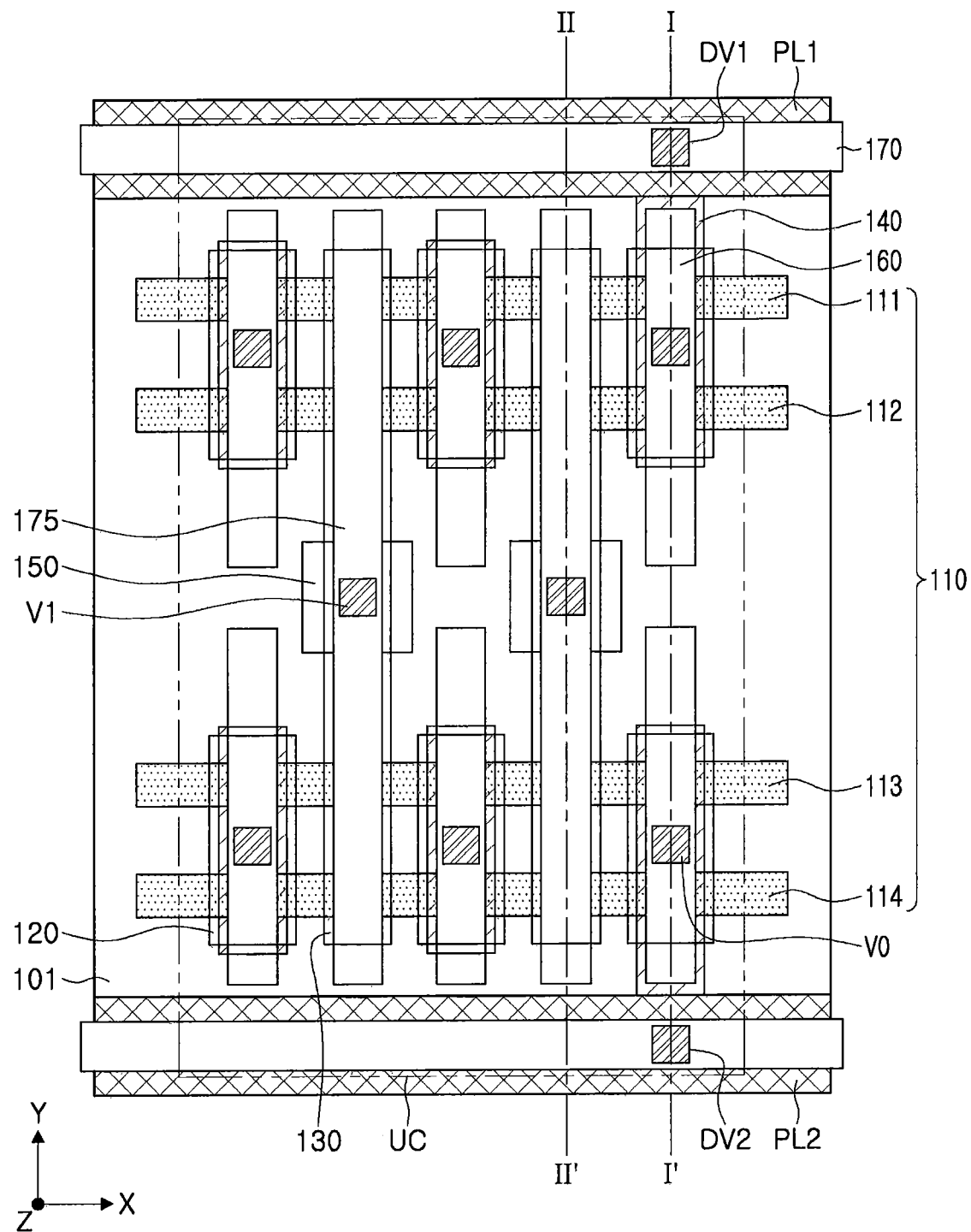
Figure 18B:
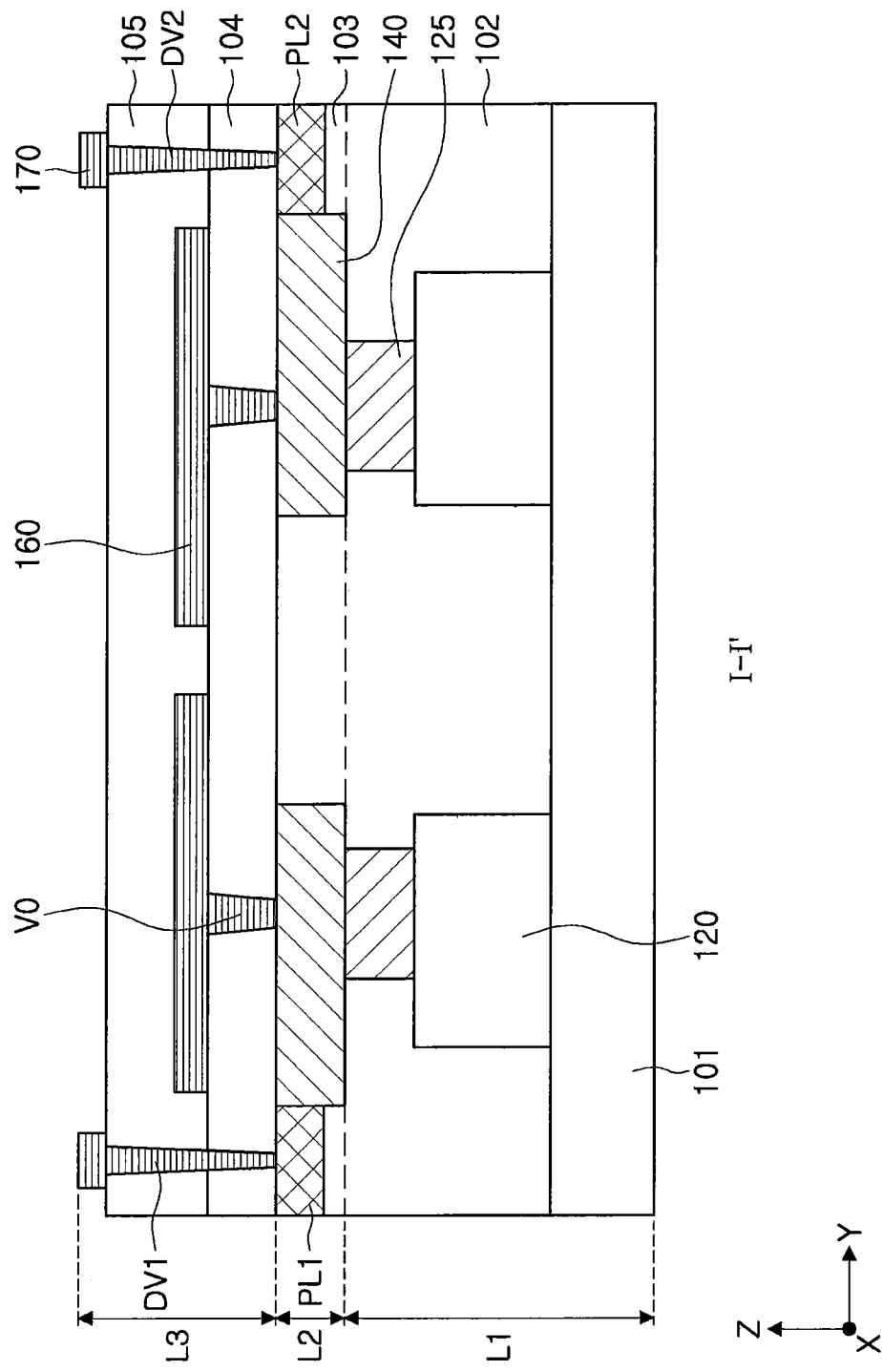
Figure 18C:
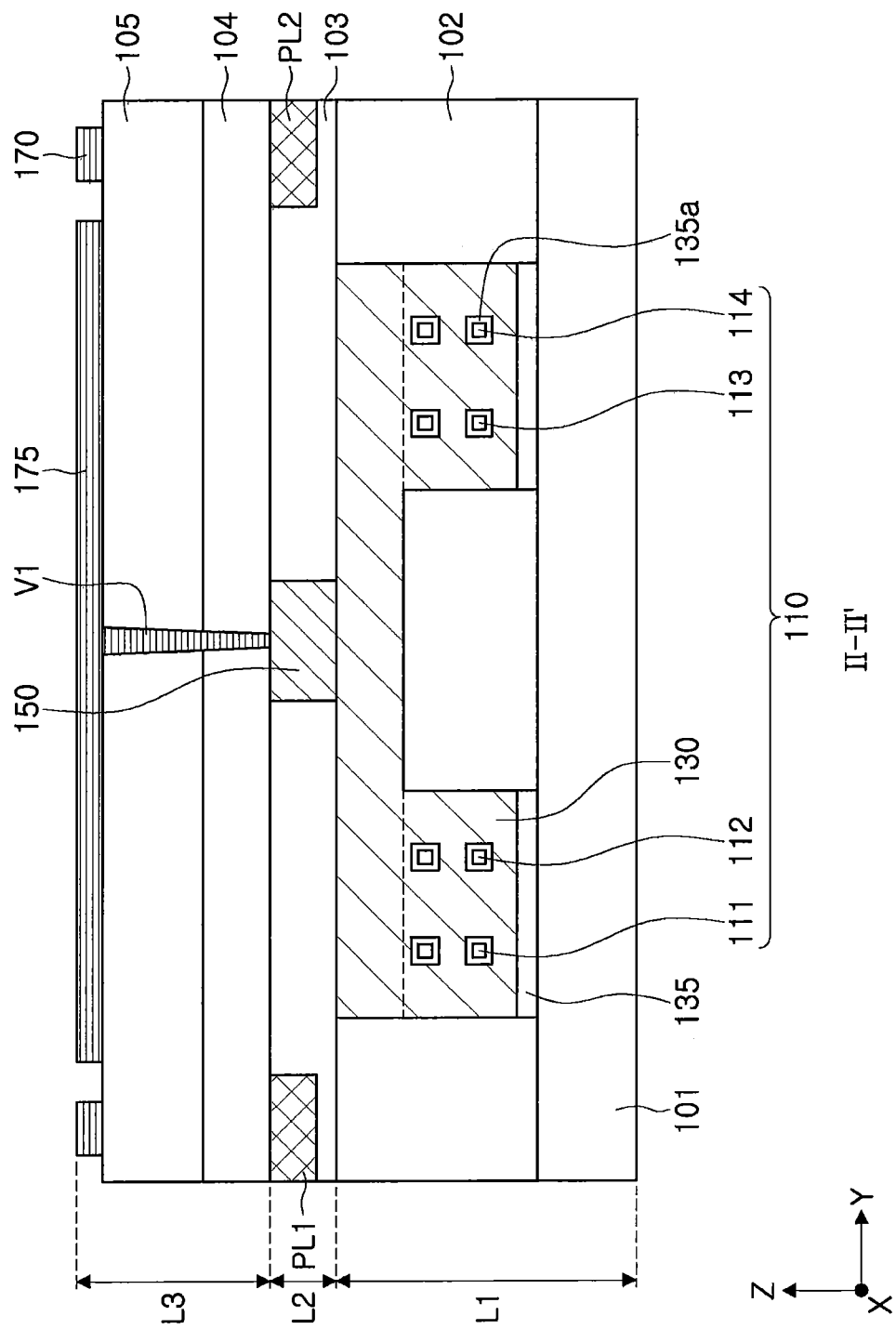

Referring to FIGS. 18A through 18C, the deep vias DV1 and DV2 may be formed in the second conductive lines 170 disposed on the power lines PL1 and PL2 so that the second conductive lines 170 and the power lines PL1 and PL2 may be electrically connected to each other. According to the embodiment of the present inventive concepts illustrated in FIG. 18B, the deep vias DV1 and DV2 may be formed adjacent to a region in which the first contacts 140 and the power lines PL1 and PL2 are connected, but are not limited thereto.

As illustrated in FIG. 18B, the deep vias DV1 and DV2 may pass through the third and fourth insulating layers 104 and 105 in the third layer L3 to connect to the power lines PL1 and PL2 disposed in the second layer L2. The deep vias DV1 and DV2 may contain copper (Cu) and, e.g., may be formed with the second conductive lines 170 by a dual damascene process. According to some embodiments of the present inventive concepts, a plating process may be performed by etching the third and fourth insulating layers 104 and 105 included in the third layer L3 to form vertical holes for defining the deep vias DV1 and DV2 and by filling the vertical holes with copper (Cu). In this case, the second conductive lines 170 may be formed of Cu on a surface of the fourth insulating layer 105, and then the copper may be polished by a CMP process or the like to be flat, thus forming the deep vias DV1 and DV2 and the second conductive lines 170 together.

FIGS. 19 through 24 are views illustrating methods of manufacturing a semiconductor device according to some embodiments of the present inventive concepts. The method of manufacturing a semiconductor device described with reference to FIGS. 19 through 24 may be a manufacturing method applied to the semiconductor device 200 according to some embodiments of the present inventive concepts illustrated in FIGS. 5 through 8.

Figure 19A:
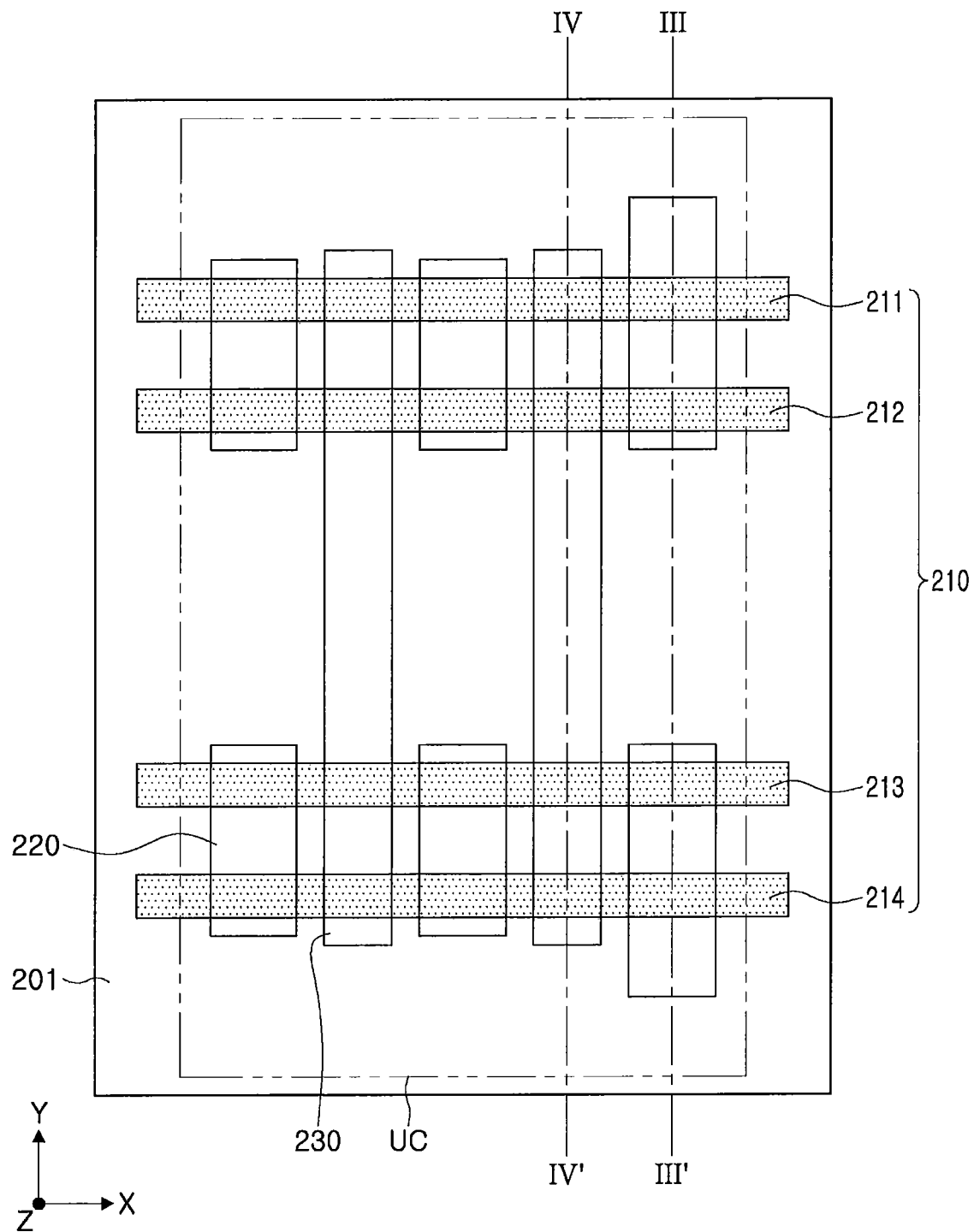
FIGS. 19A through 24C are views illustrating methods of manufacturing a semiconductor device according to some embodiments of the present inventive concepts.

Referring now to FIG. 19A, the semiconductor substrate 201 may have the active region 210, for example, the plurality of nanowires 211, 212, 213, and 214, the source/drain regions 220 provided by connecting portions of the plurality of nanowires 211, 212, 213, and 214 to each other, the gate electrodes 230, or the like, formed thereon. The plurality of nanowires 211, 212, 213, and 214 may be disposed to be spaced apart from the top surface of the semiconductor substrate 201 by a predetermined distance in a direction (z-axis direction) perpendicular to the top surface of the semiconductor substrate 201. Thus, the semiconductor device 200 according to the embodiment of the present inventive concepts may include a semiconductor device having a three-dimensional structure, e.g., a transistor.

Figure 19B:
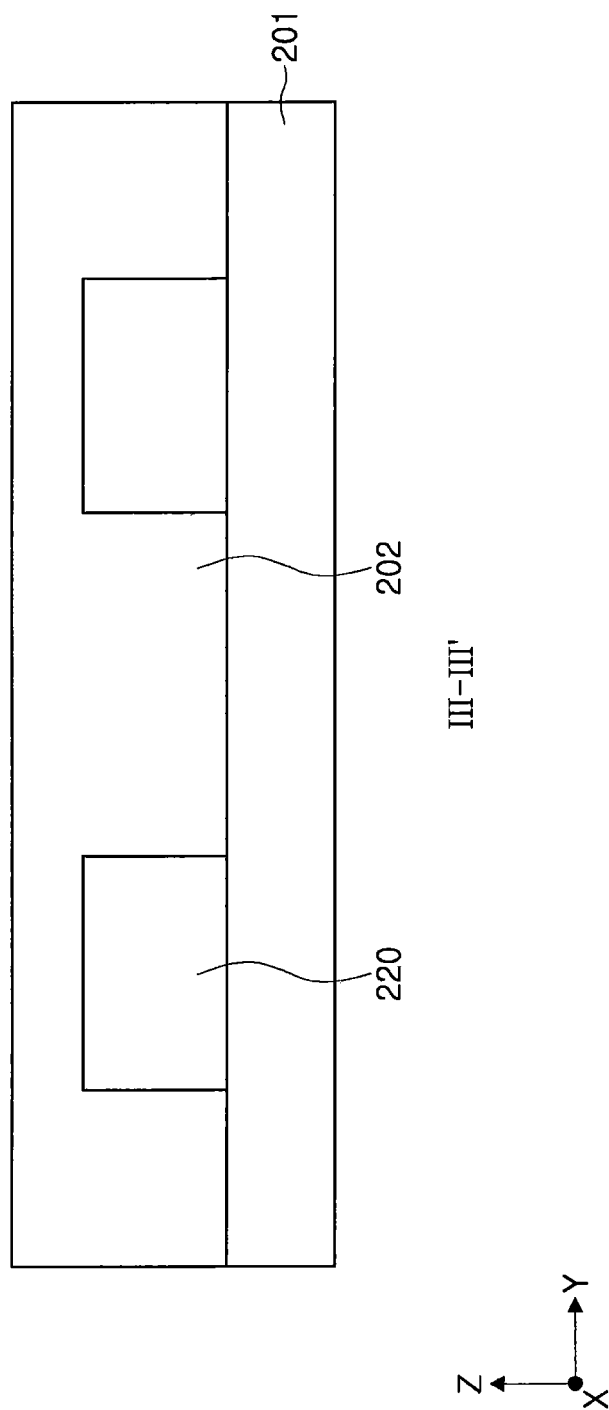
Figure 19C:
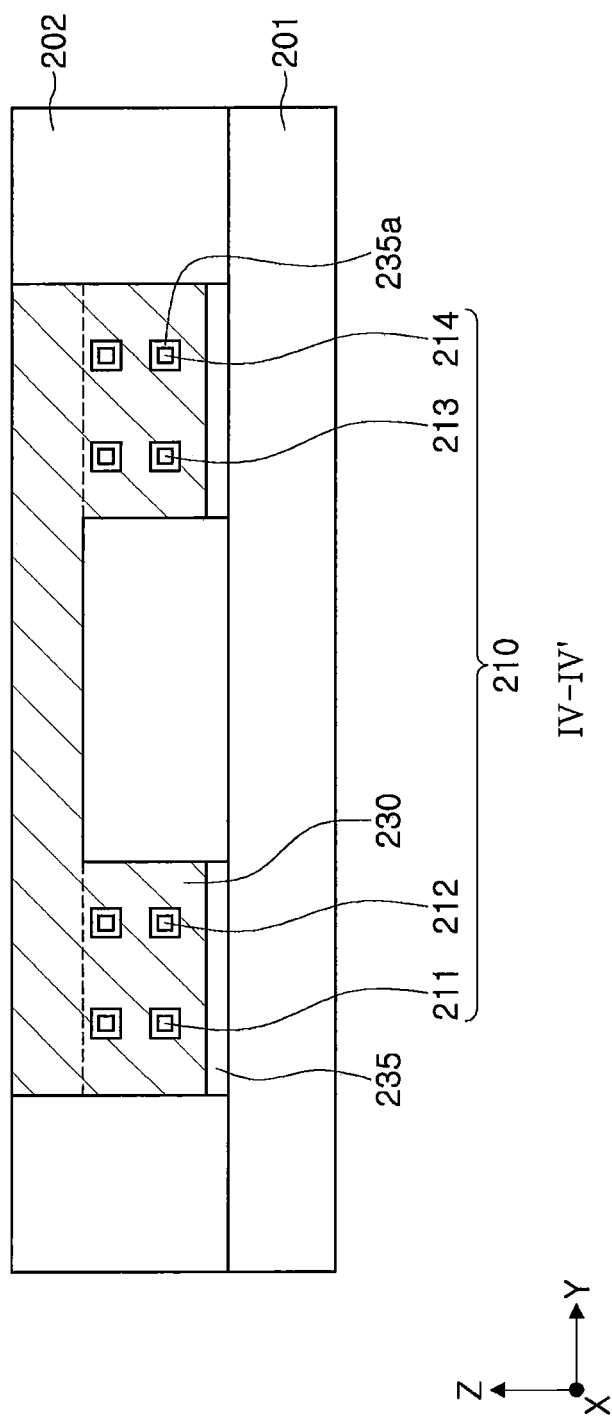

Referring to FIGS. 19B and 19C, the semiconductor substrate 201 may have the source/drain regions 220 and the gate electrode 230 formed thereon. The gate electrodes 230 may extend in a second direction (y-axis direction) and intersect the plurality of nanowires 211, 212, 213, and 214 extending in the first direction (x-axis direction). The plurality of nanowires 211, 212, 213, and 214 intersecting the gate electrodes 230 may be provided as the channel regions for an operation of a semiconductor element, e.g., a transistor. Thus, in order to form the channel regions, the gate insulating layers 235 and 235a may be formed between the gate electrodes 230 and the plurality of nanowires 211, 212, 213, and 214 and between the gate electrodes 230 and the semiconductor substrate 201. The first insulating layer 202 may be provided in peripheries of the gate electrodes 230 and the source/drain regions 220.

Figure 20A:
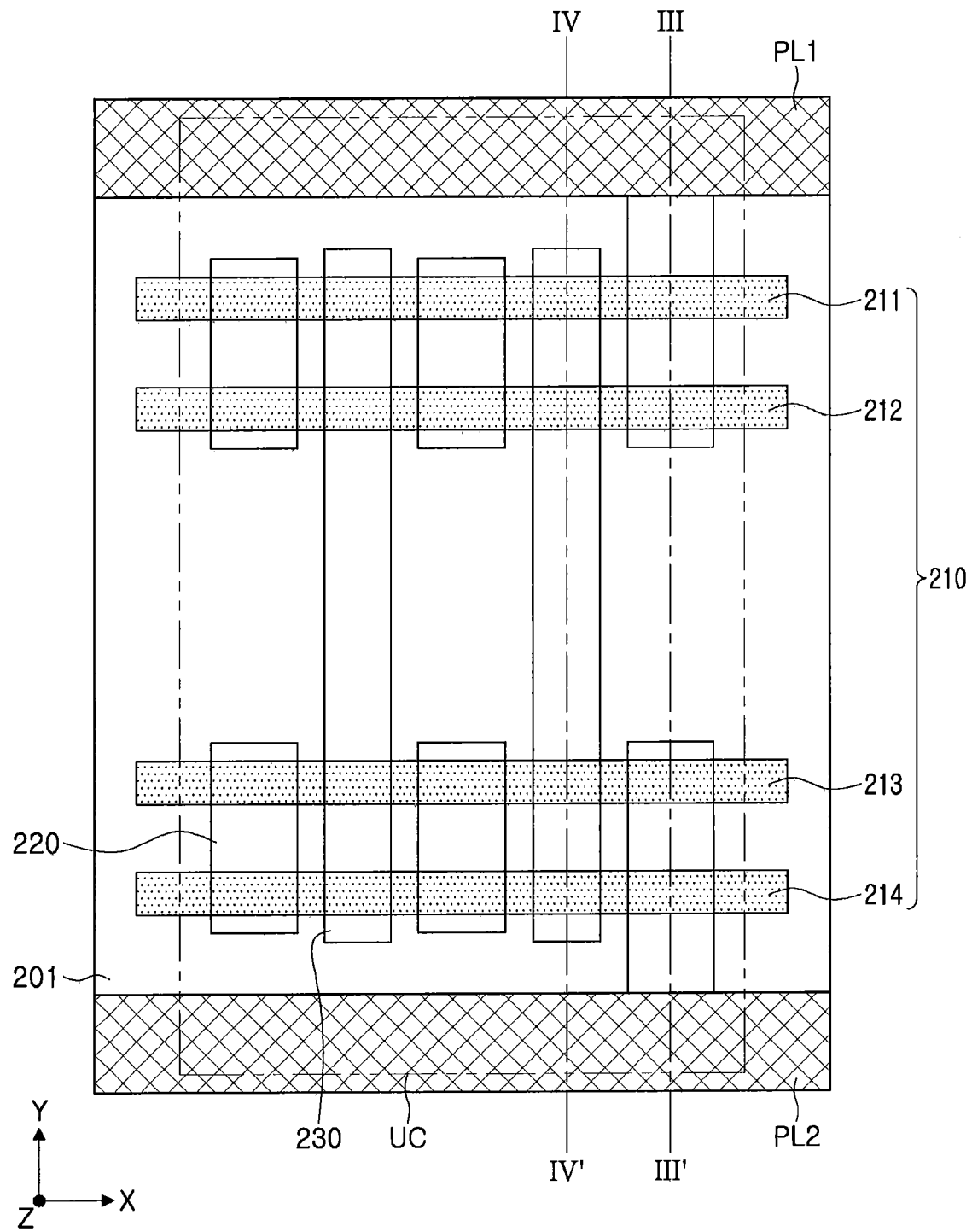
Figure 20B:
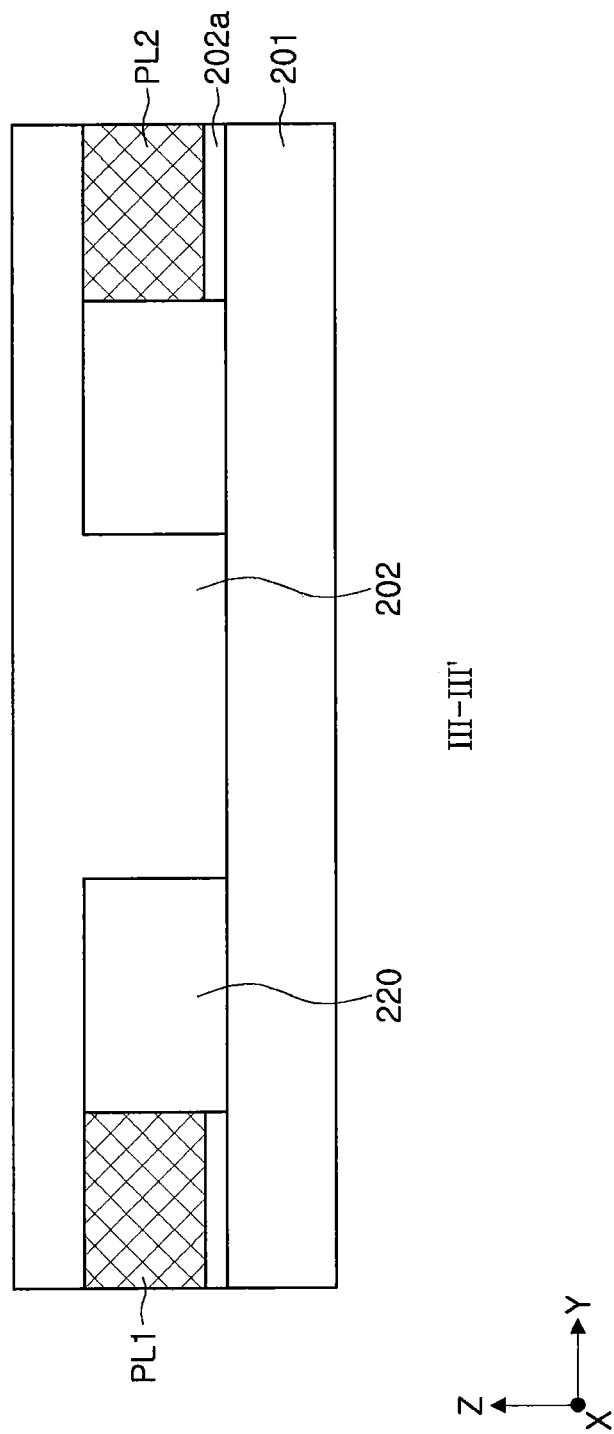
Figure 20C:
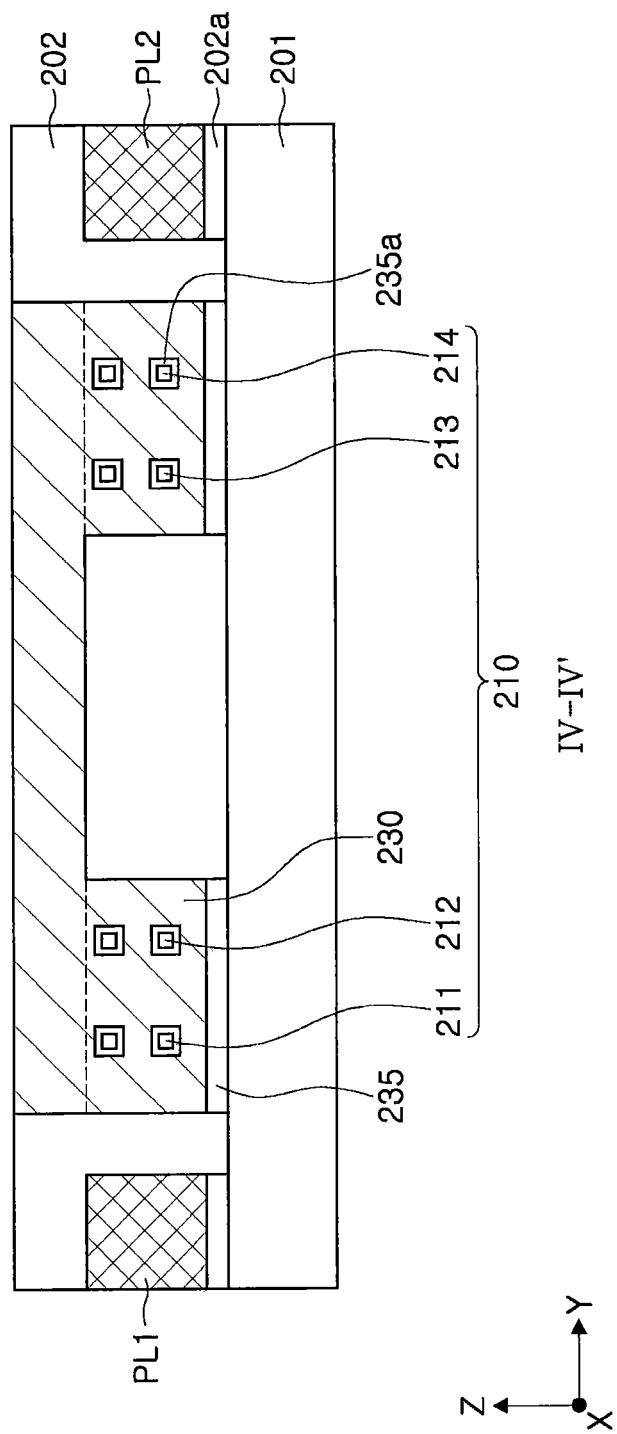

Referring now to FIGS. 20A through 20C, the power lines PL1 and PL2 may be formed. According to the embodiment of the present inventive concepts, to form the power lines PL1 and PL2, at least portions of the first insulating layer 202 may be removed and a metal or a metal compound may be disposed in a region from which the first insulating layer 202 is removed. The power lines PL1 and PL2 may be disposed in a region adjacent to the boundary of the unit cell region (UC), and may extend in the first direction (x-axis direction) as in the plurality of nanowires 211, 212, 213, and 214.

Referring to FIGS. 20B and 20C, the power lines PL1 and PL2 may be connected to the source/drain regions 220, and may be electrically separated from the semiconductor substrate 201 and the gate electrodes 230 by the first insulating layer 202 and 202a. For example, a power supply voltage VDD and a ground power supply voltage VSS supplied through the power lines PL1 and PL2 may be delivered to the source/drain regions 220. After forming the power lines PL1 and PL2, the first insulating layer 202 may be additionally formed thereon, and thus the first insulating layer 202 may be disposed on the top surface of the power lines PL1 and PL2.

Figure 21A:
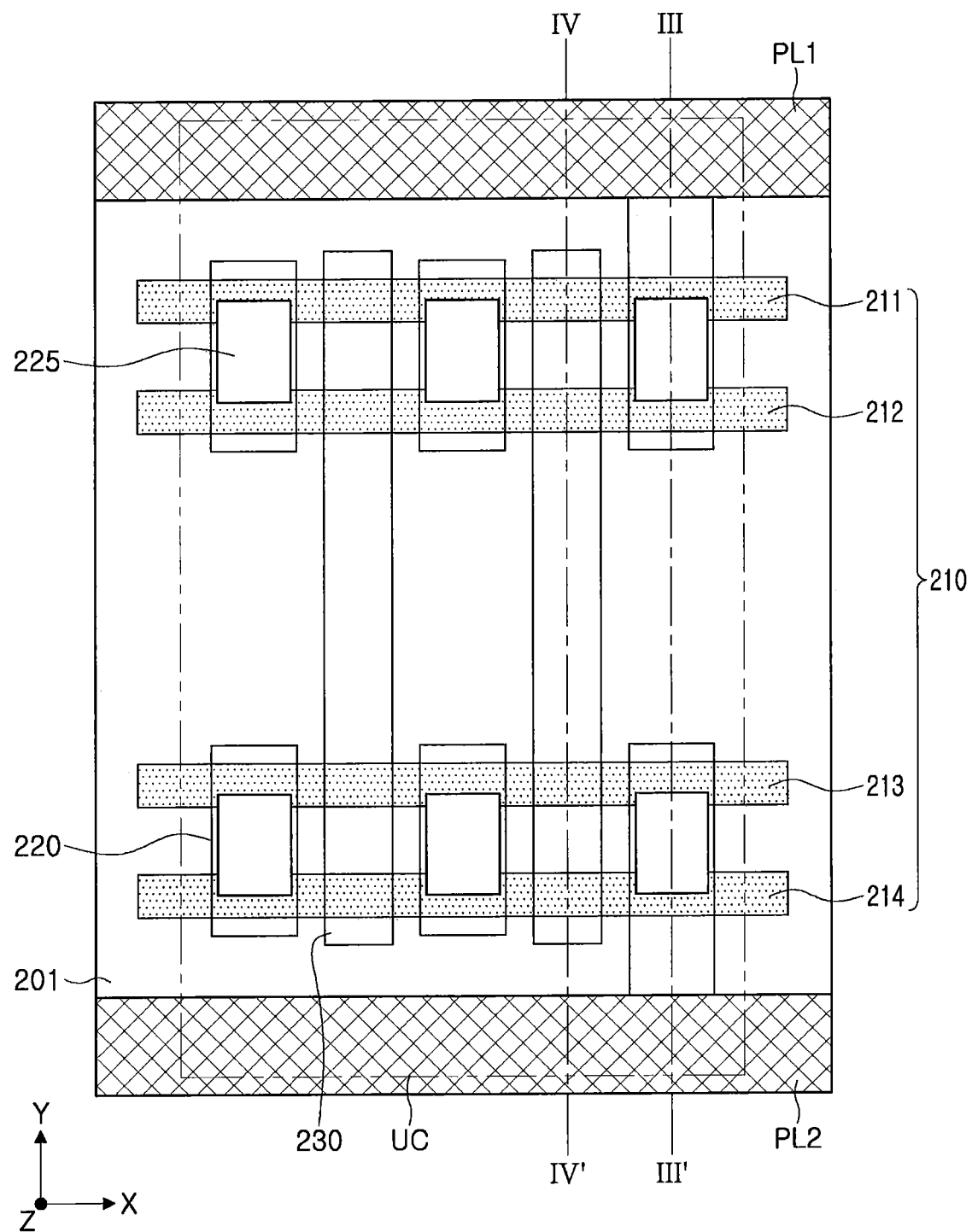
Figure 21B:
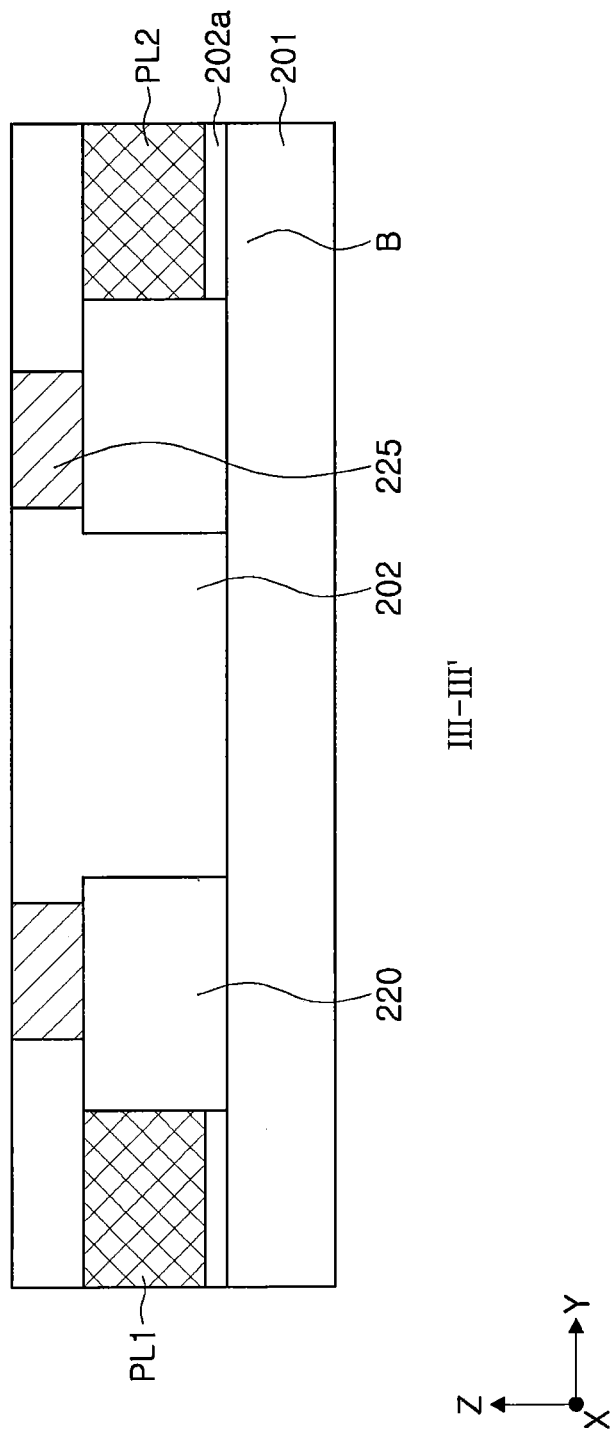
Figure 21C:
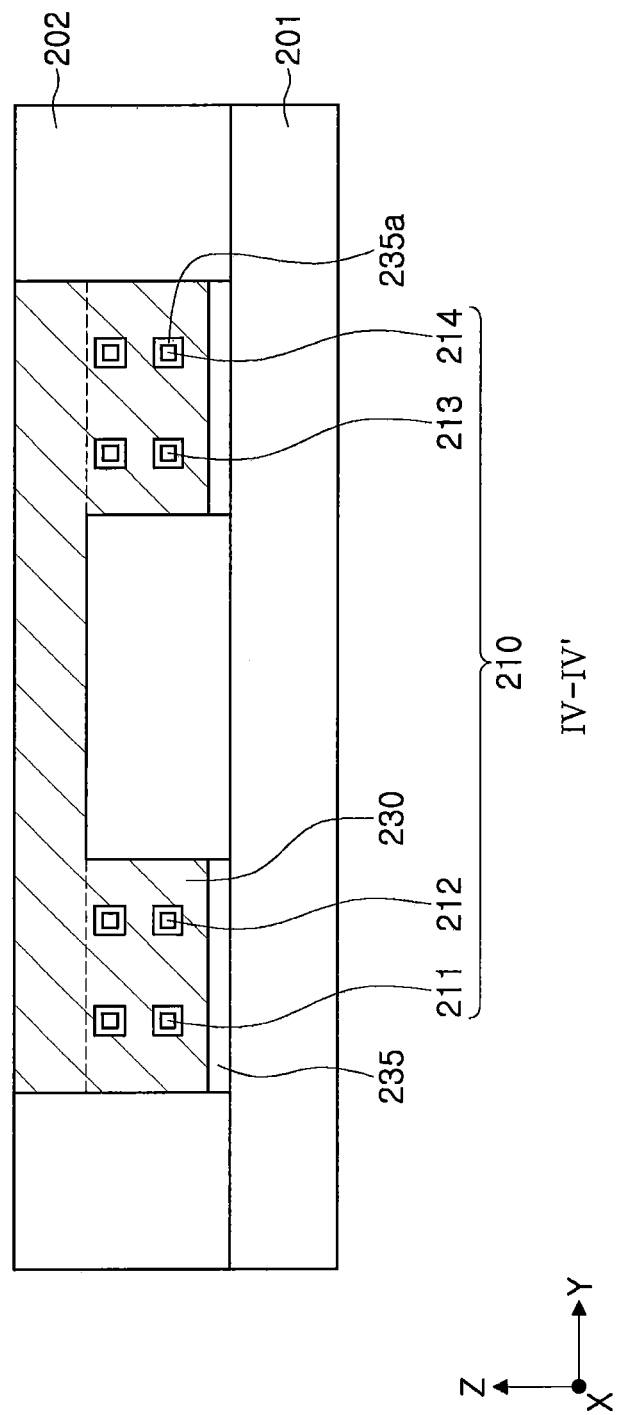

Referring to FIGS. 21A through 21C, the conductive layer 225 may be formed on the source/drain region 220. The conductive layer 225 may be formed by removing a portion of the first insulating layer 202 from the source/drain region 220 and then filling a region, from which the first insulating layer 202 is removed, with a metal or a metal silicide. After providing the metal or metal silicide, a polishing process, such as chemical mechanical polishing CMP, may be performed to remove regions of the first insulating layer 202, the conductive layer 225, and the gate electrodes 230 so that the top surfaces of the first insulating layer 202, the conductive layer 225, and the gate electrode 230 may form a coplanar surface.

Figure 22A:
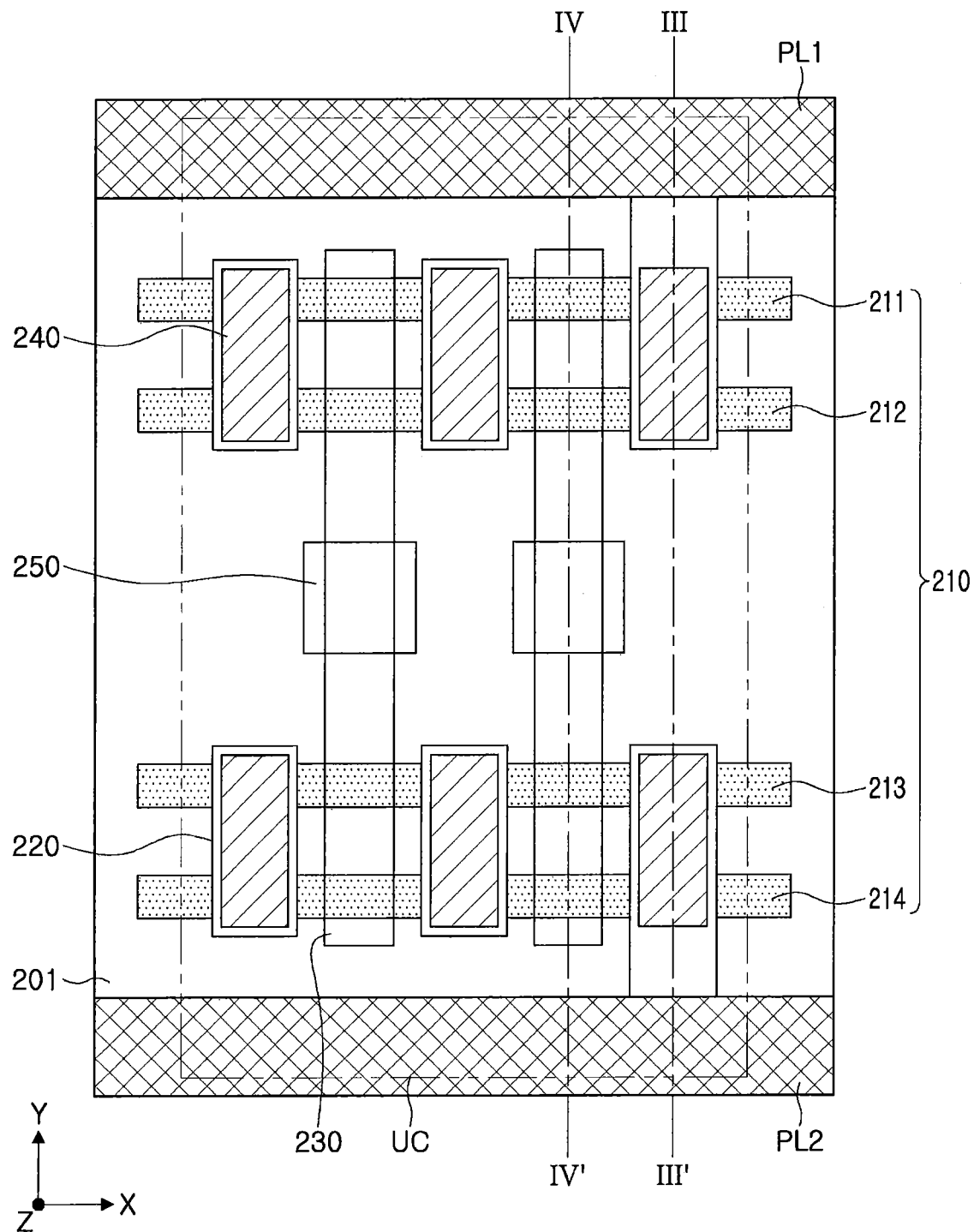
Figure 22B:
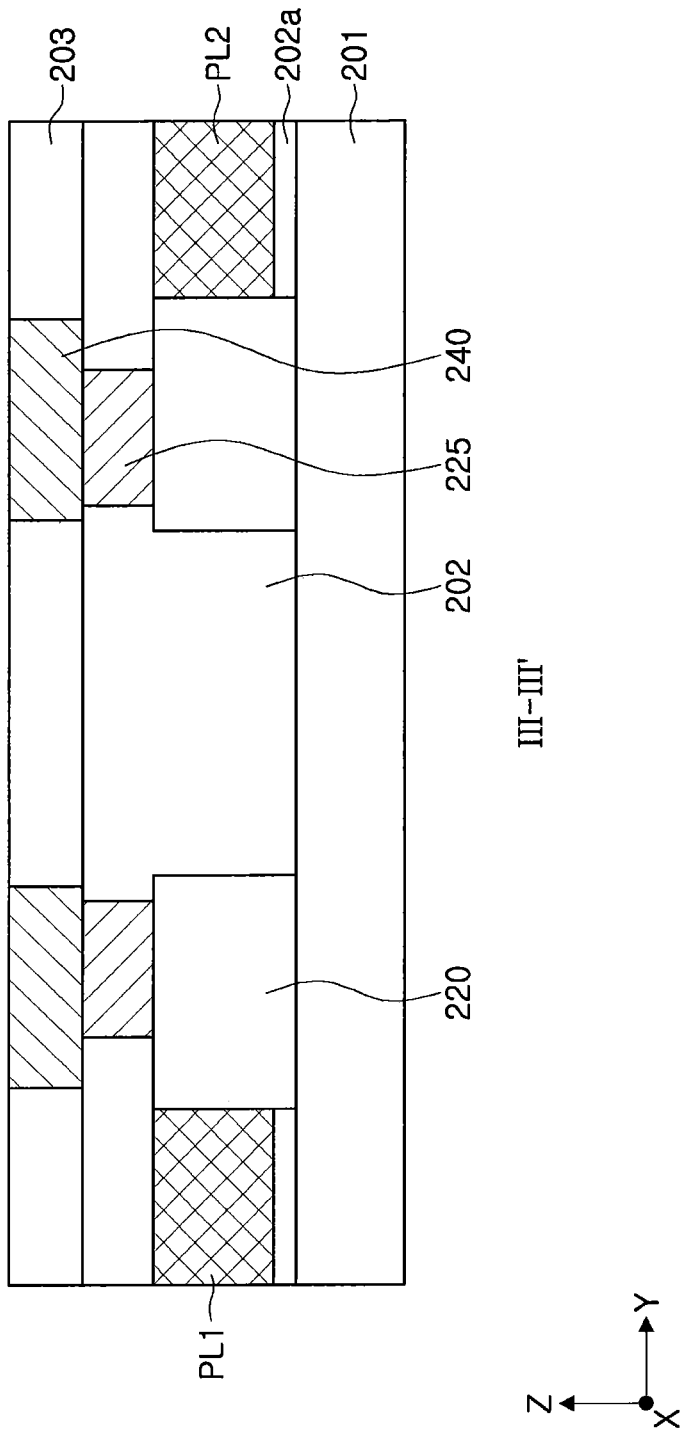
Figure 22C:
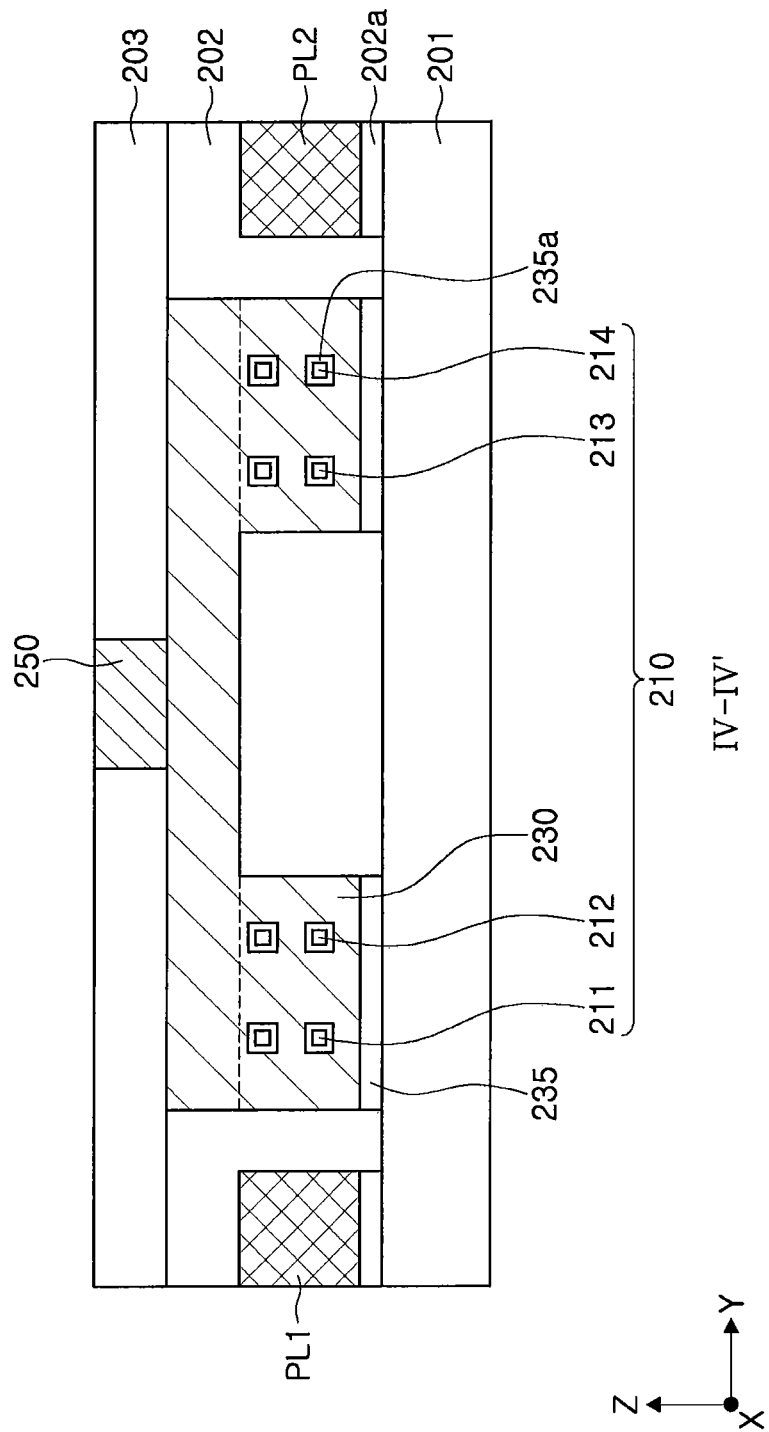

Referring now to FIG. 22A, the first and second contacts 240 and 250 may be formed on the source/drain regions 220 and the plurality of gate electrodes 230, respectively. According to some embodiments of the present inventive concepts, the first contacts 240 may be disposed on the top surface of the conductive layer 225, and the second contacts 250 may be disposed on the top surface of the gate electrodes 230. Referring to FIGS. 22B and 22C, the first and second contacts 240 and 250 may have the same thickness, and the second insulating layer 203 may be formed in a space between the first and second contacts 240 and 250. The first and second contacts 240 and 250 and the second insulating layer 203 may be defined as the second layer L2.

Figure 23A:
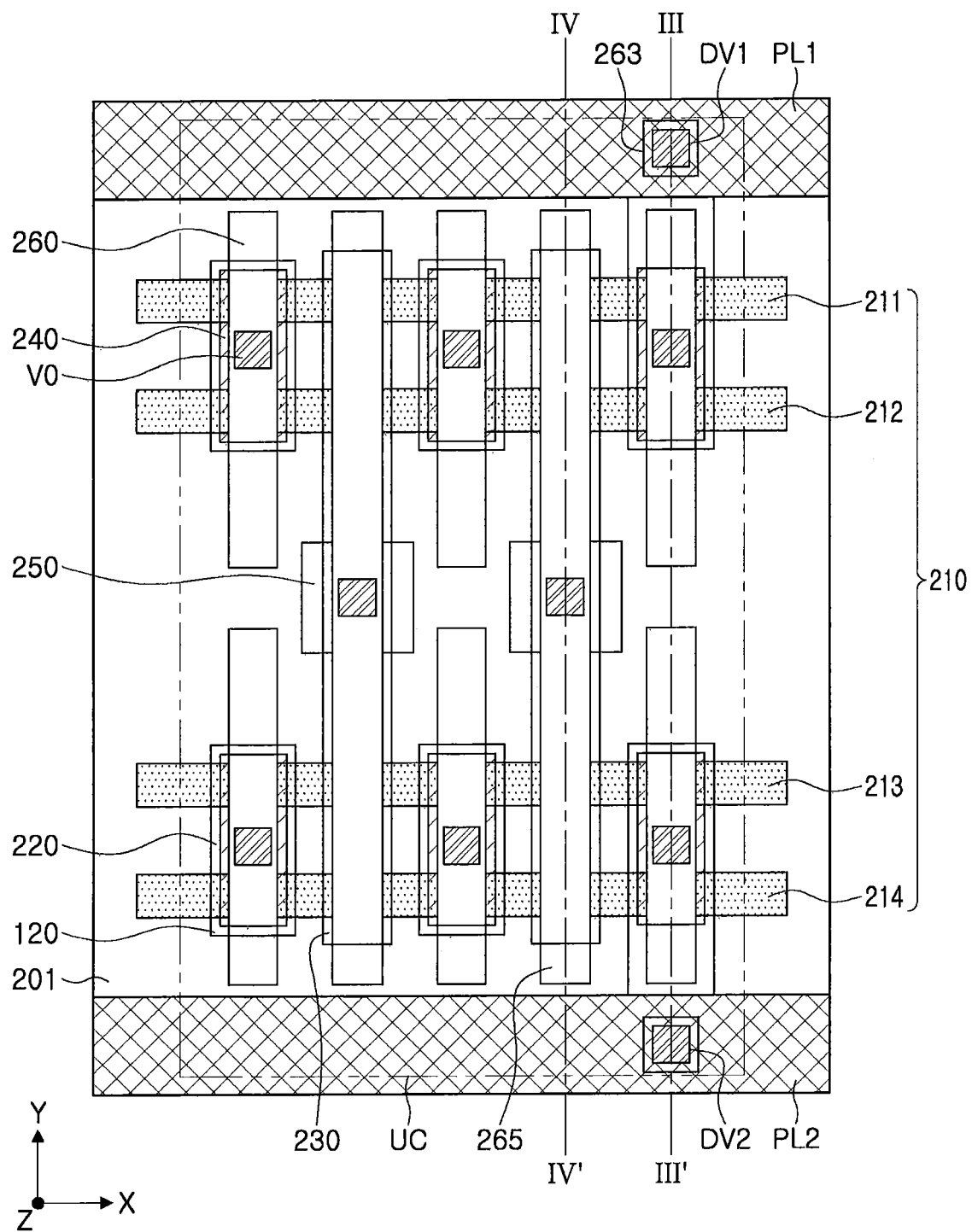
Figure 23B:
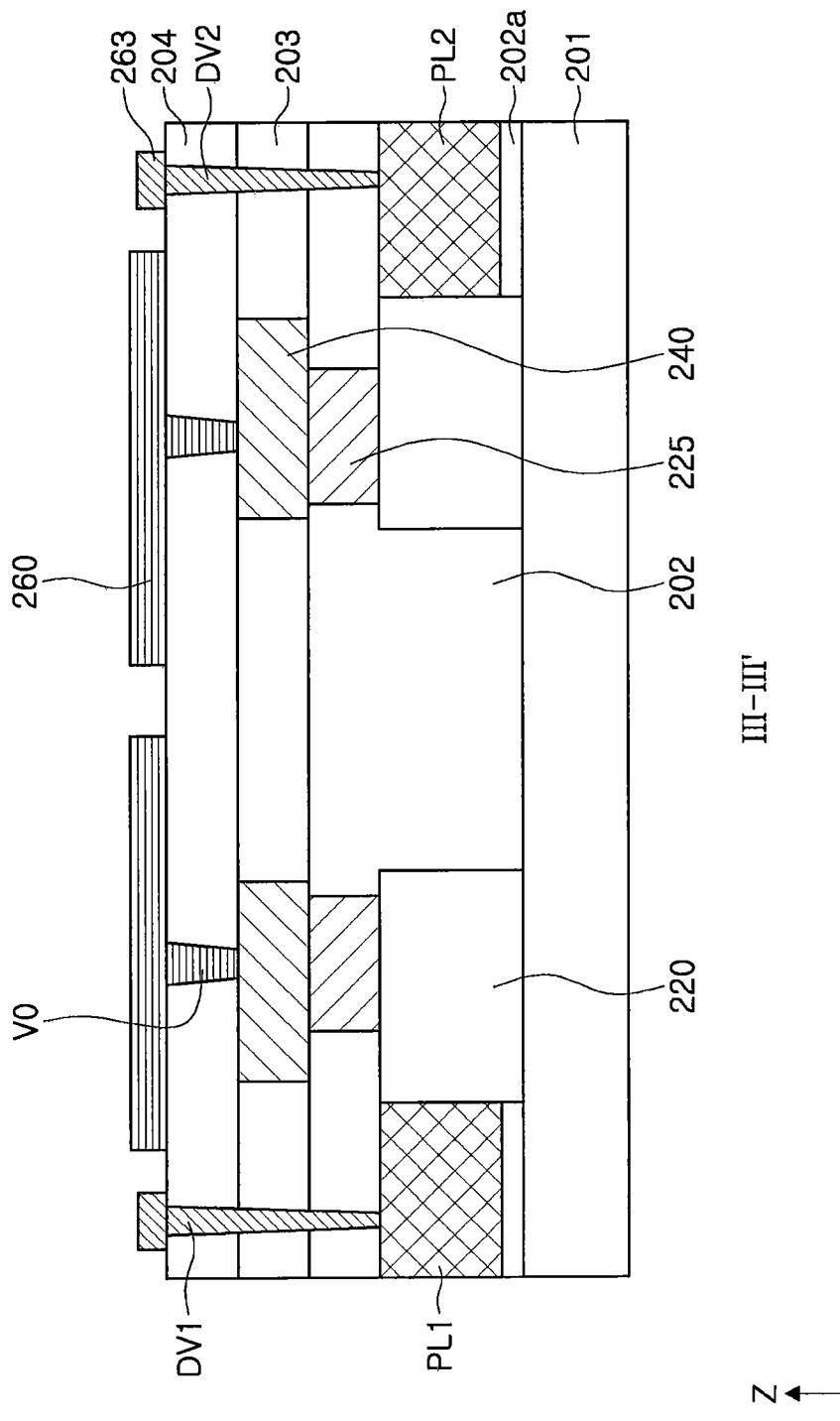
Figure 23C:
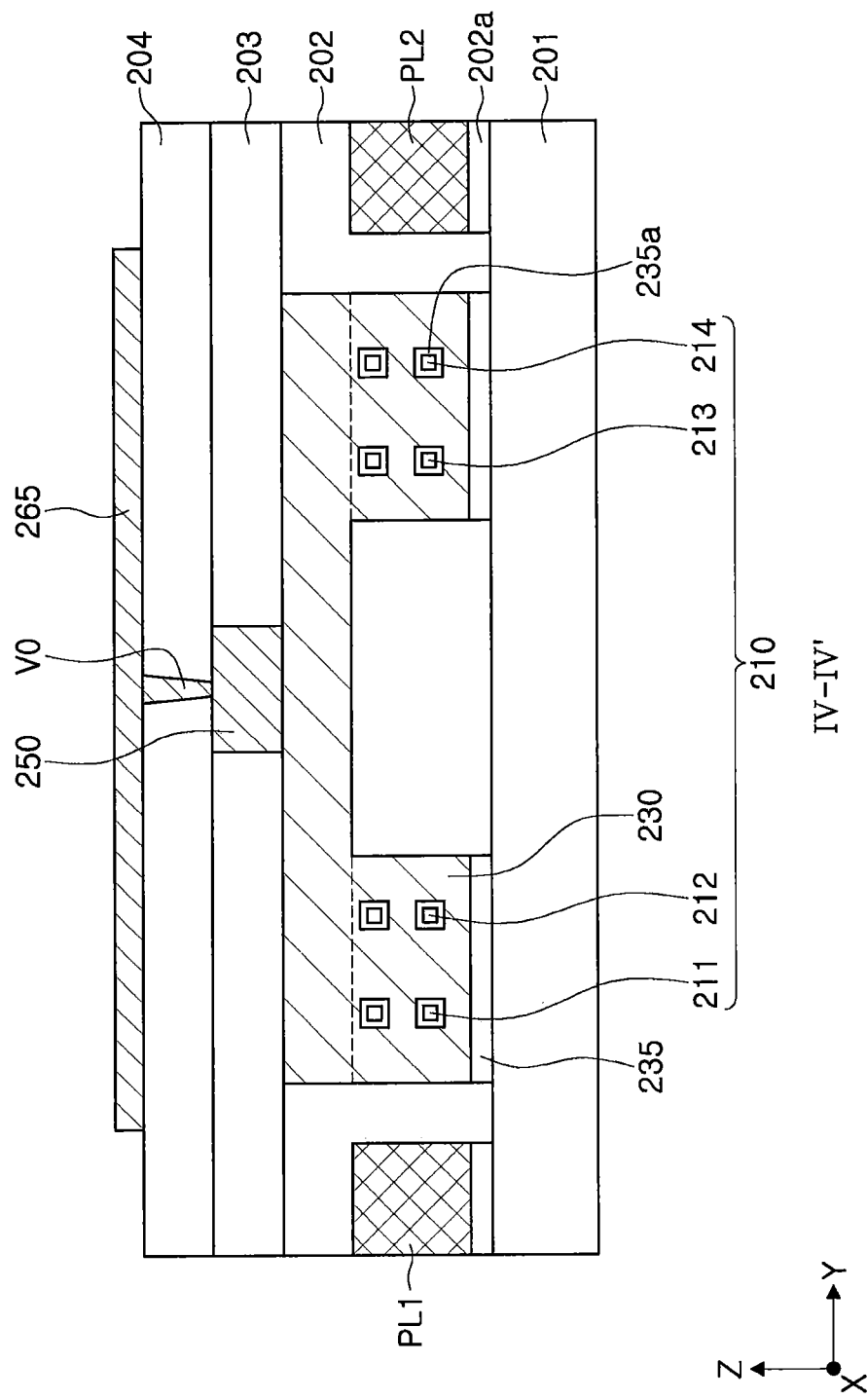

Referring to FIGS. 23A through 23C, the plurality of first conductive lines 260 and 265 and a first conductive line 263 may be formed on the third insulating layer 204. The third insulating layer 204 may contain an oxide or a nitride, may be formed on the top surface of the second layer L2, and may have the plurality of first conductive lines 260 and 265 formed thereon. Portions of the plurality of first conductive lines 260 may be electrically connected to the source/drain regions 220 through the first contacts 240, and the first conductive lines 265 may be electrically connected to the gate electrodes 230 through the second contacts 250. The third insulating layer 204 may have the first via V0 formed therein to connect the plurality of first conductive lines 260 to at least one of the first and second contacts 240 and 250. In addition, the power lines PL1 and PL2 may be connected to portions of the first conductive lines 263 through the deep vias DV1 and DV2. The first conductive lines 263 connected to the power lines PL1 and PL2 may have a pad shape.

Referring now to 24A through 24C, the plurality of second conductive lines 270 may be formed on the fourth insulating layer 205. The plurality of second conductive lines 270 may be disposed on the power lines PL1 and PL2, and may extend in the first direction (x-axis direction) as in the power lines PL1 and PL2. To supply a power supply voltage VDD or a ground power supply voltage VSS to the power lines PL1 and PL2 through the plurality of second conductive lines 270, the second vias VI may be formed between the second conductive lines 270 and portions of the plurality of first conductive lines 263, respectively.

Figure 24A:
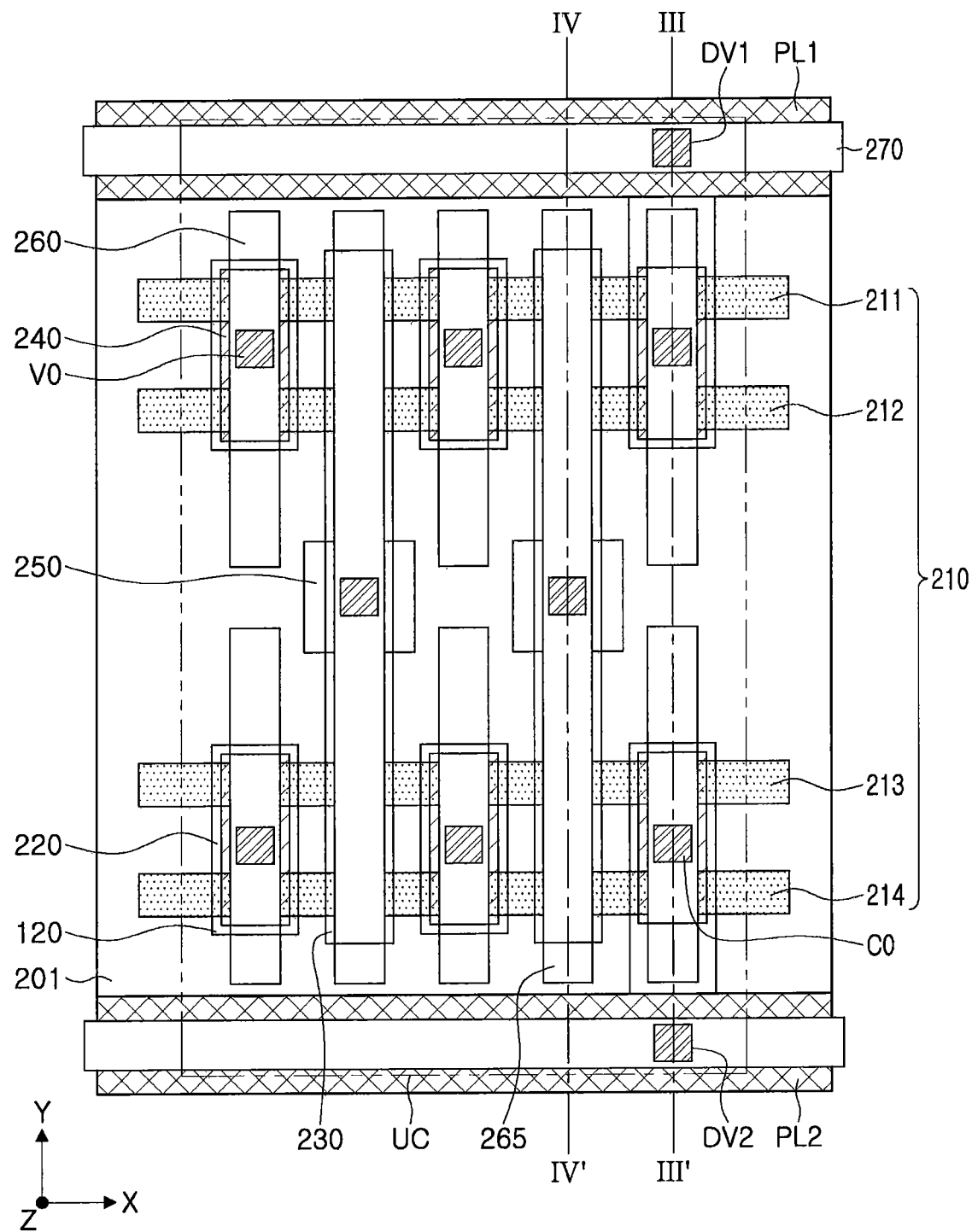
Figure 24B:
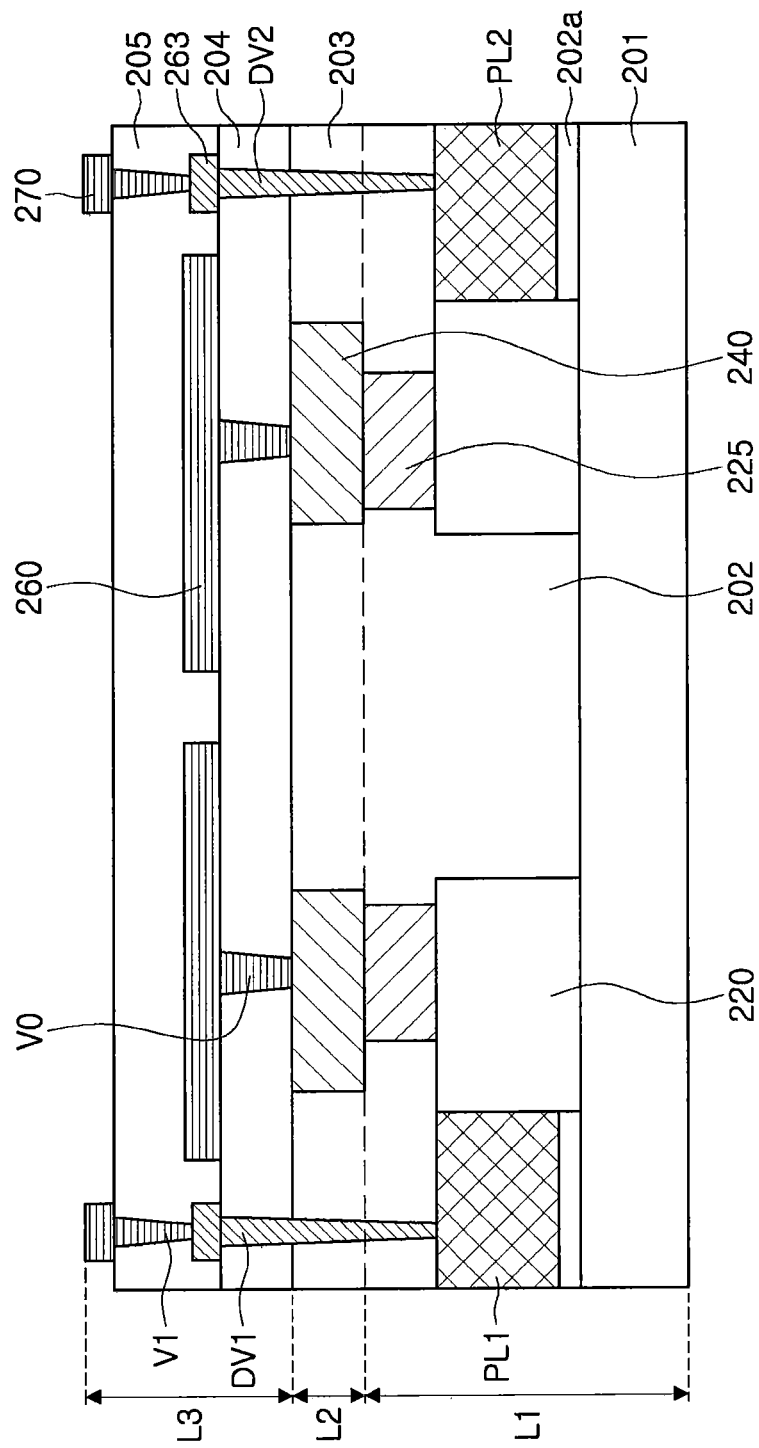
Figure 24C:
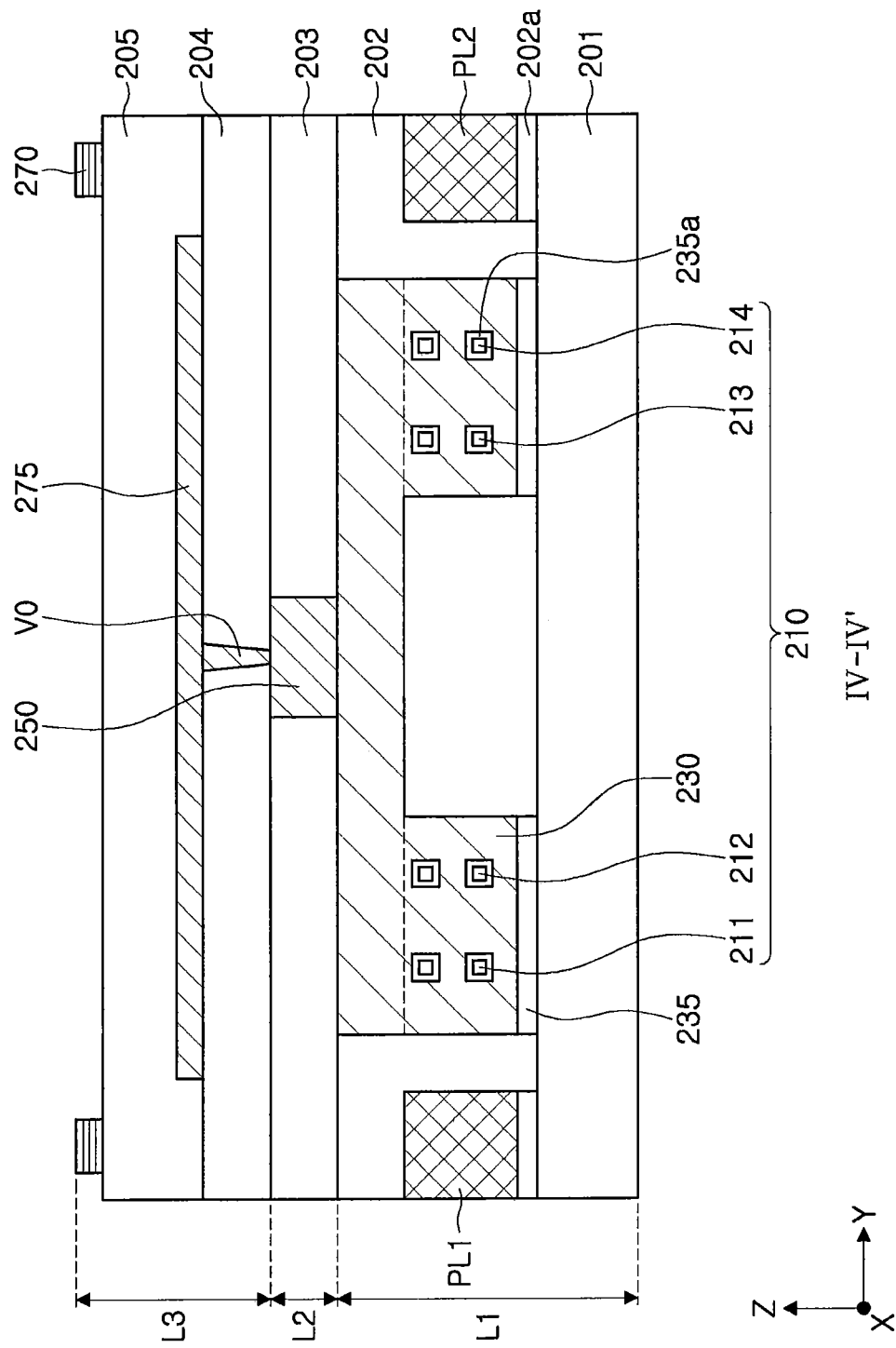

Referring to FIGS. 24B and 24C, the deep vias DV1 and DV2 may connect the respective power lines PL1 and PL2 to different second conductive lines 270 through the second vias V1 and the portions of the first conductive lines 263 having a pad shape, and may pass through the second and third insulating layers 203 and 204. Since the deep vias DV1 and DV2 may be relatively longer than the first via V0, the deep vias may have a tapered shape of which a width of a cross section becomes narrower in a longitudinal direction (z-axis direction). On the other hand, according to another embodiment of the present inventive concepts, the second conductive lines 270 may be directly connected to the power lines PL1 and PL2 through the deep vias DV1 and DV2 without the portions of the first conductive lines 263, and the second vias V1.

The semiconductor device 100 manufactured by the manufacturing method described with reference to FIGS. 13 through 18 may have the power lines PL1 and PL2 disposed in the second layer L2 along with the first and second contacts 140 and 150. In addition, the semiconductor device 200 manufactured by the manufacturing method described with reference to FIGS. 19 through 24 may have the power lines PL1 and PL2 provided on the semiconductor substrate 201 in the first layer L1 to be directly connected to the source/drain regions 220. For example, according to some embodiments of the present inventive concepts, since the power lines PL1 and PL2 may be formed between the semiconductor substrate 101 and the plurality of conductive lines 160, 170, and 175 and between the semiconductor substrate 201 and the plurality of conductive lines 260, 265, and 270, respectively, interference between the power lines PL1 and PL2 and the plurality of conductive lines 160, 170, and 175, and between the power lines PL1 and PL2 and the plurality of conductive lines 260, 265, and 270 may be reduced, respectively. Thus, the height of the unit cell region (UC) may be reduced while improving the degree of freedom of design of the plurality of conductive lines 160, 170, 175, 260, 265, and 270, and thus the degree of integration of the semiconductor elements may be improved.

Figure 25:
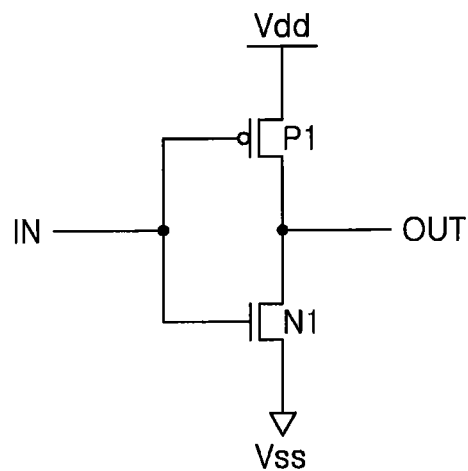
FIG. 25 is a circuit diagram of an inverter to which a semiconductor device according to some embodiments of the present inventive concepts may be applied.

FIG. 25 is a circuit diagram of an inverter to which a semiconductor device according to some embodiments of the present inventive concepts may be applied. In particular, the inverter illustrated in FIG. 25 may be a complementary metal oxide semiconductor (CMOS) inverter.

Referring to FIG. 25, the CMOS inverter may include a P-type metal oxide semiconductor (PMOS) field effect transistor P1 and an N-type metal oxide semiconductor (NMOS) field effect transistor N1. The PMOS and NMOS field effect transistors may be connected in series in a space between a power supply voltage VDD line and a ground power supply voltage VSS line, and gates of the PMOS and NMOS field effect transistors may receive an identical input signal. Further, drains of the PMOS and NMOS field effect transistors may output an identical output signal. The CMOS inverter may invert an input signal IN and output an output signal OUT. In other words, when a 'high' logical value is input as an input signal of the inverter, a 'low' logical value may be output as an output signal and vice versa. Methods of connecting the PMOS and NMOS field effect transistors to the power supply voltage VDD line and the ground power supply voltage VSS line may be performed according to various embodiments of the present inventive concepts as described above.

Figure 26:
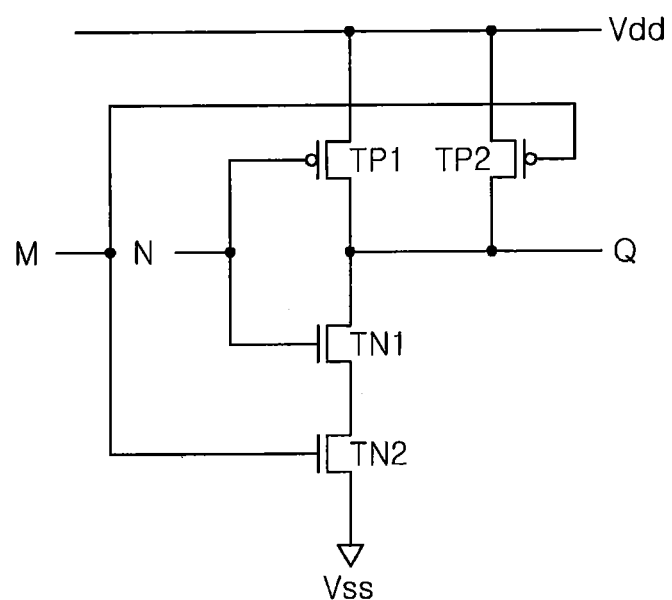
FIG. 26 is a circuit diagram of an NAND gate cell to which a semiconductor device according to some embodiments of the present inventive concepts may be applied.

FIG. 26 is a circuit diagram of an NAND gate cell to which a semiconductor device according to some embodiments of the present inventive concepts may be applied.

Referring to FIG. 26, the NAND gate cell may be configured to receive two input signals M and N and output a signal upon which an NAND operation is performed. The NAND gate cell may include a PMOS field effect transistor TP1 sending a 'high' logical value to an output terminal Q when an input signal M has a 'low' logical value, NMOS field effect transistors TN1 and TN2 being turned on, respectively, and sending a 'low' logical value to the output terminal Q when all of the input signals M and N have a 'high' logical value, and a PMOS field effect transistor TP2 sending a 'high' logical value to the output terminal Q when the input signal N has a 'low' logical value.

Operation of the NAND gate by the above configuration allows the PMOS field effect transistors TP1 and TP2 to be turned off and the NMOS field effect transistors TN1 and TN2 to be turned on to output a 'low' logical value to the output terminal Q when all of the input signals M and N have a 'high' logical value, and allows the PMOS field effect transistors TP1 and TP2 to be turned on and the NMOS field effect transistors TN1 and TN2 to be turned off to output a 'high' logical value to the output terminal Q when all of the input signals M and N have a 'low' logical value. Methods of connecting the PMOS and NMOS field effect transistors to the power supply voltage VDD line and the ground power supply voltage VSS line may be performed according to various embodiments of the present inventive concepts as described above.

Figure 27:
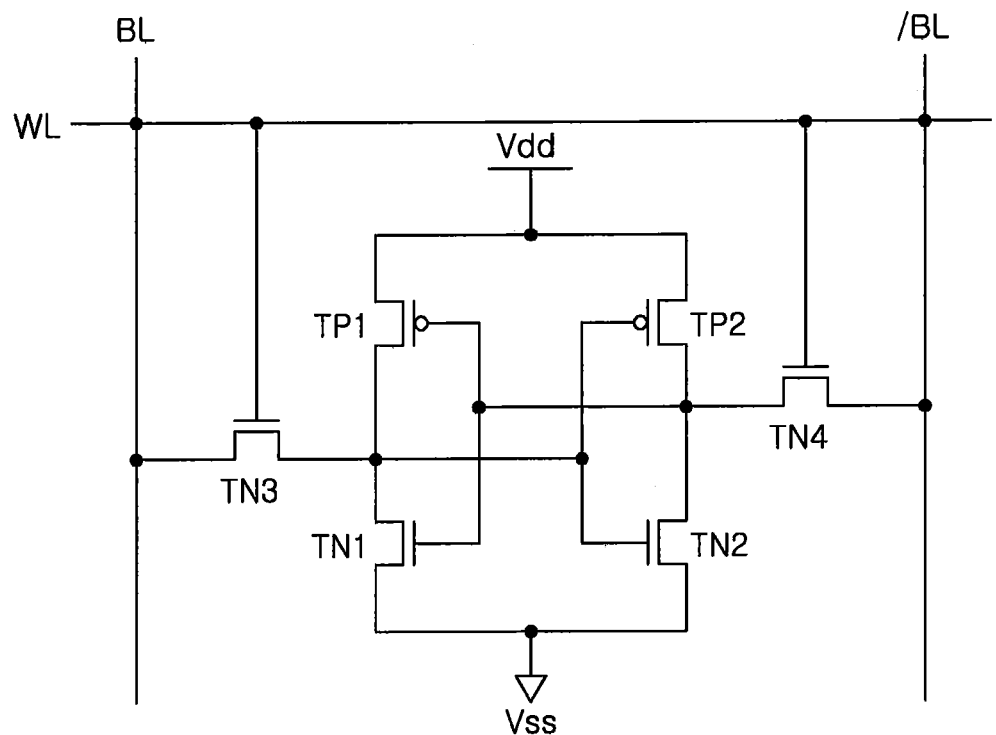
FIG. 27 is a circuit diagram of an SRAM cell to which a semiconductor device according to some embodiments of the present inventive concepts may be applied.

FIG. 27 is a circuit diagram of an SRAM cell to which a semiconductor device according to some embodiments of the present inventive concepts may be applied.

Referring to FIG. 27, the SRAM cell may include a first pull-down transistor TN1, a second pull-down transistor TN2, a first pull-up transistor TP1, a second pull-up transistor TP2, a first pass transistor TN3, and a second pass transistor TN4. Here, sources from the first and second pull-down transistors TN1 and TN2 may be connected to a ground power supply voltage VSS line, and sources from the first and second pull-up transistors TP1 and TP2 may be connected to the power supply voltage VDD line.

The first pull-down transistor TN1 including an NMOS field effect transistor and the first pull-up transistor TP1 including a PMOS field effect transistor may be connected in series to configure a first inverter, and the second pull-down transistor TN2 including an NMOS field effect transistor and the second pull-up transistor TP2 including a PMOS field effect transistor may be connected in series to configure a second inverter. An output terminal of the first inverter may be connected to a source of the first pass transistor TN3, and an output terminal of the second inverter may be connected to a source of the second pass transistor TN4. The first and second inverters may also be connected by intersecting or coupling the input terminal with the output terminal so as to configure a latch circuit. Drains of the first and second pass transistors TN3 and TN4 may be connected to a first bit line BL and a second bit line /BL, respectively. Gates of the first and second pass transistors TN3 and TN4 may be connected to a word line WL. Methods of connecting the first and second pull-down transistors, the first and second full-up transistors, and the first and second pass transistors to the power supply voltage VDD line and the ground power supply voltage VSS line may be performed according to various embodiments of the present inventive concepts as described above.

Figure 28:
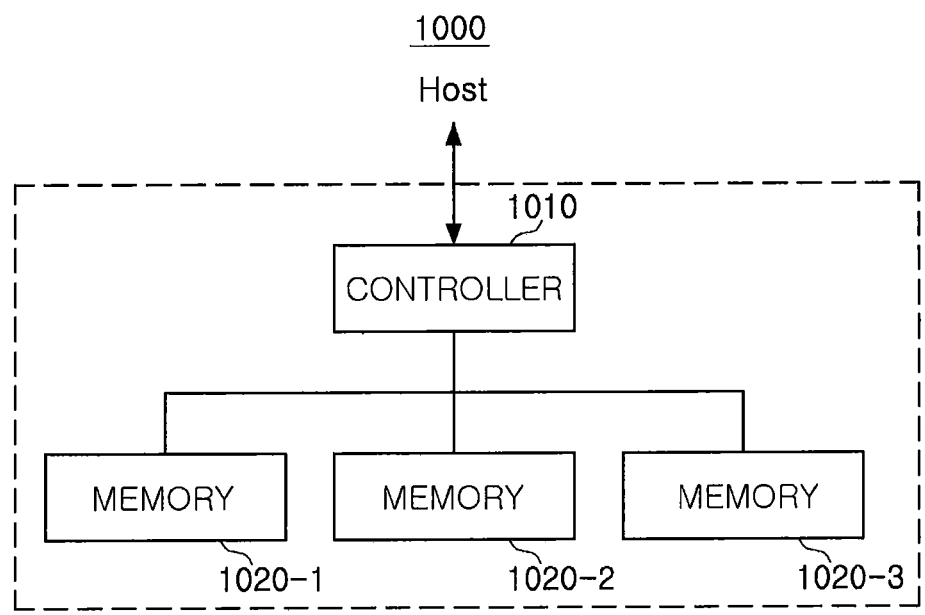
FIG. 28 is a block diagram of a storage device including a semiconductor device according to some embodiments of the present inventive concepts.

FIG. 28 is a block diagram of a storage device including a semiconductor device according to some embodiments of the present inventive concepts.

Referring to FIG. 28, a storage device 1000 according to the embodiment of the present inventive concepts may include a controller 1010 communicating with a host and memories 1020-1, 1020-2, and 1020-3 storing data. The host communicating with the controller 1010 may be various types of electronic device equipped with the storage device 1000, e.g., a smartphone, a digital camera, a desktop PC, a laptop PC, a portable media player, or the like. The controller 1010 may receive a data write or read request sent from the host, and may store data in the memories 1020-1, 1020-2, and 1020-3 or generate a command CMD for retrieving data from the memories 1020-1, 1020-2, and 1020-3. The controller 1010 or the memories 1020-1, 1020-2, and 1020-3 may include a semiconductor device according to various embodiments of the present inventive concepts. As illustrated in FIG. 27, at least one of the memories 1020-1, 1020-2, and 1020-3 may be connected to the controller 1010 in parallel in the storage device 1000. By connecting the plurality of memories 1020-1, 1020-2, and 1020-3 to the controller 1010 in parallel, the storage device 1000 having a large capacity may be implemented, such as a solid state drive (SSD).

Figure 29:
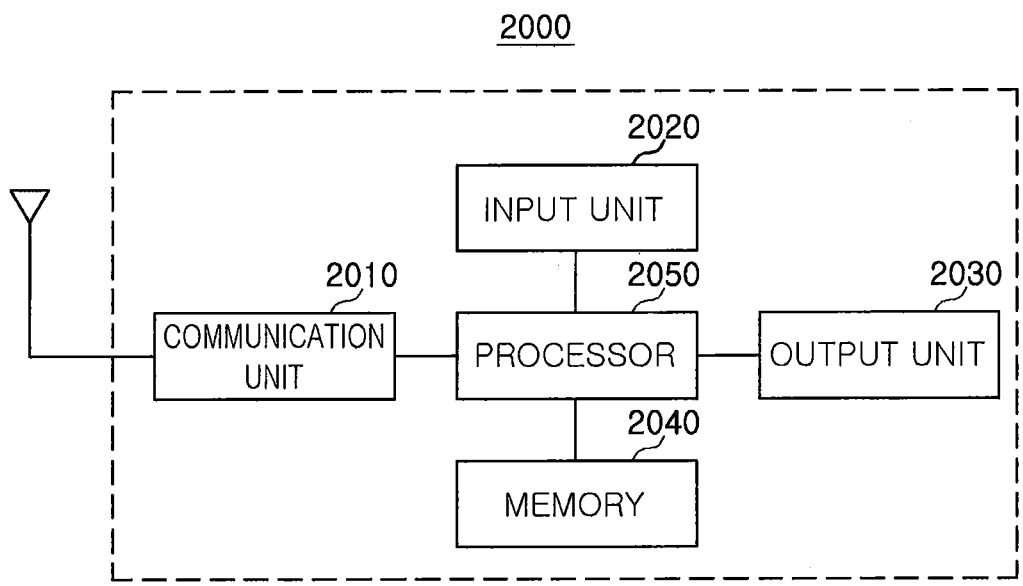
FIG. 29 is a block diagram of an electronic device including a semiconductor device according to some embodiments of the present inventive concepts.

FIG. 29 is a block diagram of an electronic device including a semiconductor device according to some embodiments of the present inventive concepts.

Referring to FIG. 29, an electronic device 2000 according to embodiments of the present inventive concepts may include a communication unit 2010, an input unit 2020, an output unit 2030, a memory 2040, and a processor 2050. The communication 2010 may include wired/wireless communication modules, e.g., a wireless Internet module, a local communications module, a GPS module, a module communications module, and the like. The wired/wireless communication module included in the communication unit 2010 may be connected to an external communication network based on various communication standards to transmit and receive data. The input unit 2020 may include a mechanical switch, a touch screen, a voice recognition module, or the like, as a module provided for a user to control operation of the electronic device 2000. In addition, the input unit 2020 may include a finger mouse device, or a mouse operating based on a track ball or laser pointer, and may further include various sensor modules which enable a user to input data. The output unit 2030 may output information processed by the electronic device 2000 in audio or video format, and the memory 2040 may store programs for processing and control of the processor 2050, or data. The processor 2050 may send an instruction to the memory 2040 depending on a required action to store or retrieve data therefrom. The memory 2040 may be embedded in the electronic device 2000, or may communicate with the processor 2050 through a separate interface. When the memory 2040 communicates with the processor 2050 through the separate interface, the processor 2050 may store or retrieve data from the memory 2040 through various interface standards, such as SD, SDHC, SDXC, Micro SD, USB, and the like. The processor 2050 controls operation of one or more components included in the electronic device 2000. The processor 2050 may perform control and processing associated with a voice call, a video call, data communications, or the like, or carry out control and processing for multimedia reproduction and management. The processor 2050 may also process an input entered by a user through the input unit 2020 and output the result through the output unit 2030. The processor 2050 may also store or retrieve data to control operation of the electronic device 2000 from the memory 2040 as described above. At least one of the processor 2050 and the memory 2040 may include a semiconductor device according to various embodiments of the present inventive concepts as described above.

Figure 30:
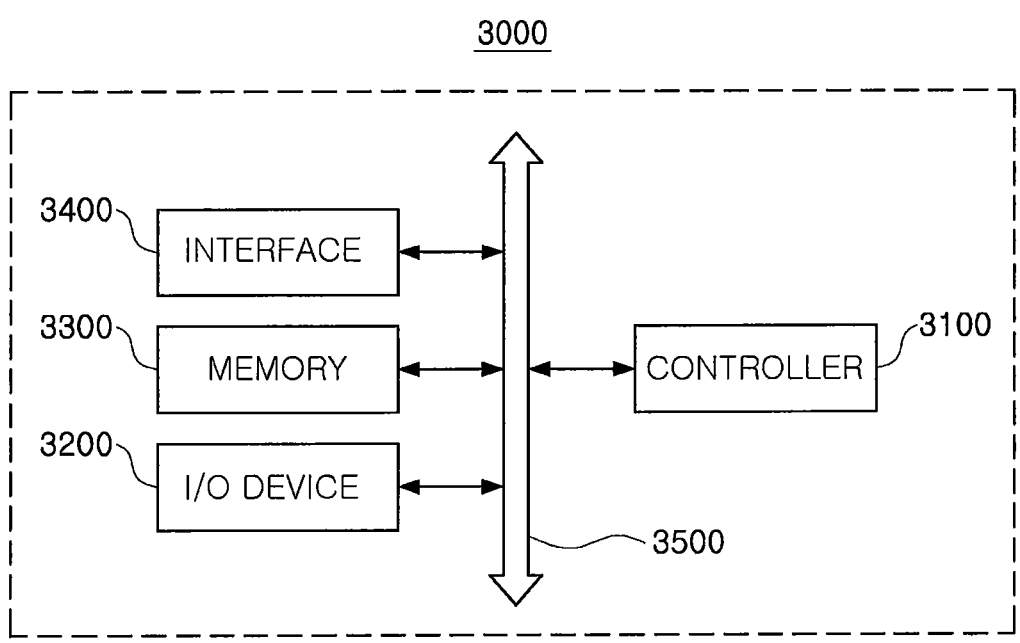
FIG. 30 is a block diagram of a system including a semiconductor device according to some embodiments of the present inventive concepts.

FIG. 30 is a block diagram of a system including a semiconductor device according to some embodiments of the present inventive concepts.

Referring to FIG. 30, a system 3000 may include a controller 3100, an I/O (Input/Output) device 3200, a memory 3300, and an interface 3400. The system 3000 may be a mobile system, or a system transmitting or receiving information. The mobile system may be a personal digital assistant (PDA), a portable computer, a tablet PC, a wireless phone, a mobile phone, a digital music player, a memory card or the like. The controller 3100 may function to execute a program and control the system 3000. The controller 3100 may be, for example, a microprocessor, a digital signal processor, a microcontroller, or devices similar thereto. The I/O device 3200 may be used to input or output data stored in the system 3000. The system 3000 may employ the I/O device 3200 to connect to an external device, such as, a personal computer or network, thus communicating data with the external device. The I/O device 3200 may be, for example, a keypad, a keyboard, or a display. The memory 3300 may store a code or data for operation of the controller 3100 or store data processed by the controller 3100. The interface 3400 may be a data transfer path between the system 3000 and another external device. The controller 3100, the I/O device 3200, the memory 3300, and the interface 3400 may communicate with each other using a bus 3500. At least one of the controller 3100 and the memory 3300 may include a semiconductor device according to various embodiments of the present inventive concepts as described above.

As set forth above, according to some embodiments of the present inventive concepts, a power line supplying a power supply voltage may be disposed between a semiconductor substrate and a plurality of conductive lines, and thus interference between the plurality of conductive lines may be reduced and the number of contacts respectively connected to the plurality of conductive lines may be increased. Resultantly, a degree of integration of semiconductor elements may be improved while reducing an area of a cell.

While embodiments have been shown and described above, it will be apparent to those skilled in the art that modifications and variations could be made without departing from the scope of the present disclosure as defined by the appended claims.

What is claimed is:

1. A semiconductor device comprising:
   a plurality of active regions including channel regions extending in a first direction on a semiconductor substrate and source/drain regions connected to the channel regions;
   a plurality of gate electrodes extending in a second direction different from the first direction to intersect the channel regions;
   a plurality of contacts that is disposed in a layer and is connected to at least one of the source/drain regions and the gate electrodes; and
   a power line that is disposed in the layer in which at least one of the plurality of contacts is disposed, and is configured to supply a power voltage,
   wherein the power line is laterally connected to at least one of the plurality of contacts in the layer.

2. The semiconductor device of claim 1, further comprising a plurality of conductive lines disposed on the plurality of contacts, wherein the plurality of conductive lines comprises a first conductive line, and a second conductive line disposed on the first conductive line, and wherein at least one of the first and second conductive lines is connected to the power line through a via.

3. The semiconductor device of claim 2, wherein the first conductive line extends in the second direction.

4. The semiconductor device of claim 1, wherein the power line extends in the first direction.

5. The semiconductor device of claim 1, wherein the plurality of active regions comprise a plurality of nanowires extending in the first direction.

6. The semiconductor device of claim 1, wherein the power line is directly connected to at least one of the plurality of contacts in the layer.

7. The semiconductor device of claim 1, wherein the plurality of active regions comprises a plurality of fin structures extending in the first direction.

8. The semiconductor device of claim 2, wherein a top surface of the via is in contact with a bottom surface of at least one of the first and second conductive lines, and a bottom surface of the via is in contact with a top surface of the power line.

9. A semiconductor device comprising:
   a plurality of active regions including channel regions extending in a first direction on a semiconductor substrate, and source/drain regions connected to the channel regions in a layer;
   a plurality of gate electrodes extending in a second direction different from the first direction to intersect the channel regions;
   a plurality of contacts disposed on the active regions and the gate electrodes, and connected to at least one of the source/drain regions and the gate electrodes; and
   a power line that is disposed in the layer in which at least one of the source/drain regions is disposed, and is configured to supply a power voltage,
   wherein the power line is laterally connected to at least one of the source/drain regions in the layer.

10. The semiconductor device of claim 9, further comprising:
    a plurality of conductive lines disposed on the plurality of contacts,
    wherein the plurality of conductive lines comprises a first conductive line, and a second conductive line disposed on the first conductive line, and
    at least one of the first and second conductive lines is connected to the power line through a via.

11. The semiconductor device of claim 9, wherein the plurality of active regions include a plurality of fin structures extending in the first direction, on the semiconductor substrate.

12. The semiconductor device of claim 9, wherein the plurality of active regions include a plurality of nanowires disposed on a top surface of the semiconductor substrate and extending in the first direction.

13. The semiconductor device of claim 10, wherein a top surface of the via is in contact with a bottom surface of at least one of the first and second conductive lines, and a bottom surface of the via is in contact with a top surface of the power line.

14. An integrated circuit device, comprising:
    a first layer comprising active regions and gate electrodes intersecting therein, the active regions comprising source/drain regions therein and channel regions extending therebetween;

a second layer stacked on the first layer, the second layer comprising source/drain contacts therein on the source/drain regions and gate contacts therein on the gate electrodes; and a third layer stacked on the second layer, the third layer comprising a plurality of conductive lines, wherein the second layer further comprises at least one power line extending therein in a first direction, and wherein a side surface of the at least one power line is continuous with a side surface of the source/drain contacts and the at least one power line is configured to provide a power supply voltage thereto.

15. The integrated circuit device of claim 14, wherein the at least one power line comprises first and second power lines, wherein respective surfaces of the first and second power lines are coplanar with respective surfaces of the source/drain contacts.

16. The integrated circuit device of claim 14, wherein the at least one power line is connected to at least one of the plurality of conductive lines through a via, and a top surface of the via is contact with a bottom surface of the at least one of the plurality of conductive lines, and a bottom surface of the via is contact with a top surface of the at least one power line.

17. The integrated circuit device of claim 14, wherein the side surface of the at least one power line extends in the first direction, and the side surface of the source/drain contacts extends in a second direction intersecting with the first direction.

18. The integrated circuit device of claim 14, wherein a plurality of fin structures included in the active regions extends in the first direction.

19. The integrated circuit device of claim 14, wherein a plurality of nanowires included in the active regions extends in the first direction.

* * * * *